United States Patent
Whetsel

(10) Patent No.: US 8,572,433 B2
(45) Date of Patent: Oct. 29, 2013

(54) JTAG IC WITH COMMANDABLE CIRCUIT CONTROLLING DATA REGISTER CONTROL ROUTER

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 317 days.

(21) Appl. No.: 13/028,575

(22) Filed: Feb. 16, 2011

(65) Prior Publication Data

US 2011/0225456 A1    Sep. 15, 2011

Related U.S. Application Data

(60) Provisional application No. 61/312,384, filed on Mar. 10, 2010.

(51) Int. Cl.
 *G06F 3/00* (2006.01)
(52) U.S. Cl.
 USPC ............................................ 714/27; 714/727
(58) Field of Classification Search
 CPC .................................................. G06F 11/2733
 USPC ......................................... 714/27, 727
 See application file for complete search history.

(56) References Cited

U.S. PATENT DOCUMENTS

| | | | |
|---|---|---|---|
| 2003/0056154 A1* | 3/2003 | Edwards et al. ................. | 714/45 |
| 2003/0172333 A1* | 9/2003 | Wehage ........................ | 714/726 |
| 2005/0204225 A1* | 9/2005 | Whetsel ........................ | 714/726 |
| 2006/0017461 A1* | 1/2006 | Pail et al. ........................ | 326/41 |
| 2006/0059286 A1* | 3/2006 | Bertone et al. ................ | 710/260 |
| 2007/0234154 A1* | 10/2007 | Whetsel ........................ | 714/727 |
| 2008/0250282 A1* | 10/2008 | Whetsel ........................ | 714/724 |
| 2008/0281546 A1* | 11/2008 | Whetsel ........................ | 702/120 |
| 2008/0288839 A1* | 11/2008 | Talayssat et al. ............. | 714/727 |
| 2009/0271674 A1* | 10/2009 | Whetsel ........................ | 714/731 |
| 2009/0306925 A1* | 12/2009 | Lai et al. ........................ | 702/117 |
| 2009/0307547 A1* | 12/2009 | Esaka et al. ................... | 714/727 |
| 2010/0058130 A1* | 3/2010 | Somasundaram et al. .... | 714/733 |
| 2010/0229058 A1* | 9/2010 | Goyal et al. ................... | 714/731 |

* cited by examiner

*Primary Examiner* — Chae Ko
(74) *Attorney, Agent, or Firm* — Lawrence J. Bassuk; Wade J. Brady, III; Frederick J. Telecky, Jr.

(57) ABSTRACT

The disclosure describes a novel method and apparatus for improving the operation of a TAP architecture in a device through the use of Command signal inputs to the TAP architecture. In response to a Command signal input, the TAP architecture can perform streamlined and uninterrupted Update, Capture and Shift operation cycles to a target circuit in the device or streamlined and uninterrupted capture and shift operation cycles to a target circuit in the device. The Command signals can be input to the TAP architecture via the devices dedicated TMS or TDI inputs or via a separate CMD input to the device.

12 Claims, 50 Drawing Sheets

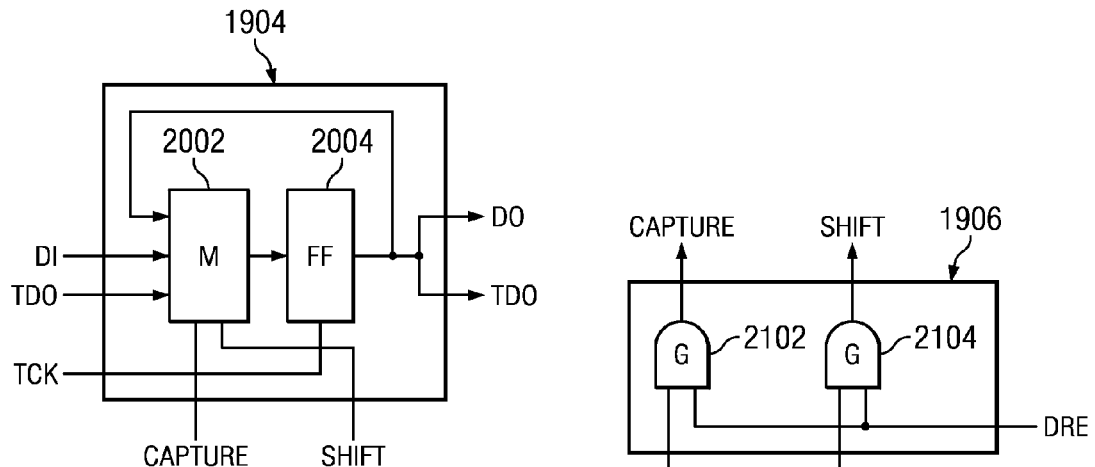
FIG. 20
FIG. 21
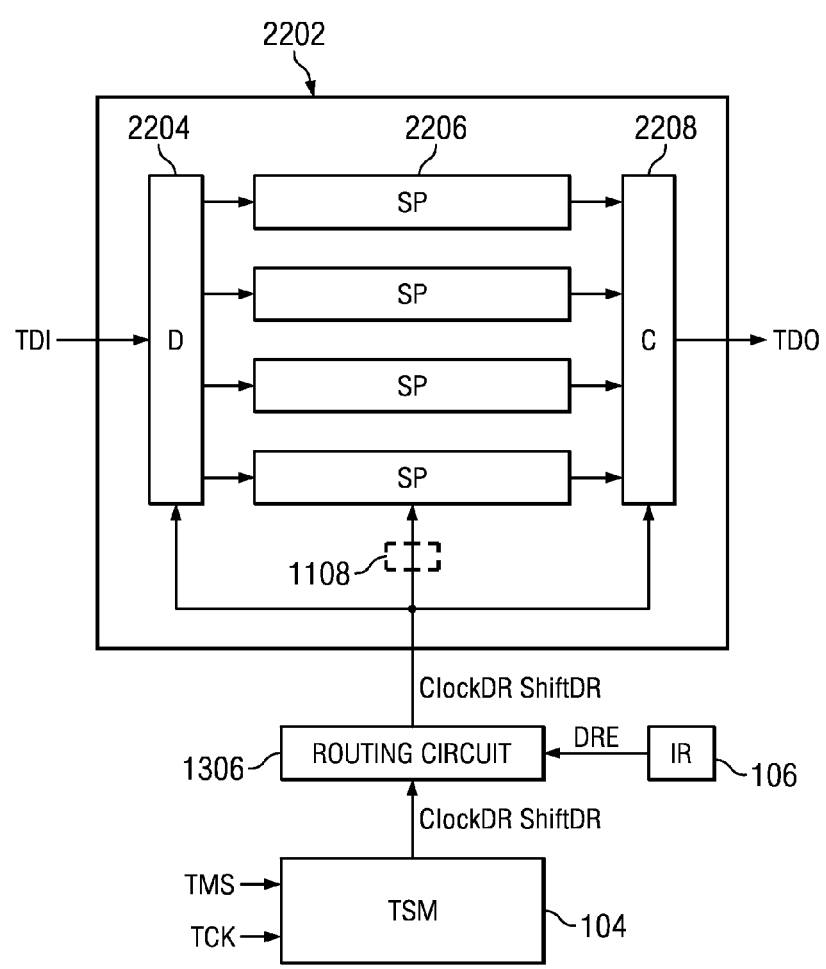
FIG. 22

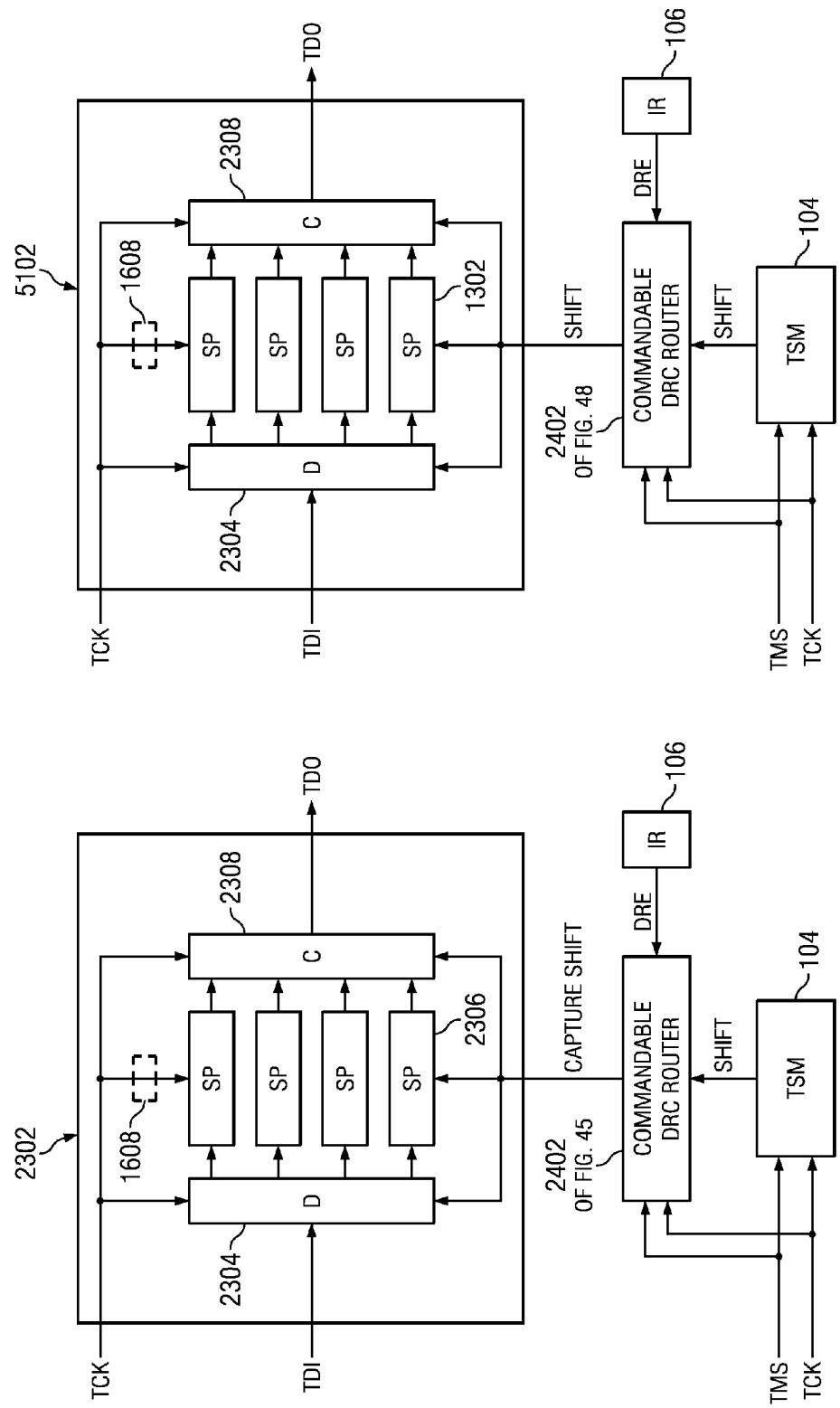

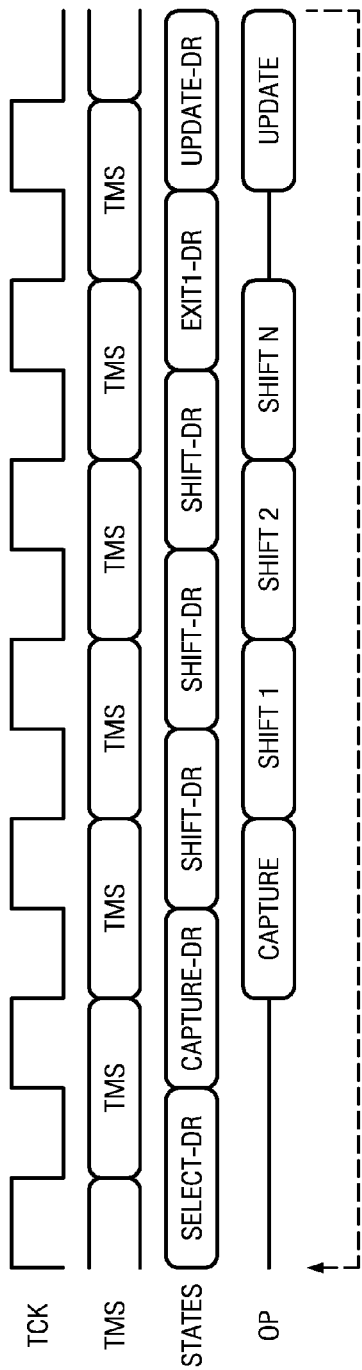
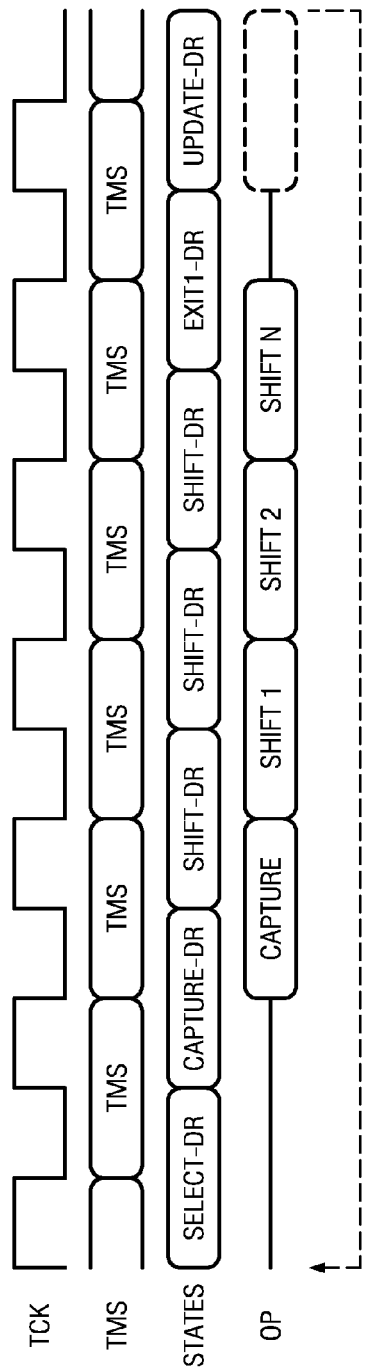
FIG. 59B
FIG. 59C

JTAG IC WITH COMMANDABLE CIRCUIT CONTROLLING DATA REGISTER CONTROL ROUTER

CROSS REFERENCE TO RELATED PATENTS

This application claims priority from Provisional Application No. 61/312,384, filed Mar. 10, 2010.

The disclosure relates to some extent to application Ser. No. 12/410,561, filed Mar. 25, 2009, which is incorporated herein by reference.

FIELD OF THE DISCLOSURE

This disclosure relates generally to the operation of JTAG test access ports (TAPs) in devices and in particular to a method of streamlining the operation of TAPs using commands.

BACKGROUND OF THE DISCLOSURE

Most devices today, which may be integrated circuit (IC) devices or embedded core devices within an IC, include an IEEE standard 1149.1 (JTAG) Test Access Port (TAP) architecture to access target circuits within the devices. The TAP includes an interface which comprises a test data input (TDI) signal, a test clock (TCK) signal, a test mode select (TMS) signal, a test data output (TDO) signal and an optional test reset signal. Devices also use other IEEE standards that are based on the IEEE 1149.1 TAP such as but not limited to IEEE 1149.4, IEEE 1149.6, IEEE 1149.7, IEEE P1149.8.1, IEEE 1532, and IEEE P1687. The TAP is used to control various activities in the device such as but not limited too, device to device boundary scan testing, device testing, device debugging, and device programming.

FIG. 1 illustrates an example implementation of a TAP within a device 102. The TAP includes a TAP state machine (TSM) 104, an instruction register 106, two or more data registers 108, a data register control (DRC) router, multiplexers 112 and 114, a falling TCK edge operated TDO register (R) 116, and TDO buffer 118. The TSM operates in response to the TCK and TMS input signals to; (1) place the TAP is a Test Logic Reset state, (2) place the TAP in a Run Test/Idle state, (3) perform a scan operation to the instruction register from TDI to TDO, or (4) to perform scan operation to a selected data register from TDI to TDO.

During instruction scan operations, the TSM outputs a bus of instruction register control (IRC) signals to the instruction register, a select (SEL) signal to multiplexer 114, and an enable (ENA) signal to TDO buffer 118. In response to an instruction scan operation, the instruction register inputs data from TDI and outputs data to TDO via multiplexer 114, R 116, and TDO buffer 118.

During data scan operations, the TSM outputs a bus of data register control (DRC) signals 120 to a selected data register via DRC router 110, the SEL signal to multiplexer 114, the ENA signal to TDO buffer 118. In response to a data scan operation, the selected data register inputs data from TDI and outputs data to TDO via multiplexer 112 and multiplexer 114, R 116, and TDO buffer 118.

In the FIG. 1 example, a data register is selected for access by data register enable (DRE) signals output from the instruction register. The DRE signals are set by the instruction loaded into the instruction register. The DRE signals are input to the DRC router to couple the DRC signal outputs 120 from the TSM to the DRC signal inputs 122,124 of the selected data register. The DRE signals also control multiplexer 112 to couple the output of the selected data register to the TDO signal via multiplexer 114, R 116 and TDO buffer 118.

FIG. 2 illustrates the state diagram of the TSM 104 which is well known in the art. The state diagram has a Test Logic Reset state 202, Run Test/Idle state 204, data register scanning states 206 (Capture-DR, Shift-DR, Exit1-DR, Pause-DR, Exit2-DR and Update-DR) and instruction register scanning states 208 (Capture-IR, Shift-IR, Exit1-IR, Pause-IR, Exit2-IR and Update-IR). State transitions occur in response to the TMS signal on the rising edge of the TCK signal. The data scanning states are entered via the Select-DR state 210 and the instruction scanning states are entered via the Select-IR state 212.

In the Capture-DR state the selected data register captures data from its parallel inputs. In the Shift-DR state the selected data register shifts data from TDI to TDO. In the Pause-DR state the selected data register pauses shifting. In the Update-DR state the selected data register updates data to its parallel outputs.

In the Capture-IR state the instruction register captures data from its parallel inputs. In the Shift-IR state the instruction register shifts data from TDI to TDO. In the Pause-IR state the instruction register pauses shifting. In the Update-IR state the instruction register updates data to its parallel outputs.

FIG. 3 illustrates two known types of DRC signal output groups 302, 304 of the TSM DRC signal bus 120. DRC output group 302, comprising ClockDR, ShiftDR and UpdateDR signals, is used to control scan access to asynchronous data registers 108. In this disclosure asynchronous data registers are registers comprising scan cells that do not have the ability to hold their present state when no capture, shift or update operations are taking place. Thus they must be timed by a gated clock input (i.e. ClockDR). The ClockDR signal is a gated TCK clock signal that is active in the Capture-DR and Shift-DR TSM states of FIG. 2. The ShiftDR signal controls the selected data register to capture data in the Capture-DR state and shift data in the Shift-DR state. The UpdateDR signal is a gated clock output that is active in the Update-DR state to update data from the parallel outputs of the selected data register.

DRC output group 304, comprising a Capture signal, a Shift signal and an Update signal, is used to control scan access to synchronous data registers 108. In this disclosure synchronous data registers are registers comprising scan cells that do have the ability to hold their present state when no capture, shift or update operations are taking place. Thus they can be timed by a free running clock (i.e. TCK). The Capture signal is set when the TSM is in the Capture-DR state of FIG. 2 to cause the data register to capture data from its parallel inputs on the rising edge of the free running TCK signal. The Shift signal is set when the TSM is in the Shift-DR state of FIG. 2 to cause the data register to shift data on the rising edge of the free running TCK signal. The Update signal is set when the TSM is in the Update-DR state of FIG. 2 to cause the data register to update data to its parallel outputs on the falling edge of the free running TCK signal.

While not shown, the IRC signals from TSM 104 may use similar groups of signals for performing capture, shift and update operations on asynchronous or synchronous types of instruction registers 106.

FIG. 4 illustrates the DRC router 110 in more detail. In this example, the DRC router 110 is used to couple the DRC bus signals 120 of TSM 104 to four types of data registers, (1) an asynchronous capture, shift and update (CSU) data register 410, (2) an asynchronous capture and shift (CS) data register 412, (3) a synchronous capture, shift and update (CSU) data register 414 and (4) a synchronous capture and shift (CS) data register 416. As will be shown in example FIGS. 9 and 10, the CSU data registers 410 and 414 include an update register that is coupled to the parallel outputs of the shift register of the data register. As will be shown in example FIGS. 13 and 14, the CS data registers 412 and 416 only include a shift register with parallel outputs.

When scan access to data register 410 is required, a first instruction is scanned into the instruction register 106 to output DRE control signals that enable routing circuit 402 to; (1) couple the ClockDR signal of bus 120 to the ClockDR signal input of data register 410, (2) couple the ShiftDR signal of bus 120 to the ShiftDR signal input of data register 410, (3) couple the UpdateDR signal of bus 120 to the UpdateDR signal input of data register 410

When scan access to data register 412 is required, a second instruction is scanned into the instruction register 106 to output DRE control signals that enable routing circuit 404 to; (1) couple the ClockDR signal of bus 120 to the ClockDR signal input of data register 412 and (2) couple the ShiftDR signal of bus 120 to the ShiftDR signal input of data register 412.

When scan access to data register 414 is required, a third instruction is scanned into the instruction register 106 to output DRE control signals that enable routing circuit 406 to; (1) couple the Capture signal of bus 120 to the Capture signal input of data register 414, (2) couple the Shift signal of bus 120 to the Shift signal input of data register 414, (3) couple the Update signal of bus 120 to the Update signal input of data register 414. Data register 414 is clocked by the free running TCK signal.

When scan access to data register 416 is required, a fourth instruction is scanned into the instruction register 106 to output DRE control signals that enable routing circuit 408 to; (1) couple the Capture signal of bus 120 to the Capture signal input of data register 416 and (2) couple the Shift signal of bus 120 to the Shift signal input of data register 416. Data register 416 is clocked by the free running TCK signal.

Routing circuits 402-408 that are not enabled by the current instruction in the instruction register will decouple their outputs from the DRC bus signals 120 and set their outputs to static desired states.

FIG. 5 illustrates a simplified view of a TAP within a device 502 that has a data register 108 that has been enabled for scan access by the DRE signals from instruction register (IR) 106. The simplified view of FIG. 5 and other Figures to follow does not show multiplexers 112 and 114, R 116, or TDO buffer 118 between the data register output and TDO, but they are assumed to exist. The data register 108 can be any type of data register or similar type circuit including but not limited too, an asynchronous CSU data register 410, an asynchronous CS data register, a synchronous CSU data register 414, a synchronous CS data register 416 or a test compression architecture having a compressed data input coupled to TDI and a compressed data output coupled to TDO.

FIG. 6 illustrates the scan access timing of accessing a CSU type data register 108. As seen, the scan access timing is controlled by the TSM 104 repeatedly transitioning through the Select-DR, Capture-DR, Shift-DR, Exit1-DR and Update-DR states of FIG. 2. The data register performs a data Capture operation (OP) on the rising edge of the TCK when the TSM is in the Capture-DR state. The data register performs a data Shift operation (OP) on the rising edge of the TCK when the TSM is in the Shift-DR state. The data register performs a data Update operation (OP) on the falling edge of the TCK when the TSM is in the Update-DR state.

FIG. 7 illustrates the scan access timing of accessing a CS type data register 108. As seen, the scan access timing is controlled by the TSM 104 repeatedly transitioning through the Select-DR, Capture-DR, Shift-DR, Exit1-DR and Update-DR states of FIG. 2. The data register performs a data Capture operation on the rising edge of the TCK when the TSM is in the Capture-DR state. The data register performs a data Shift operation on the rising edge of the TCK when the TSM is in the Shift-DR state. The data register does not perform a data Update operation on the falling edge of the TCK when the TSM is in the Update-DR state since it has no update register.

FIG. 8A is provided to illustrate that the data register 108 of FIG. 5 could be a test data register 802 coupled to circuitry to be tested, such as but not limited too combination logic and memories.

FIG. 8B is provided to illustrate that the data register 108 of FIG. 5 could be a debug data register 804 coupled to circuitry to be debugged, such as but not limited too microcontrollers and DSPs.

FIG. 8C is provided to illustrate that the data register 108 of FIG. 5 could be a programming data register 806 coupled to circuitry to be programmed, such as but not limited too FPGAs, CPLDs and memories (Flash/PROM) as described in IEEE standard 1532.

FIG. 8D is provided to illustrate that the data register 108 of FIG. 5 could be a Instrumentation data register 808 coupled to instrumentation circuitry embedded within a device, such as but not limited too instrumentation circuitry described in IEEE standard P1687.

FIG. 8E is provided to illustrate that the data register 108 of FIG. 5 could be an IC boundary register 810 coupled to the IC interconnects for the purpose of testing the IC interconnects as described in IEEE standards, 1149.1, 1149.4, 1149.6, and P1149.8.1 and shown in FIG. 8I.

FIG. 8F is provided to illustrate that the data register 108 of FIG. 5 could be an IC boundary register 812 of an IC coupled to the IC system logic for the purpose of testing the system logic as described in IEEE standard 1149.1 and shown in FIG. 8J.

FIG. 8G is provided to illustrate that the data register 108 of FIG. 5 could be a core wrapper boundary register 814 coupled to the core interconnects for the purpose of testing the core interconnects as described in IEEE standard 1500 and shown in FIG. 8I.

FIG. 8H is provided to illustrate that the data register 108 of FIG. 5 could be a core wrapper boundary register 816 coupled to the core system logic for the purpose of testing the system logic as described in IEEE standard 1500 and shown in FIG. 8J.

FIG. 8I illustrates how the IC boundary register 810 could be used to test the interconnects between two ICs according to IEEE 1149.1 and how the core wrapper boundary register 814 could be used to test the interconnects between two cores in an IC according to IEEE 1500.

FIG. 8J illustrates how the IC boundary registers 814 could be used to test the system logic of an IC according to IEEE 1149.1 and how the core wrapper boundary register 816 could be used to test the system logic of a core in an IC according to IEEE 1500.

FIG. 9 illustrates an example asynchronous CSU data register 902 coupled to TSM 104 via a routing circuit 906 located within DRC router 110 of FIG. 4. Data register 902 could be, but is not limited to being, the IEEE 1149.1 IC boundary register of FIGS. 8E and 8F or the IEEE 1500 core wrapper boundary register of FIG. 8G or 8H. When the routing circuit 906 is enabled by DRE inputs from the instruction register 106, the ClockDR, ShiftDR and UpdateDR signals from the TSM pass through the routing circuit to operate CSU scan cells 904 within data register 902.

FIG. 10 illustrates the CSU scan cell 904 which comprises a multiplexer 1002, a shift register FF 1004, an update register FF 1006 and optionally a multiplexer 1008. When the TSM is in the Capture-DR state of FIG. 2, multiplexer 1002 will be set by the ShiftDR signal to couple the scan cell's data input (DI) to FF 1004 to allow the DI to be captured into FF 1004 in response to a clock input on ClockDR. When the TSM is in the Shift-DR state of FIG. 2, multiplexer 1002 will be set by the ShiftDR signal to couple the TDI signal to FF 1004 to allow TDI data to be shifted into FF 1004 and TDO data to be shifted out of FF 1004 in response to clock inputs on ClockDR. When the TSM is in the Update-DR state of FIG. 2, FF 1006 will update (load) with the data output from FF 1004 in response to a clock input on UpdateDR and outputs the data on the scan cell's data output (DO). If the scan cell 904 does not include multiplexer 1008 the DO from update FF 1006 will pass directly to DO 1010. If the scan cell 904 includes multiplexer 1008 the DO from update FF 1006 will pass to DO 1012 via multiplexer 1008. When scan cell 904 includes the multiplexer 1008 it operates as an IEEE 1149.1 boundary scan cell which allows DO 1012 to be selectively driven by DI or by the output of update FF 1006 in response to a Mode signal input from the DRE bus. Including multiplexer 1008 supports boundary scan testing on the interconnects between devices as shown in FIG. 8I FIG. 11 illustrates routing circuit 906 which comprises a gating circuit 1102, a gating circuitry 1104, a gating circuitry 1106 and optionally a clock multiplexer 1108 as shown in FIG. 12. When routing circuit 906 is enable by DRE signal inputs, the ClockDR signal from TSM 104 is routed to the ClockDR input of data register 902, the ShiftDR signal from TSM 104 is routed to the ShiftDR input of data register 902, and the UpdateDR signal from TSM 104 is routed to the UpdateDR input of data register 902. When the routing circuit 906 is disabled by DRE signal inputs, the gating circuits 1102-1106 isolate the TSM ClockDR, ShiftDR and UpdateDR outputs from the data register ClockDR, ShiftDR and UpdateDR inputs and sets the ClockDR, ShiftDR and UpdateDR inputs to the data register to static desired states. If clock multiplexer 1108 is included in the routing circuit 906, it will be controlled by a DRE input to select the ClockDR input to the data register 902 to be driven by either the ClockDR output of gating circuit 1102 during test mode or by a functional clock (FC) signal during non-test mode, i.e. during functional device operation mode.

The Gating circuits of FIG. 11 and following Figures of this disclosure can be any type of gating circuitry required to control the data register inputs to the appropriate signal levels during test and during functional operation modes.

FIG. 13 illustrates an example asynchronous CS data register 1302 coupled to TSM 104 via a routing circuit 1306 located within DRC router 110 of FIG. 4. When the routing circuit 1306 is enabled by DRE inputs from the instruction register 106, the ClockDR and ShiftDR signals from the TSM pass through the routing circuit to operate CS scan cells 1304 within data register 1302. Data register 1302 could be, but is not limited to being, the test data register of FIG. 8A for testing circuitry coupled to the DI input and DO output of the scan cells 1304. The FF 1404 of the scan cells 1304 is typically shared between functional and test operations.

FIG. 14 illustrates the CS scan cell 1304 which comprises a multiplexer 1402 and shift register FF 1404. When the TSM is in the Capture-DR state of FIG. 2, multiplexer 1402 will be set by the ShiftDR signal to couple the scan cell's data input (DI) to FF 1404 to allow the DI to be captured into FF 1404 in response to a clock input on ClockDR. When the TSM is in the Shift-DR state of FIG. 2, multiplexer 1402 will be set by the ShiftDR signal to couple the TDI signal to FF 1404 to allow TDI data to be shifted into FF 1404 and TDO data to be shifted out of FF 1404 in response to clock inputs on ClockDR. As seen the data output from FF 1404 is output on the scan cell's DO and TDO output.

FIG. 15 illustrates routing circuit 1306 which comprises a gating circuit 1502, a gating circuitry 1504 and optionally the previously describe clock multiplexer 1108 of FIG. 12. When routing circuit 1306 is enable by DRE signal inputs, the ClockDR signal from TSM 104 is routed to the ClockDR input of data register 1302 and the ShiftDR signal from TSM 104 is routed to the ShiftDR input of data register 1302. When the routing circuit 906 is disable by DRE signal inputs, the gating circuits 1502-1504 isolate the TSM ClockDR and ShiftDR outputs from the data register ClockDR and ShiftDR inputs and sets the ClockDR and ShiftDR inputs to the data register to static desired states. If clock multiplexer 1108 is included in the routing circuit 1306, it will be controlled by a DRE input to select the ClockDR input to the data register 902 to be driven by either the ClockDR output of gating circuit 1502 during test mode or by a FC during non-test mode.

FIG. 16 illustrates an example synchronous CSU data register 1602 coupled to TSM 104 via a routing circuit 1606 located within DRC router 110 of FIG. 4. Data register 1602 could be, but is not limited to being, the IEEE 1149.1 IC boundary register of FIGS. 8E and 8F or the IEEE 1500 core wrapper boundary register of FIGS. 8G and 8H. When the routing circuit 1606 is enable by DRE inputs from the instruction register 106, the Capture, Shift and Update signals from the TSM pass through the routing circuit to operate CSU scan cells 1604 within data register 1602.

FIG. 17 illustrates the CSU scan cell 1604 which comprises a multiplexer 1702, a shift register FF 1704, a multiplexer 1706, an update register FF 1708 and optionally a multiplexer 1710. When the TSM is in the Capture-DR state of FIG. 2, multiplexer 1702 will be set by the Capture and Shift signals to couple the scan cell's data input (DI) to FF 1704 to allow the DI to be captured into FF 1704 in response to the free running TCK signal. When the TSM is in the Shift-DR state of FIG. 2, multiplexer 1702 will be set by the Capture and Shift signals to couple the TDI signal to FF 1704 to allow TDI data to be shifted into FF 1704 and TDO data to be shifted out of FF 1704 in response to the free running TCK signal. When the TSM is not in either the Capture-DR or Shift-DR state, multiplexer 1702 couples the output of FF 1704 to the input of FF 1704 causing FF 1704 to hold its present state in response to TCK inputs. When the TSM is in the Update-DR state of FIG. 2, FF 1708 will update (load) with the data output from FF 1704 in response to the free running TCK input and output the data on the scan cell's data output (DO). If the scan cell 1604 does not include multiplexer 1710 the DO from update FF 1708 will pass directly to DO 1714. If the scan cell 1604 includes multiplexer 1710 the DO from update FF 1708 will pass to DO 1712 via multiplexer 1710. When scan cell 1604 includes the multiplexer 1710 it operates as an IEEE 1149.1 or IEEE 1500 boundary scan cell which allows DO 1712 to be selectively driven by DI or by the output of update FF 1708 in response to a Mode signal input from the DRE bus. Including multiplexer 1710 supports boundary scan testing on the interconnects between devices as shown in FIG. 8I FIG. 18 illustrates routing circuit 1606 which comprises a gating circuit 1802, a gating circuitry 1804 and a gating circuitry 1806. When routing circuit 1606 is enable by DRE signal inputs, the Capture signal from TSM 104 is routed to the Capture input of data register 1602, the Shift signal from TSM 104 is routed to the Shift input of data register 1602, and the Update signal from TSM 104 is routed to the Update input of data register 1602. When the routing circuit 1602 is disable by DRE signal inputs, the gating circuits 1802-1806 isolate the TSM Capture, Shift and Update outputs from the data register Capture, Shift and Update inputs and sets the Capture, Shift and Update inputs to the data register to static desired states.

As seen in FIG. 16, a clock multiplexer 1608 as shown in FIG. 16A can be included in the TCK path to the scan cells of data register 1602. If included, the clock multiplexer can be controlled by a DRE input to select the TCK input to the scan cells to be driven by either the TCK signal during test mode or by a FC during non-test mode.

FIG. 19 illustrates an example synchronous CS data register 1902 coupled to TSM 104 via a routing circuit 1906 located within DRC router 110 of FIG. 4. When the routing circuit 1906 is enable by DRE inputs from the instruction register 106, the Capture and Shift signals from the TSM pass through the routing circuit to operate CS scan cells 1904 within data register 1902. Data register 1902 could be, but is not limited to being, the test data register of FIG. 8A for testing circuitry coupled to the DI input and DO output of the scan cells 1904.

FIG. 20 illustrates the CS scan cell 1904 which comprises a multiplexer 2002 and shift register FF 2004. When the TSM is in the Capture-DR state of FIG. 2, multiplexer 2002 will be set by the Capture and Shift signals to couple the scan cell's data input (DI) to FF 2004 to allow the DI to be captured into FF 2004 in response to the free running TCK signal. When the TSM is in the Shift-DR state of FIG. 2, multiplexer 2002 will be set by the Capture and Shift signals to couple the TDI signal to FF 2004 to allow TDI data to be shifted into FF 2004 and TDO data to be shifted out of FF 2004 in response to the free running TCK signal. When the TSM is not in either the Capture-DR or Shift-DR state, multiplexer 2002 couples the output of FF 2004 to the input of FF 2004 causing FF 2004 to hold its present state in response to TCK inputs. As seen the data output from FF 2004 is output on the scan cell's DO and TDO output.

FIG. 21 illustrates routing circuit 1906 which comprises a gating circuit 2102 and gating circuitry 2104. When routing circuit 1906 is enable by DRE signal inputs, the Capture signal from TSM 104 is routed to the Capture input of data register 1902 and the Shift signal from TSM 104 is routed to the Shift input of data register 1902. When the routing circuit 1902 is disable by DRE signal inputs, the gating circuits 2102-2104 isolate the TSM Capture and Shift outputs from the data register Capture and Shift inputs and sets the Capture and Shift inputs to the data register to static desired states.

As seen in FIG. 19, clock multiplexer 1608 shown and described in regard to FIGS. 16 and 16A can be included in the TCK path to the scan cells of data register 1902 to allow the scan cells to be driven by either the TCK signal during test mode or by a FC during non-test mode.

FIG. 22 illustrates an example test compression architecture (TCA) 2202 within a device coupled to a TSM 104 via routing circuit 1306. TCA architectures are well known, such as but not limited to Mentor's TestKompress™ architecture. The example TCA comprises a decompressor circuit 2204, parallel scan paths 2206, and a compactor circuit 2208. Each scan path comprises scan cells as described in FIGS. 13 and 14. The TCA of FIG. 22, while significantly more complex in construction, can be operated in basically the same way as the asynchronous data register 1302 of FIG. 13 by coupling the TSM 104 to the TCA via routing circuit 1306. The decompressor circuit operates to input compressed test data from TDI and decompress the test data into individual stimulus data inputs to the scan paths. The compactor circuit operates to input individual outputs from the scan paths and compact them down to a compressed test data output signal on TDO.

When routing circuit 1306 is enabled by DRE inputs from the instruction register 106, the ClockDR and ShiftDR signals from the TSM pass through the routing circuit to operate the decompressor, scan paths and compactor circuits to perform capture and shift operations as described in regard to the data register 1302 of FIGS. 13, 14 and 15. When the TSM is in the Capture-DR state of FIG. 2, the ClockDR and ShiftDR signals are operated to perform a capture operation which loads response data from combinational logic associated with the scan paths and initializes the decompressor circuit 2204 to receive a stream of compressed test data from TDI. When the TSM is in the Shift-DR state of FIG. 2, the ClockDR and ShiftDR signals are operated to perform a shift operation which shifts stimulus data from the decompressor circuit into the scan paths and shifts response data from the scan paths into the compactor circuit. The response data input to the compactor circuit during the shift operation is compacted down to a single stream of compressed test data output on the TDO signal.

As seen in FIG. 22, clock multiplexer 1108 shown and described in regard to FIGS. 11 and 12 can be included in the ClockDR path to the scan cells of the scan paths 2206 to allow the scan cells to be driven by either the ClockDR signal during test mode or by a FC during non-test mode.

FIG. 23 illustrates another example test compression architecture (TCA) 2202 within a device coupled to a TSM 104 via routing circuit 1906. The example TCA comprises a decompressor circuit 2304, parallel scan paths 2306, and a compactor circuit 2308. Each scan path comprises scan cells as described in FIGS. 19 and 20. The TCA of FIG. 23, while significantly more complex in construction, can be operated in basically the same way as the synchronous data register 1902 of FIG. 19 by coupling the TSM 104 to the TCA via routing circuit 1306. The decompressor circuit operates to input compressed test data from TDI and decompress the test data into individual stimulus data inputs to the scan paths. The compactor circuit operates to input individual outputs from the scan paths and compact them down to a compressed test data output signal on TDO.

When routing circuit 1906 is enabled by DRE inputs from the instruction register 106, the Capture and Shift signals from the TSM pass through the routing circuit to operate the decompressor, scan paths and compactor circuits to perform capture and shift operations as described in regard to the data register 1902 of FIGS. 19, 20 and 21. When the TSM is in the Capture-DR state of FIG. 2, the Capture, Shift and TCK signals operate to perform a capture operation which loads response data from combinational logic associated with the scan paths and initializes the decompressor circuit 2304 to receive a stream of compressed test data from TDI. When the TSM is in the Shift-DR state of FIG. 2, the Capture, Shift and TCK signals operate to perform a shift operation which shifts stimulus data from the decompressor circuit into the scan paths and shifts response data from the scan paths into the compactor circuit. The response data input to the compactor circuit during the shift operation is compacted down to a single stream of compressed test data output on the TDO signal.

As seen in FIG. 23, clock multiplexer 1608 shown and described in regard to FIGS. 16 and 19 can be included in the TCK path to the scan cells of the scan paths 2306 to allow the scan cells to be driven by either the TCK signal during test mode or by a FC signal during non-test mode.

BRIEF SUMMARY OF THE DISCLOSURE

This disclosure describes a method and apparatus for allowing a TAP within a device to control data registers or other elements, such as but not limited to test compression architectures (TCA), to perform uninterrupted capture and shift operations or capture, shift and update operations in response to a command signal.

BRIEF DESCRIPTION OF THE VIEWS OF THE DRAWINGS

FIG. 20 illustrates the scan cells of the data register of FIG. 19.

FIG. 21 illustrates the routing circuit of FIG. 19.

FIG. 22 illustrates an example TSM, routing circuit and test compression architecture arrangement.

FIG. 50 illustrates an alternate TSM, commandable DRC router and test compression architecture arrangement according to the disclosure.

FIG. 51 illustrates an alternate TSM, commandable DRC router and data register arrangement according to the disclosure.

FIG. 59B illustrates the devices of FIG. 59A performing a conventional update, capture and shift operation.

FIG. 59C illustrates the devices of FIG. 59A performing a conventional capture and shift operation.

FIG. 77 illustrates a controller connected to device that includes a commandable Tap and a separate command signal input according to the disclosure.

FIG. 78 illustrates a controller connected to a daisy chain of devices that include commandable Taps and separate command signal inputs according to the disclosure.

FIG. 79 illustrates a controller connected to a daisy chain of devices that include conventional Taps and devices that include commandable Taps with separate command signal inputs according to the disclosure.

DETAILED DESCRIPTION OF THE DISCLOSURE

Figure 4:
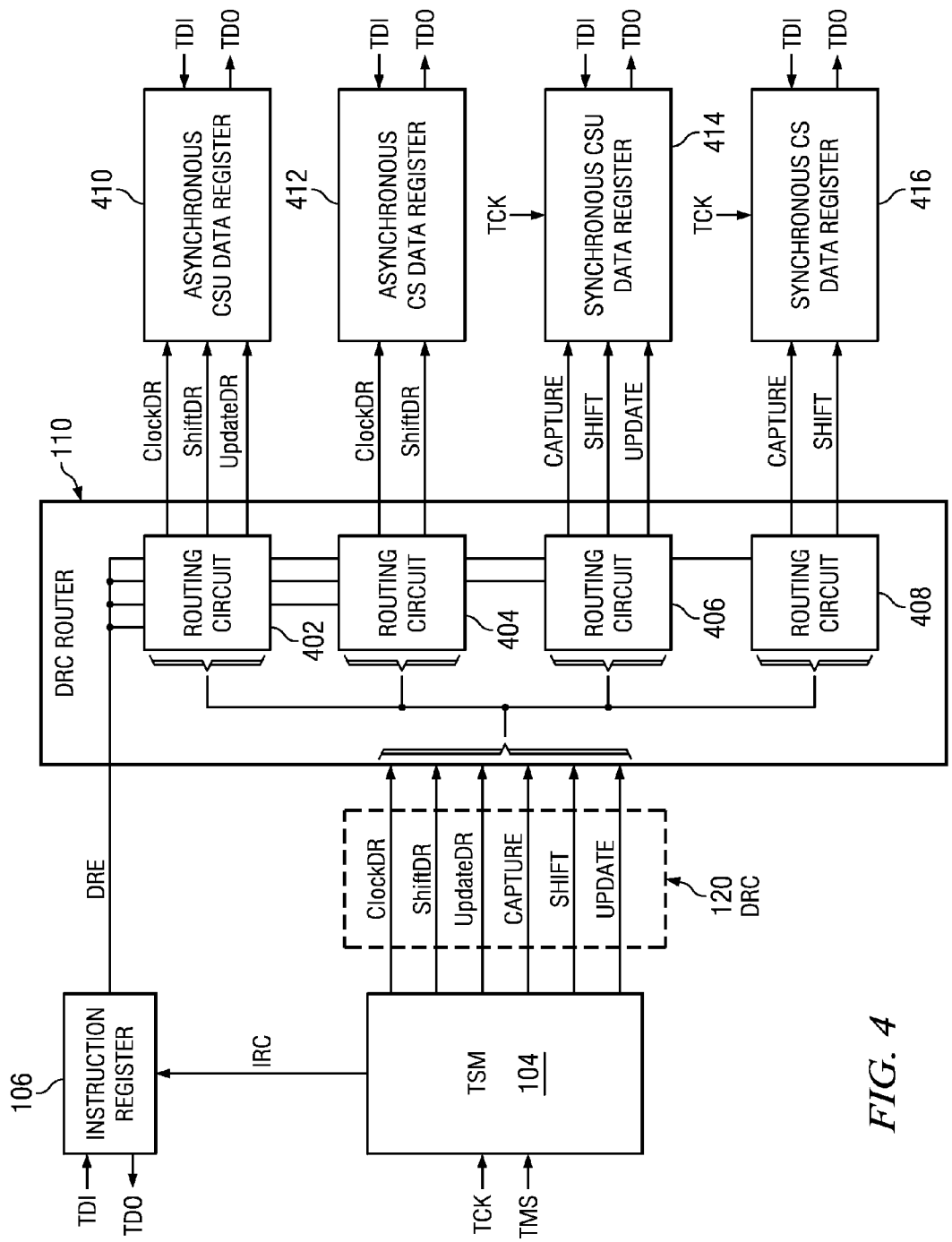
FIG. 4 illustrates a conventional arrangement between a TSM, DRC router, and data registers of a device.
Figure 23:
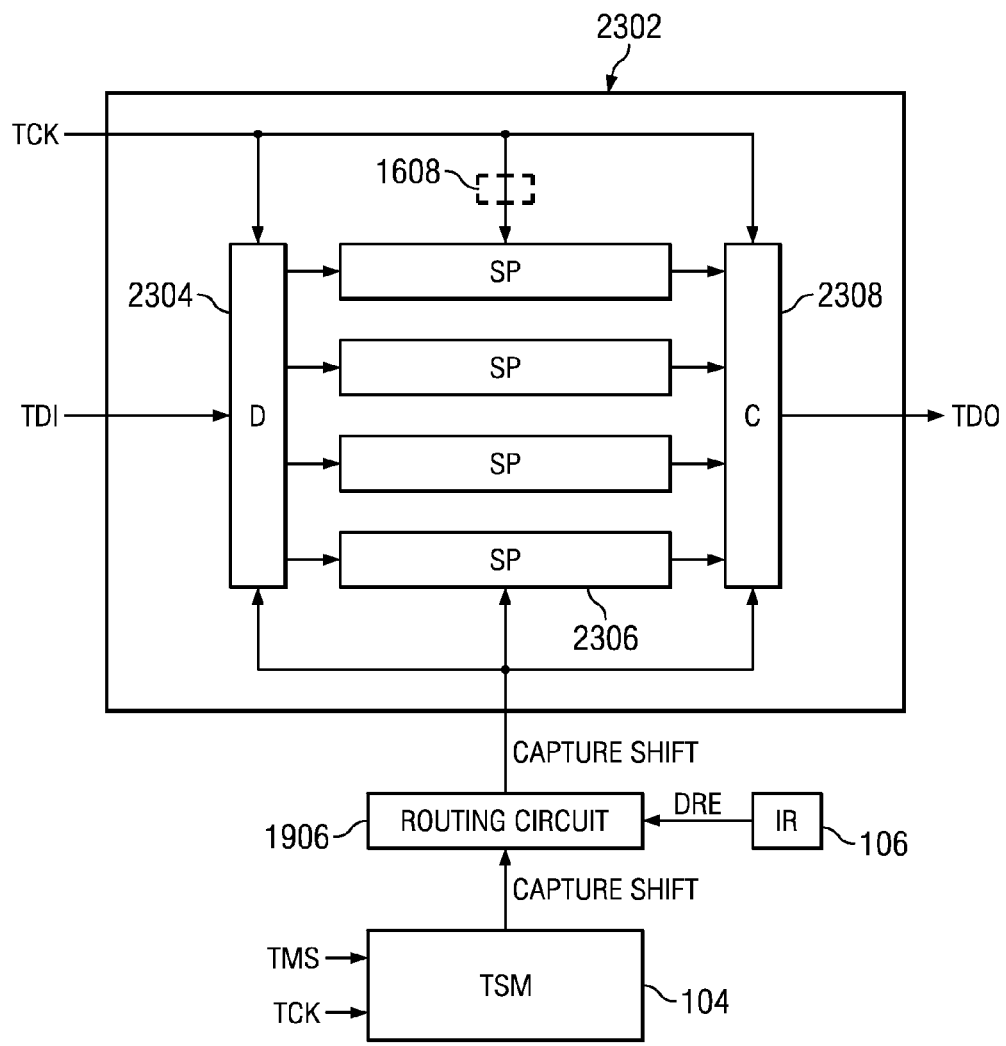
FIG. 23 illustrates an example TSM, routing circuit and test compression architecture arrangement.
Figure 24:
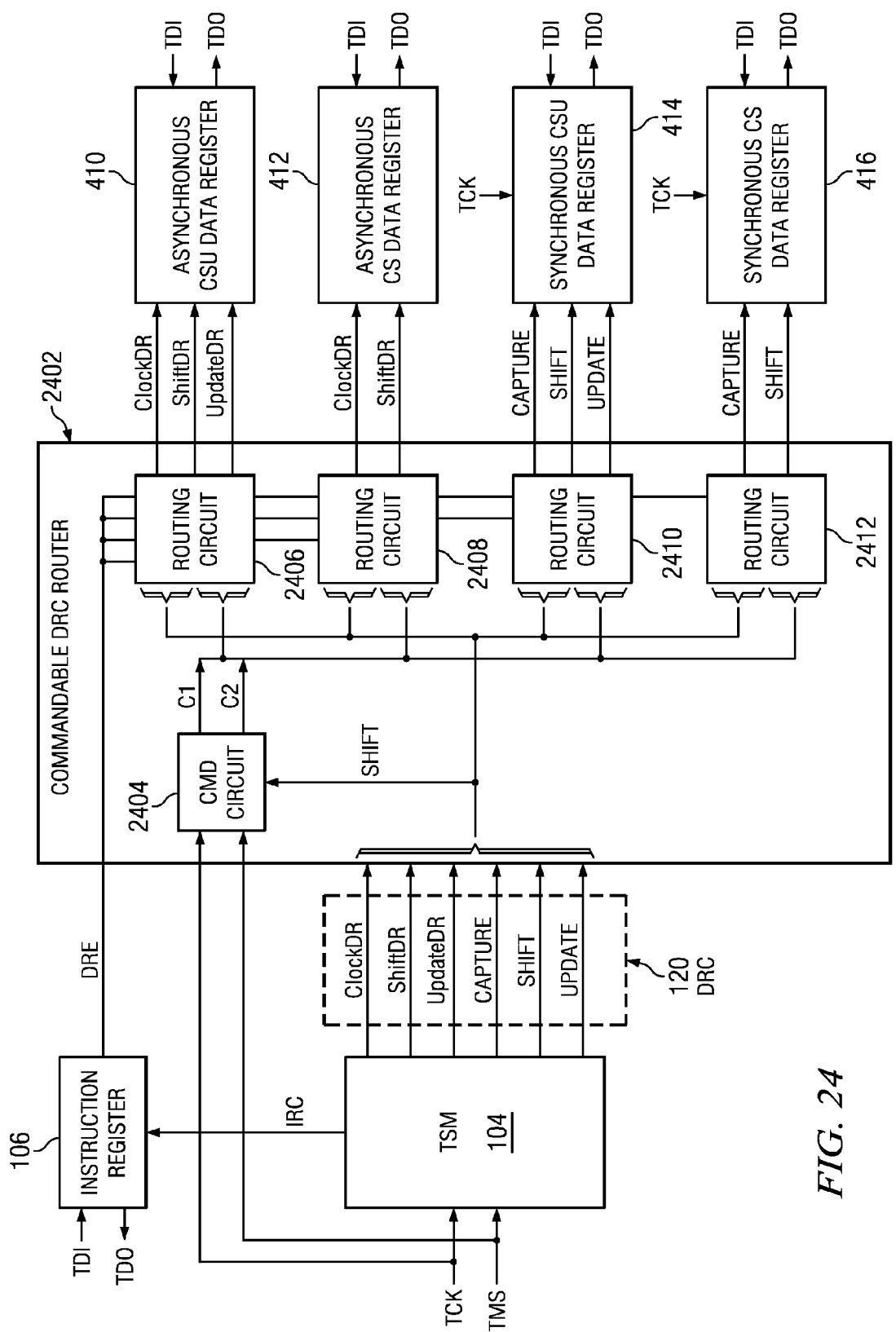
FIG. 24 illustrates an arrangement between a TSM, commandable DRC router, and data registers of a device according to the disclosure.

FIG. 24 illustrates an example commandable DRC router 2402 according to the disclosure which comprises routing circuits 2406-2412 and a command (CMD) circuit 2404. The CMD circuit has inputs coupled to the TCK signal, TMS signal and the Shift signal of bus 120. The CMD circuit has control output signals C1 and C2 coupled to first inputs of routing circuits 2406-2412. While this example CMD circuit 2404 uses two control output signals C1 and C2, a CMD circuit 2404 may use any number of control output signals. Second inputs of routing circuits 2406-2412 are coupled to the DRC bus signals of TSM 104. The routing circuits 2406-2412 can be used to couple the TSM DRC bus signals 120 to the four types of data registers 410-416 for conventional TSM control as described in regard to FIG. 4 and other preceding Figures, or the routing circuits 2406-2412 can be used to couple the control signals (C1 and C2) of CMD circuit 2404 to the data register 410-416 for the new control method to be described in this disclosure. While not shown, the TCAs of FIGS. 22 and 23 can be similarly coupled to the TSM DRC bus signals 120 for conventional control or to the control signals (C1 and C2) of the CMD circuit 2404 for the new control method of the disclosure.

Figure 6:
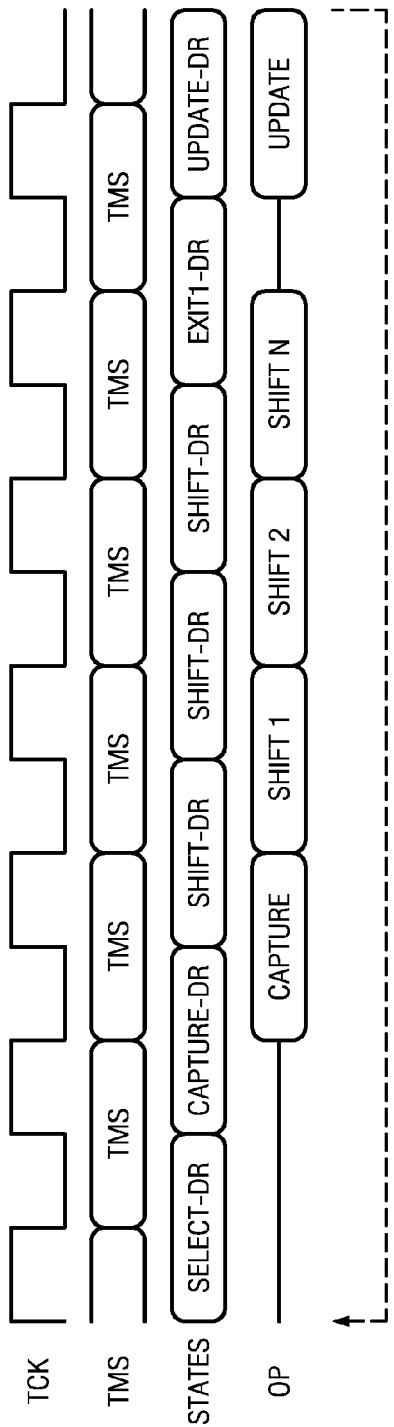
FIG. 6 illustrates a conventional TSM controlled update, capture and shift operation.
Figure 7:
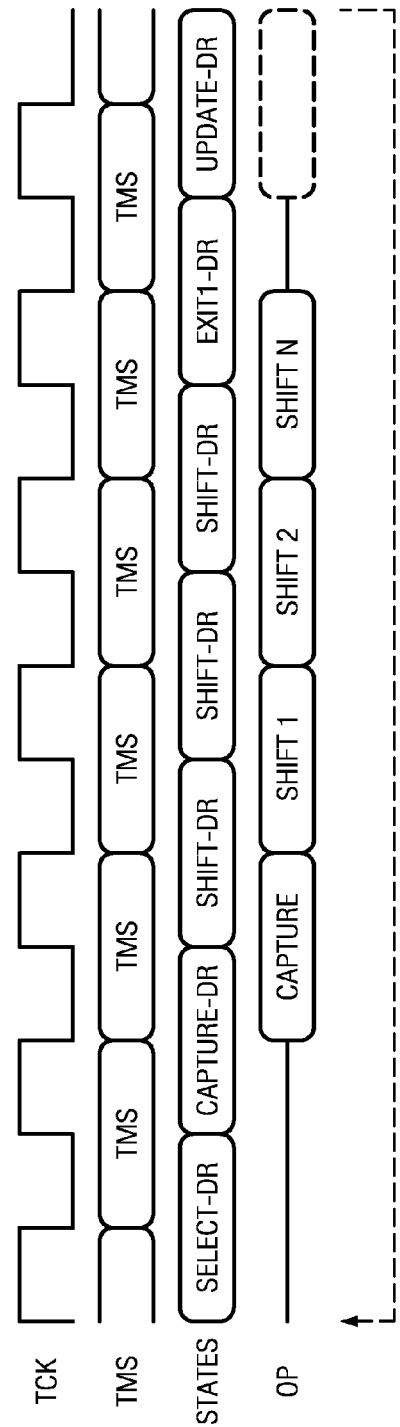
FIG. 7 illustrates a conventional TSM controlled capture and shift operation.
Figure 8A:
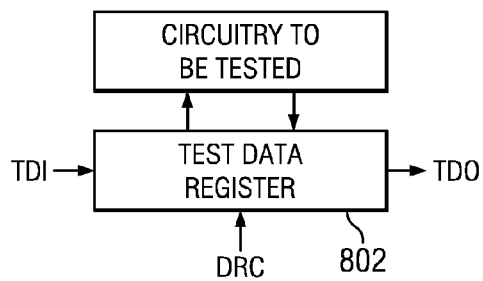
FIG. 8A illustrates a data register being a test data register.
Figure 8B:
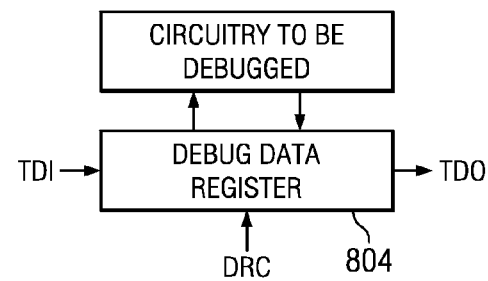
FIG. 8B illustrate a data register being debug data register.
Figure 8C:
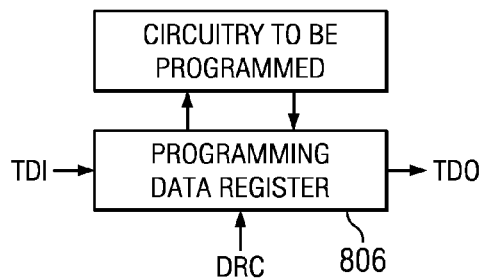
FIG. 8C illustrates a data register being a programming data register.
Figure 8D:
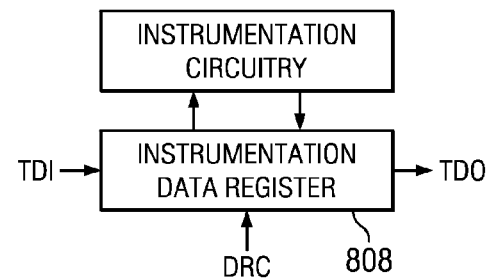
FIG. 8D illustrates a data register being an instrumentation data register.
Figure 8E:
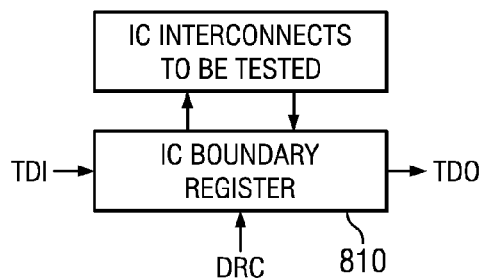
FIG. 8E illustrates a data register being an IC boundary register for testing IC interconnects.
Figure 8F:
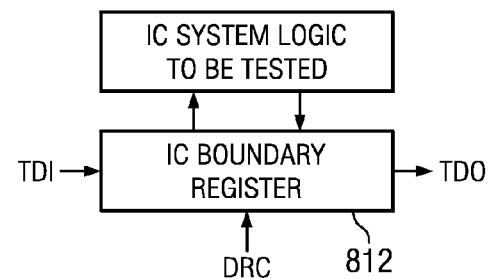
FIG. 8F illustrates a data register being an IC boundary register for testing IC system logic.
Figure 8G:
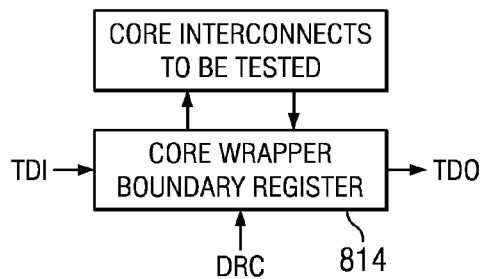
FIG. 8G illustrates a data register being a core wrapper boundary register for testing core interconnects.
Figure 8H:
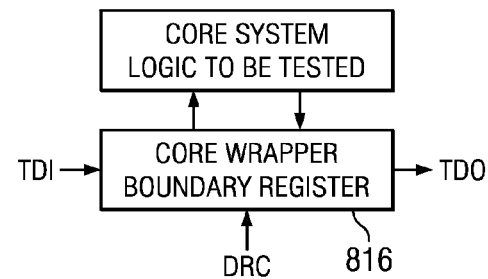
FIG. 8H illustrates a data register being a core wrapper boundary register for testing core system logic.
Figure 8I:
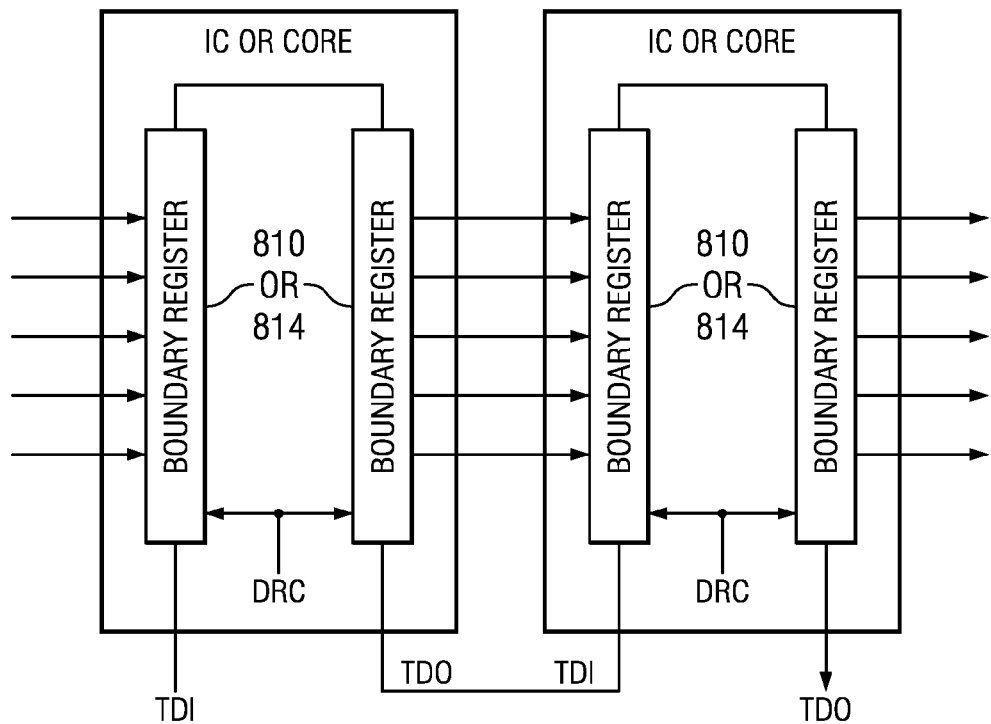
FIG. 8I illustrates boundary registers testing interconnects between cores or ICs.
Figure 8J:
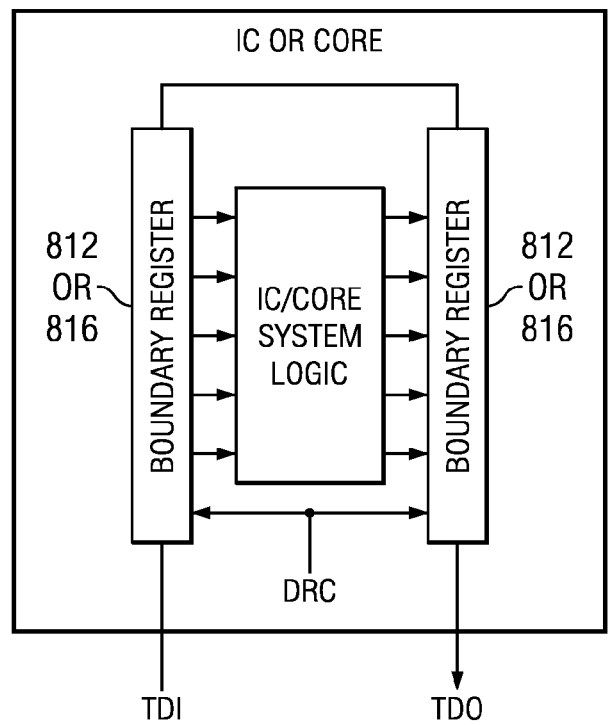
FIG. 8J illustrates boundary registers testing system logic in a core or IC.

When conventional scan access to one of the data registers 410-416 is required, an instruction is scanned into the instruction register 106 to output DRE control signals that enable the associated commandable routing circuit 2402-2412 to couple the appropriate TSM DRC bus signals to the target data register. Once the TSM is coupled to the target data register via the commandable DRC router, the TSM is operated to transition through the states FIG. 2 to perform scan access cycles as shown in FIGS. 6 and 7.

When scan access to one of the data registers 410-416 is required using the new control method of the disclosure, an instruction is scanned into the instruction register 106 to output DRE control signals that enable an associated commandable routing circuit 2402-2412 to couple the appropriate C1 and C2 signals of CMD circuit 2404 to the target data register. Once the C1 and C2 signal of the CMD circuit are coupled to the target data register via the commandable DRC router, the TSM is transitioned to the Shift-DR state of FIG. 2 which asserts the Shift signal to enable the CMD circuit to respond to a command input on the TMS signal in response to the TCK signal to output C1 and C2 control signals to the target data register to perform scan operations.

Commandable routing circuits 2406-2412 that are not enabled by the current instruction in the instruction register will decouple their outputs from the TSM DRC bus signals 120 and CMD circuit C1 and C2 signals and set their outputs to static desired states.

Figure 25A:
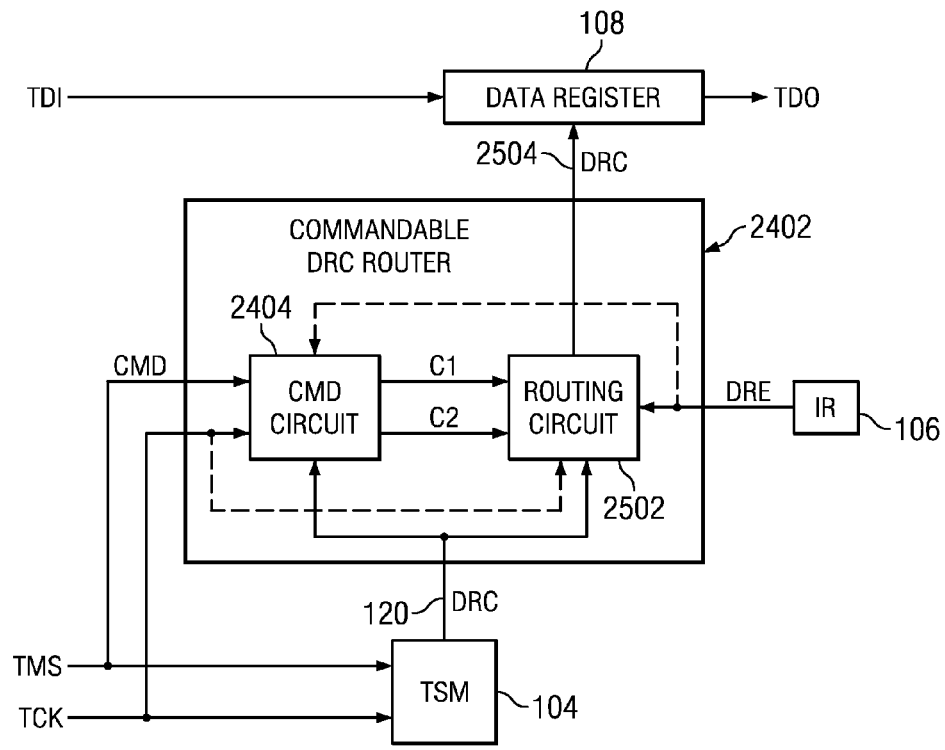
FIG. 25A illustrates a simplified view of the TSM, commandable DRC router and data register according to the disclosure.

FIG. 25A illustrates a commandable DRC router 2402 comprising CMD circuit 2404 and a routing circuit 2502. The commandable DRC router 2402 is located between a TSM 104 and a data register 108. The data register 108 may be a CSU data register or a CS data register. The commandable DRC router 2402 has a DRC input bus 120 from TSM 104 that is input to CMD circuit 2404 and routing circuit 2502 and a DRC output bus 2504 that is output from the routing circuit 2502 to the data register 108. The CMD circuit 2404 may optionally be coupled to the DRE signal bus, as shown in dotted line, to allow it to be programmable via the DRE input as shown in FIG. 27B. The routing circuit 2502 may optionally be connected to the TCK signal, as shown in dotted line, to allow TCK to time some of the DRC bus signals 2504.

When scan access to the data register is desired using conventional DRC control from the TSM, an instruction is loaded into the instruction register 106 to output DRE control to the routing circuit 2502 to cause appropriate bus signals from DRC input bus 120 to be coupled to DRC output bus signals 2504. After the DRC input bus 120 is coupled to the DRC output 2504 the TSM 104 can be operated through its states as shown in the timing diagrams of FIGS. 6 and 7 to perform scan access to the data register. During conventional scan access the routing circuit 2502 operates as a routing circuit in the DRC router 110 of FIG. 4.

When scan access to the data register 108 is desired using the new control method of the disclosure, an instruction is be loaded into the instruction register 106 to output DRE control to the routing circuit 2502 to select the C1 and C2 signals from CMD circuit 2402 to control the DRC output bus signals 2504. After the C1 and C2 signals are selected to control the DRC output bus 2504 of the routing circuit 2502, the TSM is transitioned to the Shift-DR state of FIG. 2. In the Shift-DR state the data register 108 is enabled for shifting data from TDI to TDO and the Shift signal of bus 120 is asserted to enable the operation of the CMD circuit 2404. At appropriate times during the shifting of data, a CMD signal is input to the CMD circuit 2404 from the TMS signal on the falling edge of TCK. In response to the CMD signal the CMD circuit outputs C1 or C1 and C2 control signals to routing circuit 2502 to cause the routing circuit to output control on DRC output bus 2504 to perform a capture or an update and capture operation on the data register 108. The capture or update and capture operation on the data register is performed in response to receiving the CMD signal from TMS and while the TSM 104 remains in the Shift-DR state. If the data register 108 is a CS data register only the capture operation will be performed. If the data register 108 is a CSU data register both the update and capture operation will be performed. Following the data register capture or update and capture operation, the C1 and C2 control signals from the CMD circuit are set to allow the data register to resume shifting data from TDI to TDO.

Figure 25B:
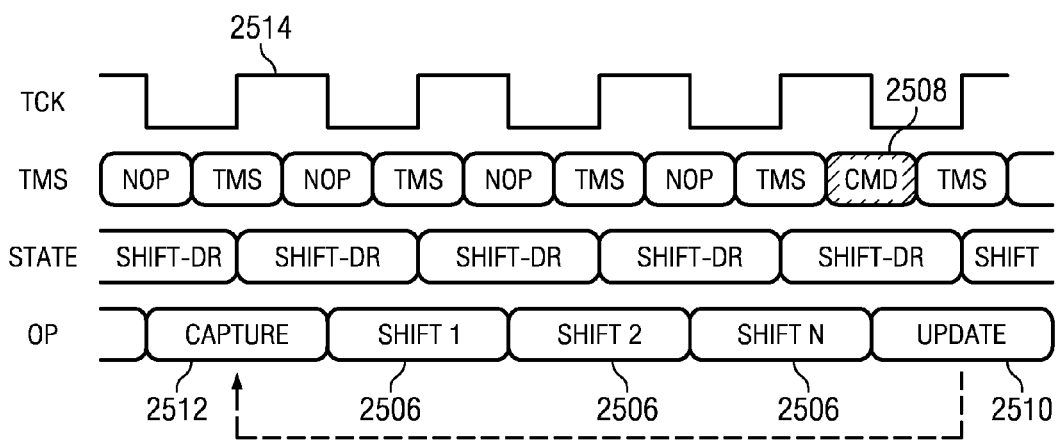
FIG. 25B illustrates a commanded update, capture and shift operation according to the disclosure.

The diagram of FIG. 25B illustrates timing of the above mentioned capture, shift and update operations occurring on a CSU data register 108 that is being controlled by the CMD circuit while the TSM is in the Shift-DR state. At time points 2506 the data register is shifting data from TDI to TDO on the rising edge of TCK. At time point 2508, the CMD circuit 2404 receives a CMD input from TMS on the falling edge of TCK.

In response to the CMD input, the CMD circuit outputs control to the routing circuit 2502 to cause the routing circuit to output DRC control on bus 2504 to perform an update operation on the rising edge of TCK at time point 2510 then to perform a capture operation on the next rising edge of TCK at time point 2512. Following the update and capture operations the data register resumes shifting data from TDI to TDO on the rising edge of TCK at time point 2514.

It is important to the note in FIG. 25B that the CSU data register update operation 2510 occurs on the next rising edge TCK after the last (Shift-N) rising edge TCK shift operation 2516. This provides an update timing improvement over a conventional TSM controlled CSU data register update operation which, as seen in FIG. 6, occurs one and one half TCKs after the last shift (Shift-N) operation.

It is also important to the note in FIG. 25B that the CSU data register capture operation 2512 occurs on the next rising edge TCK after the update operation 2510. This provides a capture timing improvement over a conventional TSM controlled CSU data register capture operation which, as seen in FIG. 6, occurs two and one half TCKs after the update operation. The disclosures ability to perform a capture operation one TCK after an update operation allows testing for circuit timing related problems that cannot be tested using a conventional TSM controlled update and capture operation.

Figure 25C:
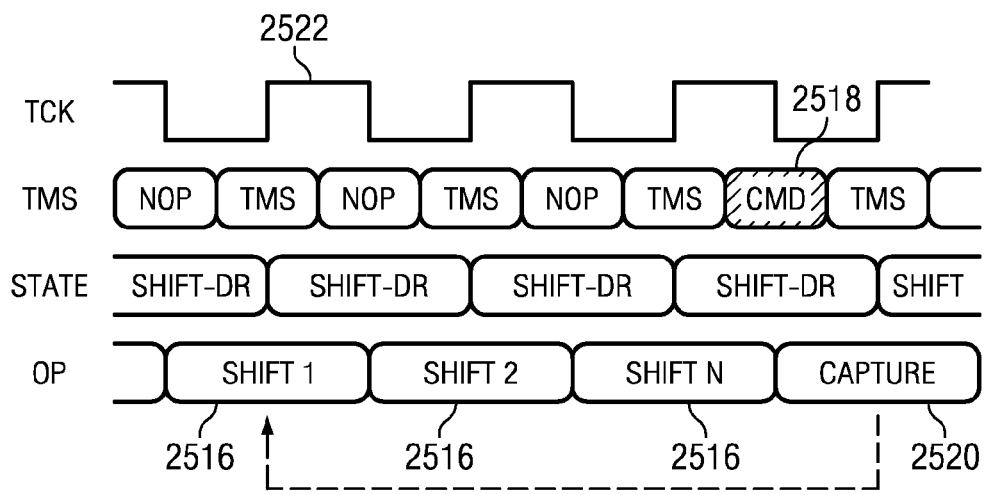
FIG. 25C illustrates a commanded capture and shift operation according to the disclosure.

The diagram of FIG. 25C illustrates timing of the above mentioned capture and shift operations occurring on a CS data register 108 that is being controlled by the CMD circuit while the TSM is in the Shift-DR state. At time points 2516 the data register is shifting data from TDI to TDO on the rising edge of TCK. At time point 2518, the CMD circuit receives a CMD input from TMS on the falling edge of TCK. In response to the CMD input, the CMD circuit outputs control to the routing circuit to cause the routing circuit to output DRC control on bus 2504 to perform a capture operation on the rising edge of TCK at time point 2520. Following the capture operation the data register resumes shifting data from TDI to TDO on the rising edge of TCK at time point 2522.

It is important to the note in FIG. 25C that the CS data register capture operation 2520 occurs on the next rising edge TCK after last shift (Shift-N) operation 2516. This provides a capture timing improvement over a conventional TSM controlled CS data register capture operation which, as seen in FIG. 7, occurs four TCKs after the last shift (Shift-N) operation update operation. The disclosures ability to perform a capture operation one TCK after the last shift operation allows testing for circuit timing related problems that cannot be tested using a conventional TSM controlled shift and capture operation.

As seen in the timing diagrams of FIGS. 25B and 25C the TMS signal input operation is modified to enable the new control approach of the disclosure by inputting the normal TMS signal to the TSM 104 on the rising edge of TCK then switching the TMS signal input to input either a no-operation (NOP) signal or the CMD signal to the CMD circuit 2404 on the falling edge of TCK. In this example, the NOP signal input on TMS is a low logic state signal and the CMD signal input on TMS is a high logic state signal. However it should be understood that the logic states of the NOP and CMD signals could be reversed if desired.

Figure 26A:
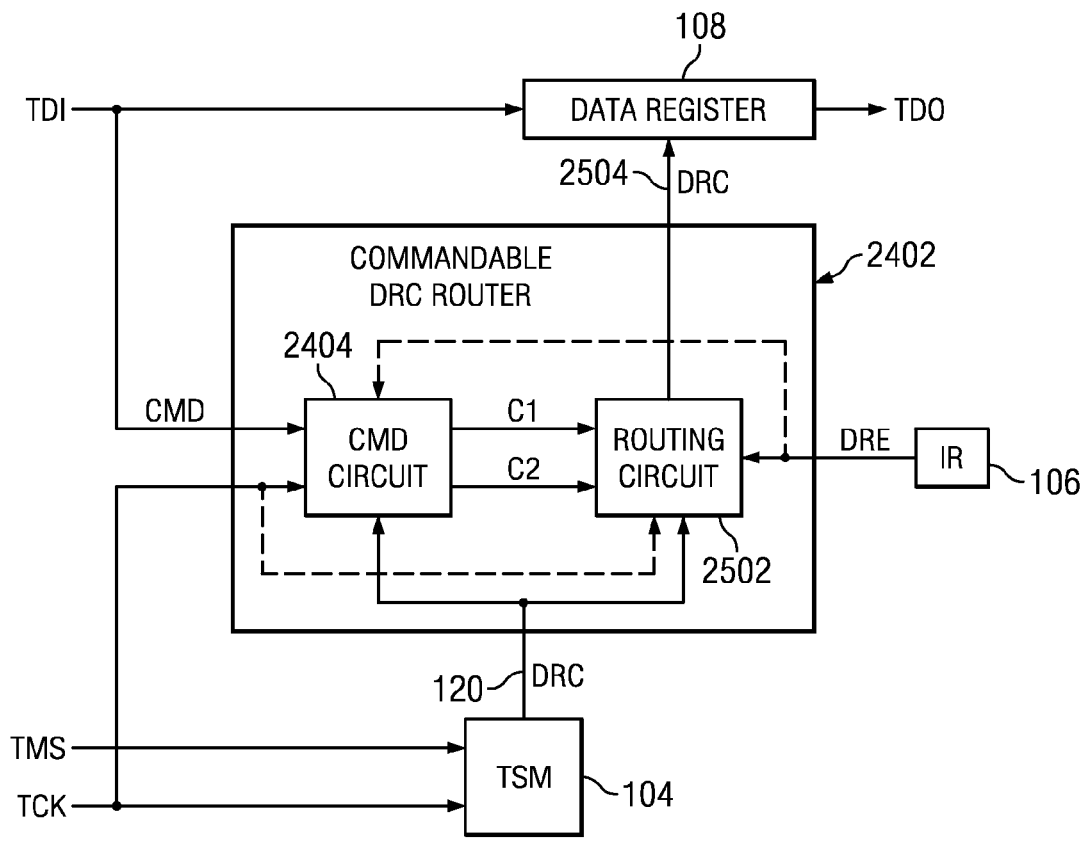
FIG. 26A illustrates an alternate simplified view of the TSM, commandable DRC router and data register according to the disclosure.
Figure 26B:
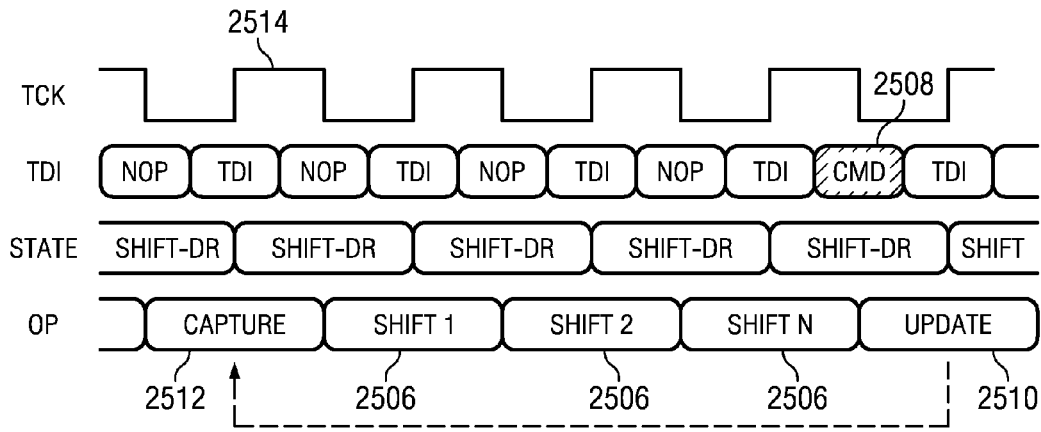
FIG. 26B illustrates an alternate commanded update, capture and shift operation according to the disclosure.
Figure 26C:
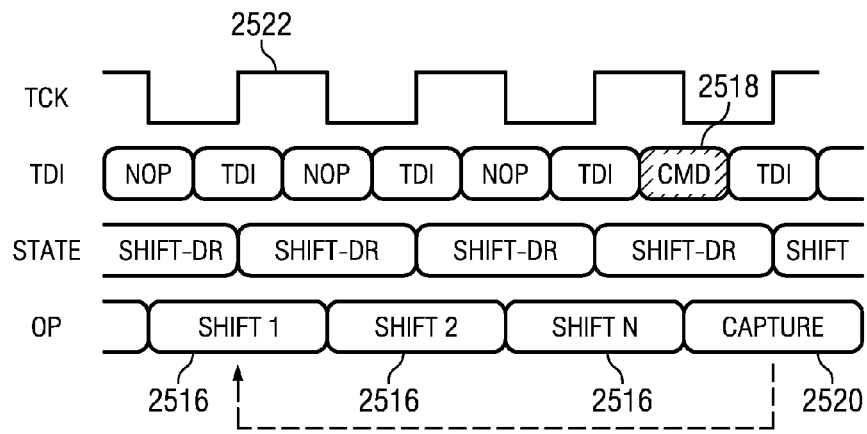
FIG. 26C illustrates an alternate commanded capture and shift operation according to the disclosure.

FIGS. 26A-26C are provided to indicate that the NOP and CMD signals could be input via the TDI signal instead of the TMS signal. FIG. 26A is identical to FIG. 25A with the exception that the NOP and CMD inputs come from TDI instead of TMS. Timing FIGS. 26B and 26C are identical to timing FIGS. 25B and 25C with the exception that TDI is used to input the NOP and CMD signals on the falling edge of TCK instead of using TMS. While TDI can be used to input the NOP and CMD signals, there is an advantage of using TMS for inputting NOP and CMD signals. This advantage will be described later in regard to FIGS. 57A, 58A, 62A, 63A and 64A illustrating devices that are connected in a daisy-chain arrangement to a controller.

The advantage of using the TAP's TMS or TDI input to input the NOP and CMD signals is that no additional device input is required to input commands to the CMD circuit.

The CMD circuit 2404 of FIGS. 25A and 26A may be designed in many different ways including but not limited to the example designs shown in regard to FIGS. 27A-27D.

Figure 27A:
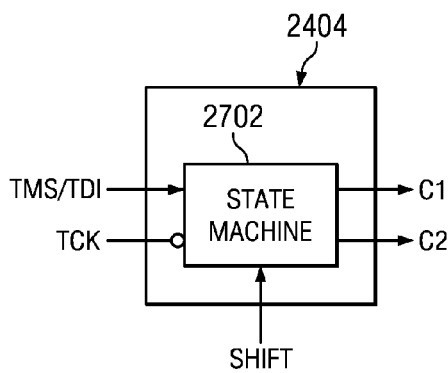
FIG. 27A illustrates a first example CMD circuit according to the disclosure.
Figure 27B:
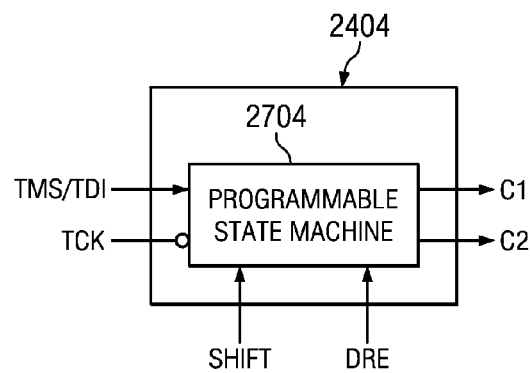
FIG. 27B illustrates a second example CMD circuit according to the disclosure.

FIG. 27A illustrates a CMD circuit 2404 design example comprising a state machine 2702. The state machine 2702 has inputs for receiving the TMS signal of FIG. 25A or the TDI signal of 26A, an inverted TCK signal, and the Shift signal. The state machine 2702 has outputs for outputting control signals, in this example the C1 and C2 control signals. When the Shift signal from the TSM is asserted, the state machine responds to a CMD signal input on the TMS/TDI input on the falling edge of TCK to output C1 and C2 control to perform the described capture and shift or the described capture, shift and update operations on the data register 108 of FIGS. 25A and 26A. If the data register 108 is a CS data register, the state machine will be designed to output capture and shift control to the data register in response to the CMD input. If the data register 108 is a CSU data register, the state machine will be designed to output capture, and update control to the data register in response to the CMD input.

FIG. 27B illustrates a CMD circuit 2404 design example comprising a programmable state machine 2704. The programmable state machine 2702 has inputs for receiving the TMS signal of FIG. 25A or the TDI signal of 26A, an inverted TCK signal, the Shift signal and DRE input from the instruction register 106, shown in dotted line in FIGS. 25A and 26A. The programmable state machine 2704 has outputs for outputting control signals, in this example the C1 and C2 control signals. When the Shift signal from the TSM is asserted, the programmable state machine responds to a CMD signal input on the TMS/TDI input on the falling edge of TCK to output C1 and C2 control to perform an operation programmed by the DRE inputs. The programmed operation could be; (1) controlling a CSU data register to perform a capture, shift and update operation as shown in timing diagram 25B, (2) controlling a CS data register to perform a capture and shift operation as shown in timing diagram 25C or (3) controlling other types operations to other types of data registers or similar circuits.

Figure 27C:
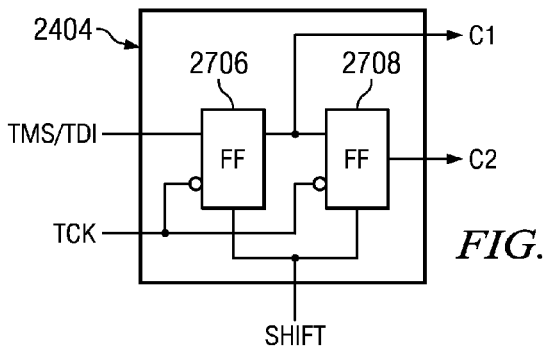
FIG. 27C illustrates a third example CMD circuit according to the disclosure.

FIG. 27C illustrates a very simple CMD circuit 2404 design example comprising only two serially connected FFs 2706 and 2708. FF 2706 has a data input for receiving the TMS signal of FIG. 25A or the TDI signal of 26A, a clock input for receiving an inverted TCK signal, a reset input for receiving the Shift signal, and a data output for outputting a C1 control signal. FF 2708 has a data input for receiving input from the data output from FF 2706, a clock input for receiving an inverted TCK signal, a reset input for receiving the Shift signal, and a data output for outputting a C1 control signal. When the Shift signal from the TSM is asserted, the reset condition to the FFs 2706 and 2708 is removed and the FFs start shifting data from the TMS/TDI input on the falling edge of TCK. When a CMD signal is input to FF 2706 (a logic high in this example) from the TMS/TDI input the data output of FF 2706 will be set high on the falling edge of TCK, which sets the C1 control signal high. On the next falling edge of TCK the data output of FF 2708 will be set high by the high output from FF 2706, which sets the C2 control signal high.

As seen in FIGS. 25B and 25C, the CMD signal is a temporary logic high signal that is asserted prior to a first falling edge TCK to set the C1 output of FF 2706 high and is de-asserted to a logic low signal prior to the next (second) falling edge TCK to set the C1 output back low. As C1 is set low on the second falling edge TCK, C2 from FF 2708 is set high. On a third (next) falling edge TCK both C2 is set back low and C1 remains low. As can be seen, the CMD circuit 2404 example of FIG. 27C simply operates to shift the temporary logic high CMD signal through FFs 2706 and 2708 on the falling edge of TCK to temporarily set the C1 control signal high then set the C2 control signal high.

When the CMD circuit 27C is coupled to a CSU data register, the temporary C1 signal causes the data register to perform an update operation on the rising edge of TCK and the temporary C2 signal causes the data register to perform a capture operation on the rising edge of TCK. Following the temporary C1 and C2 signal operations the CSU data register performs rising edge shift operations. The update, capture and shift timing of the CSU data register is as shown in FIG. 25B. When the CMD circuit 27C is coupled to a CS data register, the temporary C1 signal causes the data register to perform a capture operation on the rising edge of TCK. Following the temporary C1 signal operation the CS data register performs rising edge shift operations. The capture and shift timing of the CS data register is as shown in FIG. 25C.

Figure 27D:
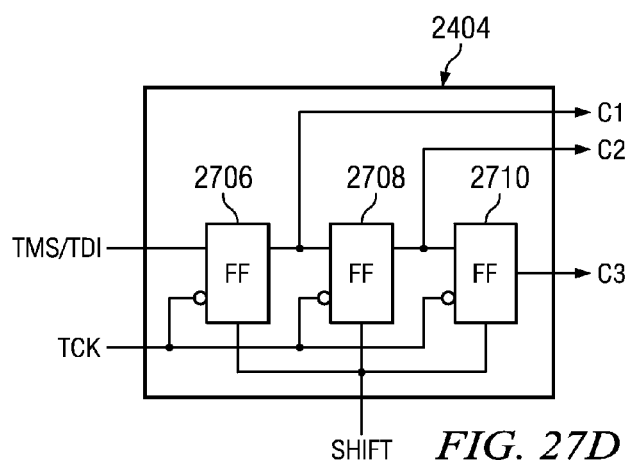
FIG. 27D illustrates a fourth example CMD circuit according to the disclosure.

FIG. 27D is provided simply illustrate how the very simple CMD circuit 2404 design example of FIG. 27C can be expanded to include an additional control output signal C3 by simply adding a third FF 2710 to the serial output of the second FF 2708. The additional control output signal C3 can be used to provide an additional control function in response to a CMD input to FF 2706. Further additional control functions, C4-Cn, can be added simply by adding additional FFs to the serial path of FFs. The state machine CMD circuits 2404 of FIGS. 27A and 27B can similarly be designed to include additional control outputs if required.

Figure 9:
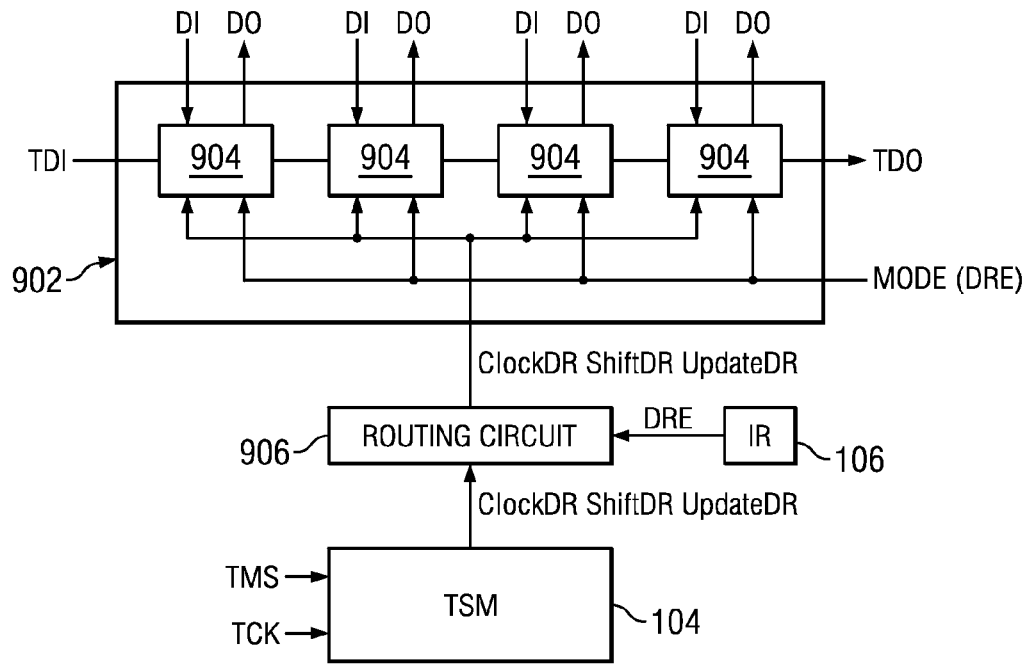
FIG. 9 illustrates a conventional TSM, routing circuit and data register arrangement.
Figure 10:
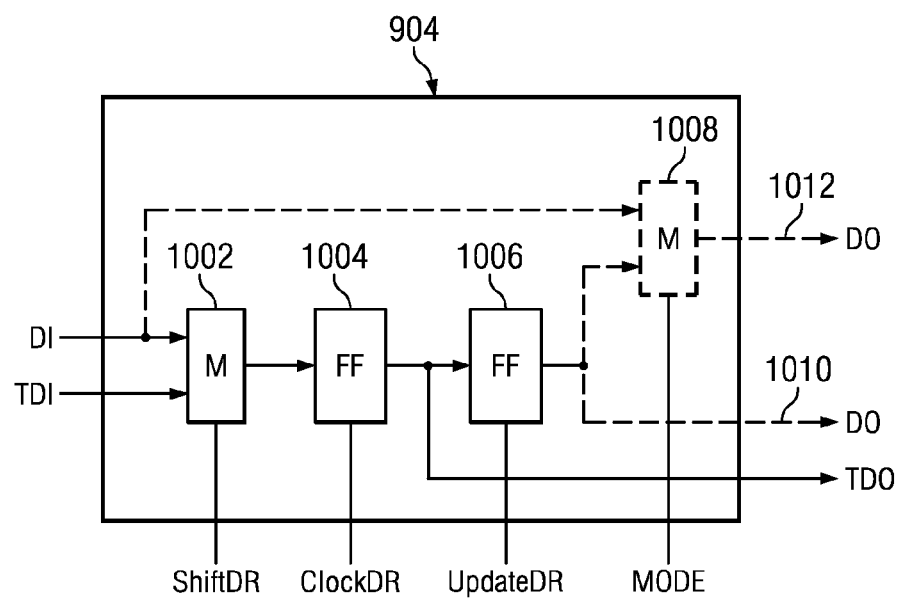
FIG. 10 illustrates the scan cells of the data register of FIG. 9.
Figure 28:
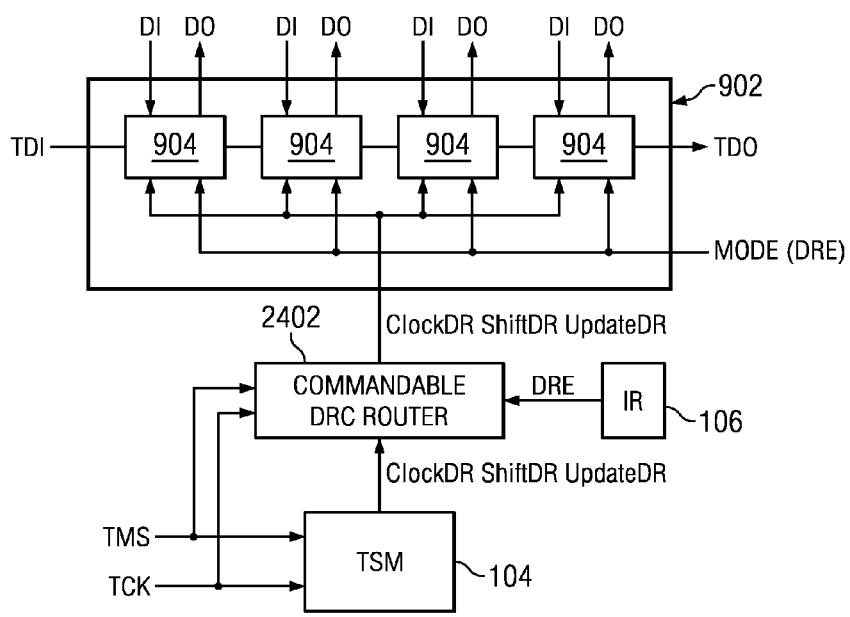
FIG. 28 illustrates a TSM, commandable DRC router and data register arrangement according to the disclosure.

FIG. 28 illustrates the previously described FIG. 9 asynchronous CSU data register 902 coupled to TSM 104 via a commandable DRC router 2402. The commandable DRC router, when enabled, operates in one of two modes. The first mode allows the TSM to control scan access to the data register 902 as described in regard to FIGS. 9 and 11. The second mode allows the CMD circuit 2404 within the commandable DRC router 2402 to control scan access to the data register 902. The operation modes are determined by DRE inputs from the instruction register 106. A first instruction loaded into the instruction register enables the data register 902 to be controlled by the TSM and a second instruction loaded into the instruction register enables the data register to be controlled by the CMD circuit 2404.

Figure 29:
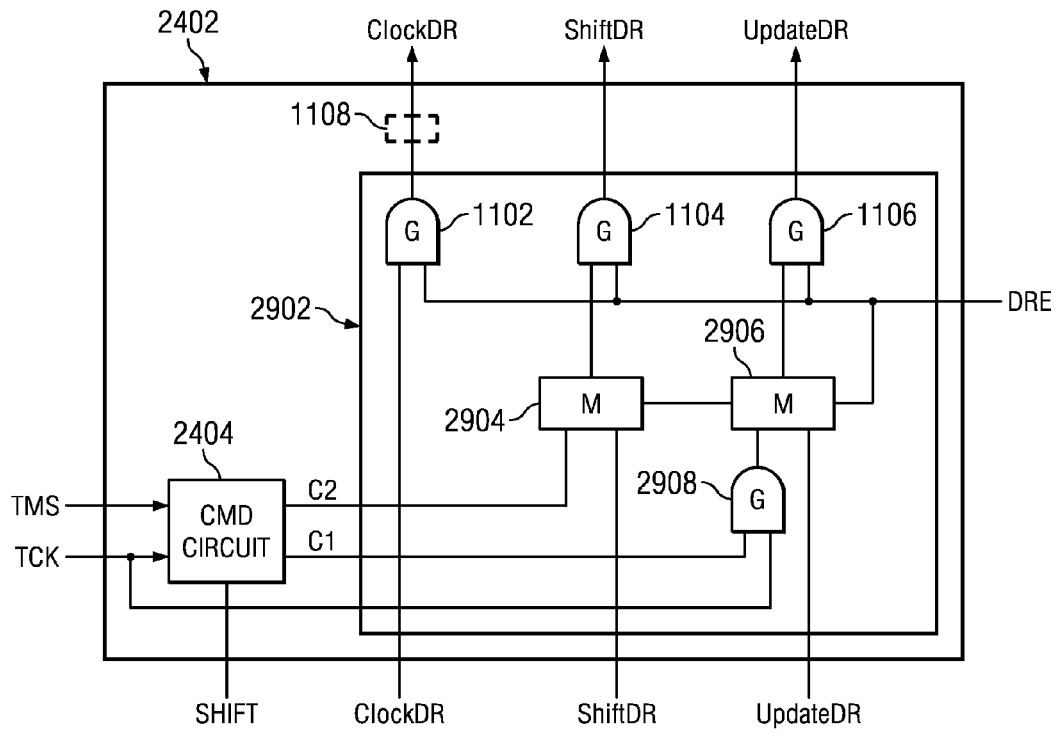
FIG. 29 illustrates the commandable DRC router of FIG. 28.

FIG. 29 illustrates the commandable DRC router 2402 of FIG. 28 which comprises a CMD circuit 2404 and a routing circuit 2902. The CMD circuit 2404 could be, but not limited to, the simple CMD circuit of FIG. 27C, or the state machine controlled CMD circuits of FIGS. 27A and 27B. The routing circuit comprises the gating circuits 1102, 1104, and 1106 of FIG. 11, multiplexers 2904 and 2906 and gating circuit 2908, all connected as shown.

In response to the above mentioned first instruction, DRE inputs couple the ClockDR output from the TSM to the ClockDR input of the data register via gating circuit 1102 and optional clock multiplexer 1108 (if included), the ShiftDR output of the TSM to the ShiftDR input of the data register via gating circuit 1104 and multiplexer 2904 and the UpdateDR output of the TSM to the UpdateDR input of the data register via gating circuit 1106 and multiplexer 2906. As can be seen, the first instruction enables scan access to the data register from the TSM as described in regard to the routing circuit 906 of FIG. 9.

In response to the above mentioned second instruction, DRE inputs couple the ClockDR output from the TSM to the ClockDR input of the data register via gating circuit 1102 and optional clock multiplexer 1108 (if included), the C2 output of the CMD circuit 2404 to the ShiftDR input of the data register via gating circuit 1104 and multiplexer 2904 and the C1 output of the CMD circuit to the UpdateDR input of the data register via gating circuit 1106, multiplexer 2906 and gating circuit 2908.

Figure 1:
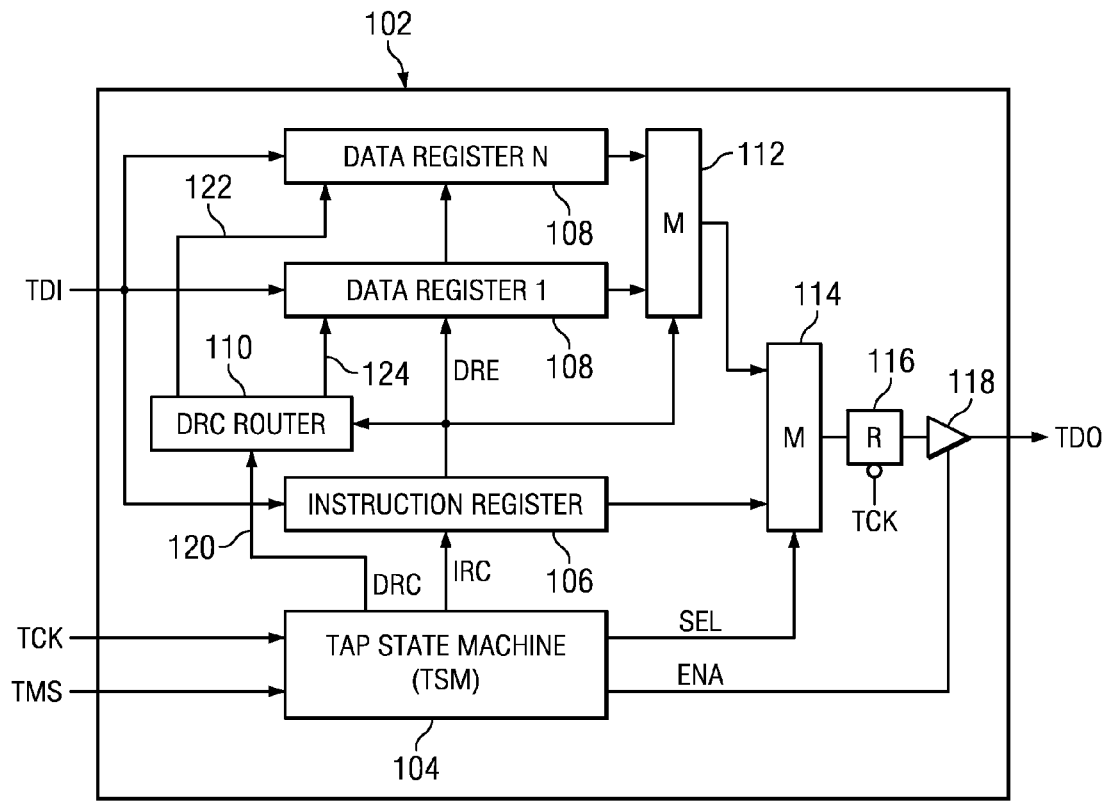
FIG. 1 illustrates a conventional Test Access Port (Tap) architecture in a device.
Figure 3:
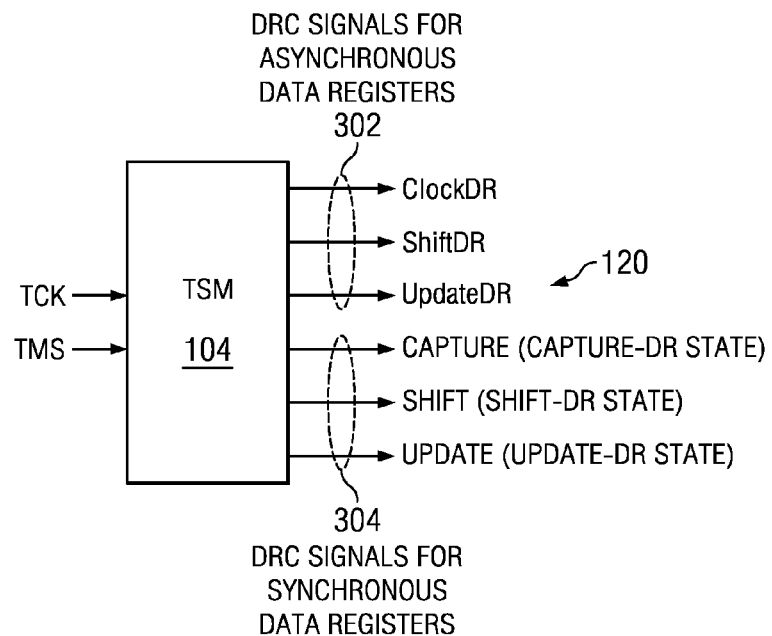
FIG. 3 illustrates the data register control (DRC) outputs of a Tap state machine.
Figure 2:
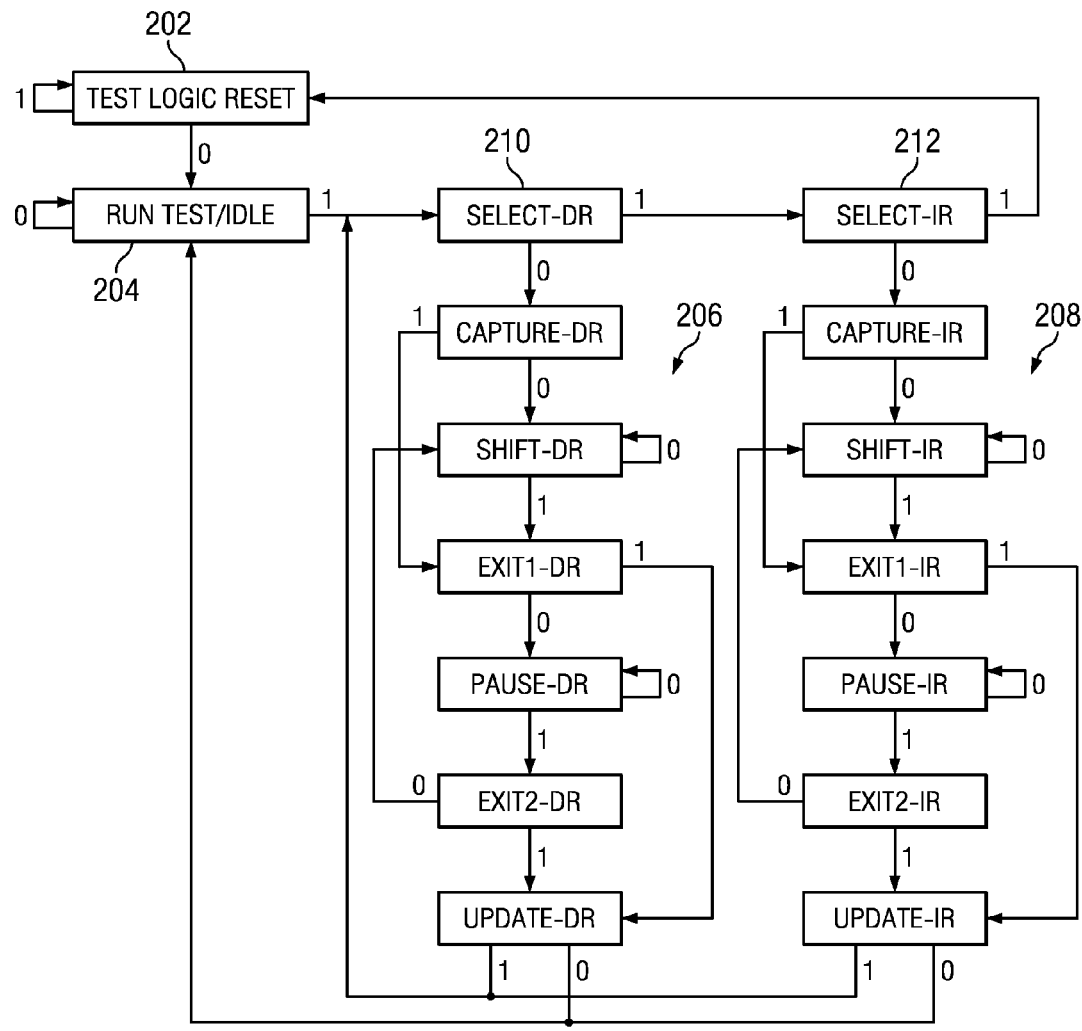
FIG. 2 illustrates the state diagram of the Tap state machine (TSM) in the Tap architecture.
Figure 5:
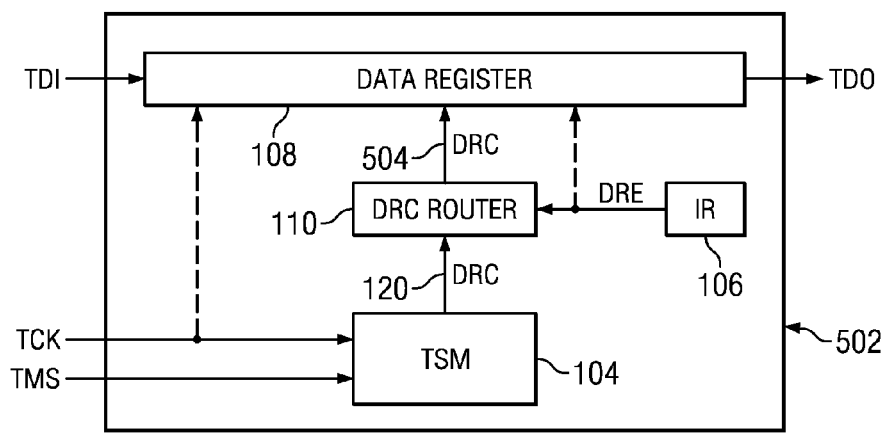
FIG. 5 illustrates a simplified view of the TSM, DRC router and data register.

When the TSM enters the Shift-DR state of FIG. 2 TCKs are output on the ClockDR signal and the C1 and C2 control outputs from the CMD circuit are set to cause the data register to shift data from TDI to TDO on the rising edge of the ClockDR signals. Also during the Shift-DR state the Shift input from TSM is asserted to enable the CMD circuit 2404 to input a CMD from TMS in response to the TCK signal. In response to a CMD input, CMD circuit 2404 sets C1 high on the falling edge of TCK to enable a rising edge TCK signal to be passed through gating circuit 2908 to multiplexer 1106 and gating circuit 1106 to perform an update operation on data register 902. Next the CMD circuit 2404 sets C1 back low and C2 high on the falling edge of TCK to control the ShiftDR signal input to data register 902, via multiplexer 2904 and gating circuit 1104, to perform a rising edge ClockDR capture operation on data register 902. Following the C1 controlled update operation and C2 controlled capture operation, the CMD circuit 2404 sets C2 back low and maintains a low on C1 to cause the data register 902 to resume shifting data on the rising edge of ClockDR from TDI to TDO. The update and capture operations repeat, while the TSM is in the Shift-DR state of FIG. 2, each time a CMD is input to CMD circuit 2404. As can be seen, the second instruction enables the data register 902 to cycle through the uninterrupted update, capture and shift operations of FIG. 25B in response to the C1 and C2 control signals from CMD circuit 2404 and the ClockDR signal from the TSM.

Figure 13:
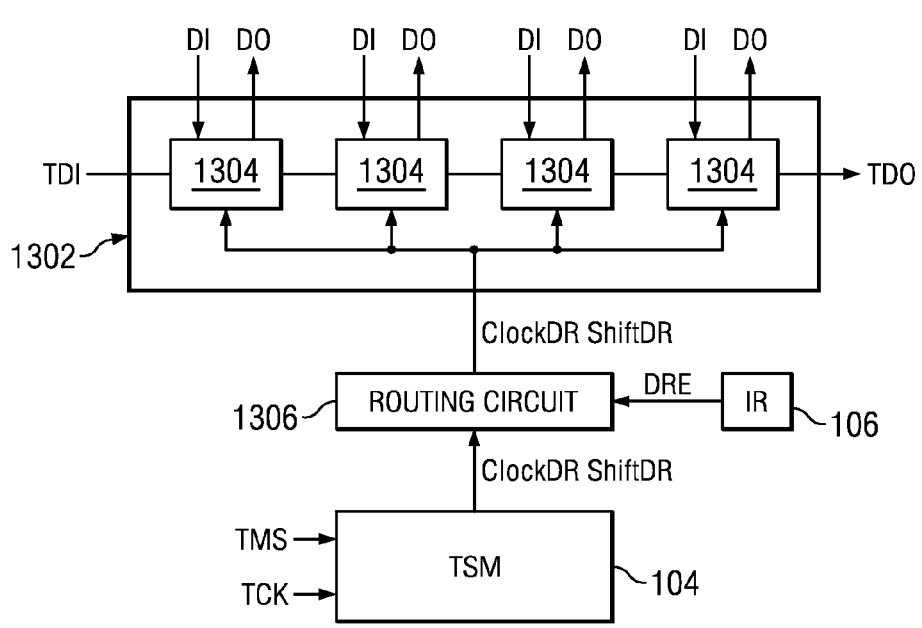
FIG. 13 illustrates a conventional TSM, routing circuit and data register arrangement.
Figure 14:
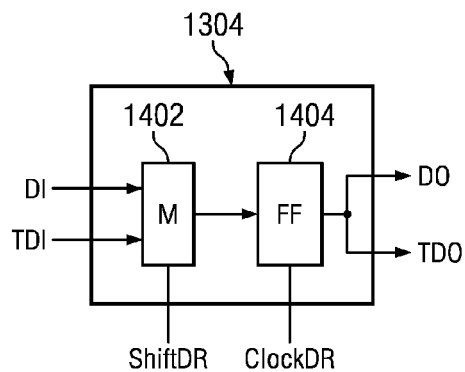
FIG. 14 illustrates the scan cells of the data register of FIG. 13.
Figure 15:
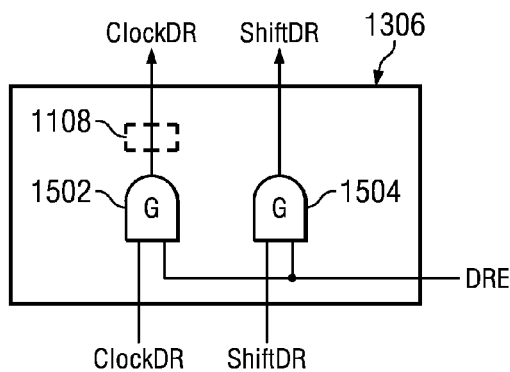
FIG. 15 illustrates the routing circuit of FIG. 13.
Figure 30:
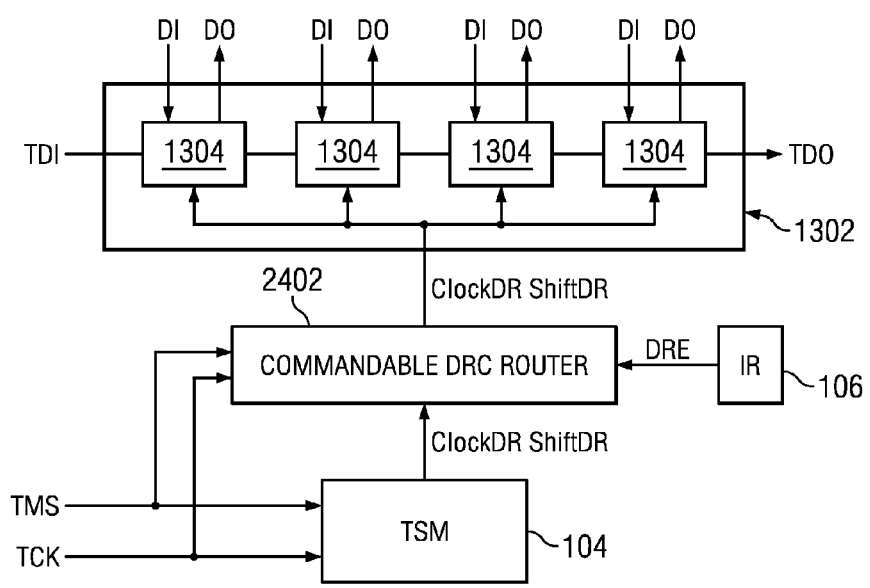
FIG. 30 illustrates a TSM, commandable DRC router and data register arrangement according to the disclosure.

FIG. 30 illustrates the previously described FIG. 13 asynchronous CS data register 1302 coupled to TSM 104 via a commandable DRC router 2402. The commandable DRC router, when enabled, operates in one of two modes. The first mode allows the TSM to control scan access to the data register 1302 as described in regard to FIGS. 13 and 15. The second mode allows the CMD circuit 2404 within the commandable DRC router 2402 to control scan access to the data register 1302. The operation modes are determined by DRE inputs from the instruction register 106. A first instruction loaded into the instruction register enables the data register 1302 to be controlled by the TSM and a second instruction loaded into the instruction register enables the data register to be controlled by the CMD circuit 2404.

Figure 31:
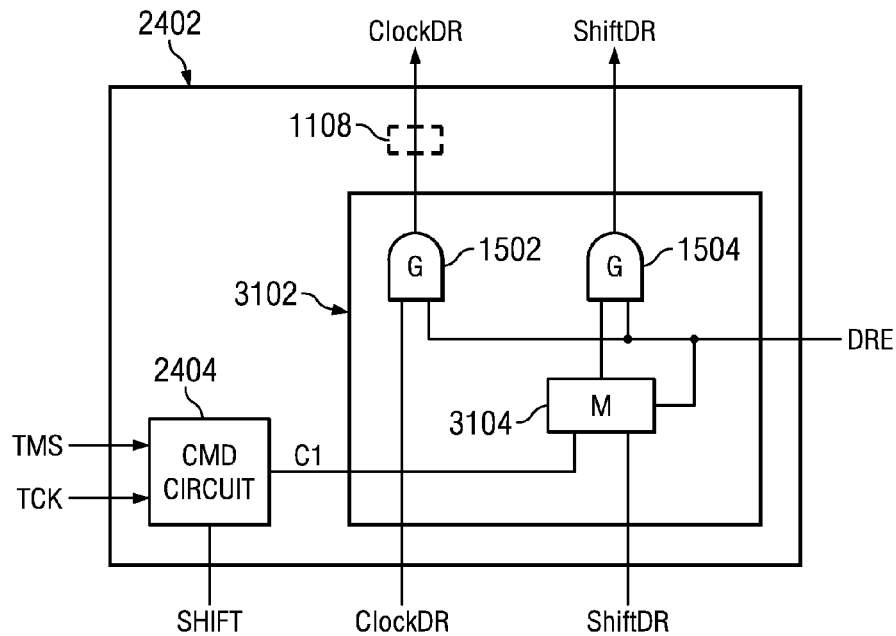
FIG. 31 illustrates the commandable DRC router of FIG. 30.

FIG. 31 illustrates the commandable DRC router 2402 of FIG. 28 which comprises a CMD circuit 2404 and a routing circuit 3102. The CMD circuit 2404 could be, but not limited to, the simple CMD circuit of FIG. 27C, or the state machine controlled CMD circuits of FIGS. 27A and 27B. The routing circuit comprises the gating circuits 1502 and 1504 of FIG. 15 and multiplexer 3104, all connected as shown.

In response to the above mentioned first instruction, DRE inputs couple the ClockDR output from the TSM to the ClockDR input of the data register via gating circuit 1502 and optional clock multiplexer 1108 (if included) and the ShiftDR output of the TSM to the ShiftDR input of the data register via gating circuit 1104 and multiplexer 3104. As can be seen, the first instruction enables scan access to the data register from the TSM as described in regard to the routing circuit 1306 of FIG. 13.

In response to the above mentioned second instruction, DRE inputs couple the ClockDR output from the TSM to the ClockDR input of the data register via gating circuit 1102 and optional clock multiplexer 1108 (if included) and the C1 output of the CMD circuit 2404 to the ShiftDR input of the data register via gating circuit 1504 and multiplexer 3104.

When the TSM enters the Shift-DR state of FIG. 2 TCKs are output on the ClockDR signal and the C1 control output from the CMD circuit is set to cause the data register to shift data from TDI to TDO on the rising edge of the ClockDR signals. Also during the Shift-DR state the Shift input from TSM is asserted to enable the CMD circuit 2404 to input a CMD from TMS in response to the TCK signal. In response to a CMD input, CMD circuit 2404 sets C1 high on the falling edge of TCK to control the ShiftDR signal input to data register 1302, via multiplexer 3104 and gating circuit 1504, to perform a rising edge ClockDR capture operation on data register 1302. Following the C1 controlled capture operation, the CMD circuit 2404 sets C1 back low to cause the data register 1302 to resume shifting data on the rising edge of ClockDR from TDI to TDO. This capture operation repeats, while the TSM is in the Shift-DR state of FIG. 2, each time a CMD is input to CMD circuit 2404. As can be seen, the second instruction enables the data register 1302 to cycle through the uninterrupted capture and shift operations of FIG. 25C in response to the C1 control signal from CMD circuit 2404 and the ClockDR signal from the TSM.

Figure 16:
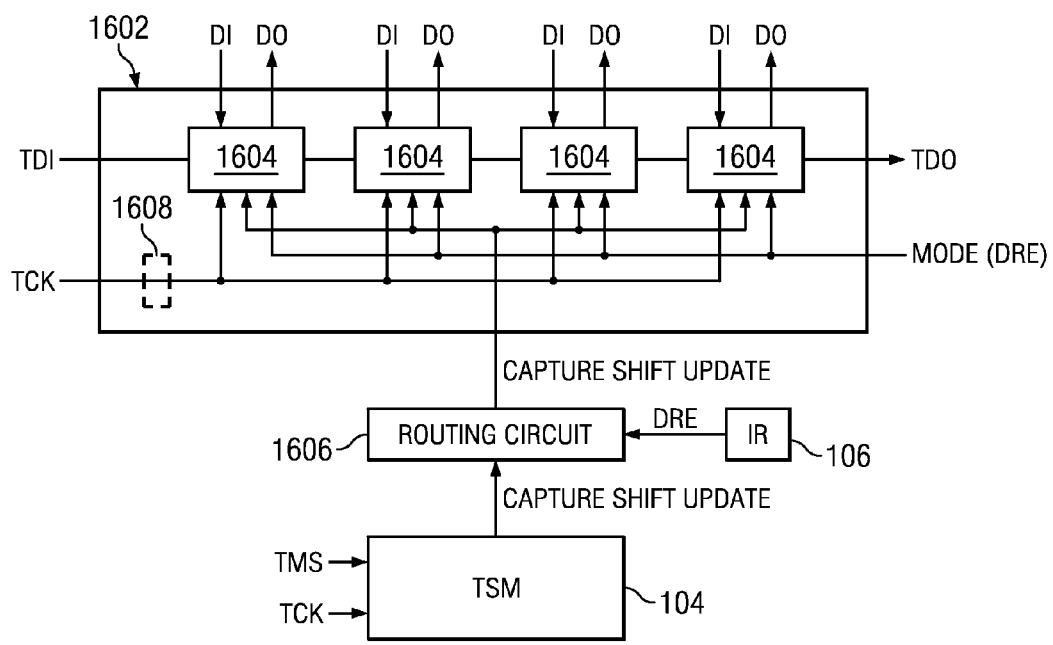
FIG. 16 illustrates a conventional TSM, routing circuit and data register arrangement.
Figure 16A:
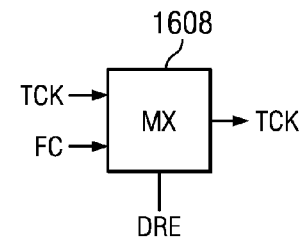
FIG. 16A illustrates a clock multiplexer circuit
Figure 17:
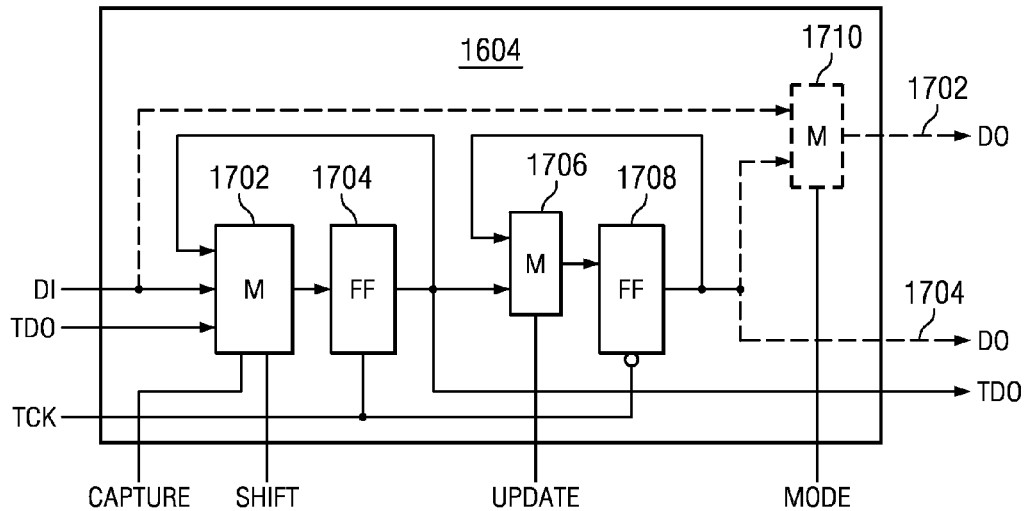
FIG. 17 illustrates the scan cells of the data register of FIG. 16.
Figure 18:
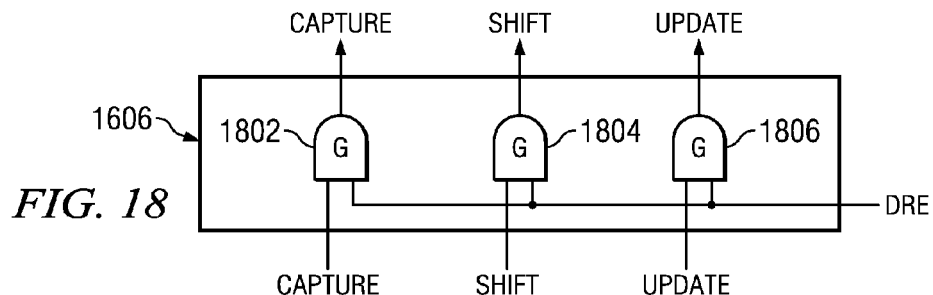
FIG. 18 illustrates the routing circuit of FIG. 16.
Figure 32:
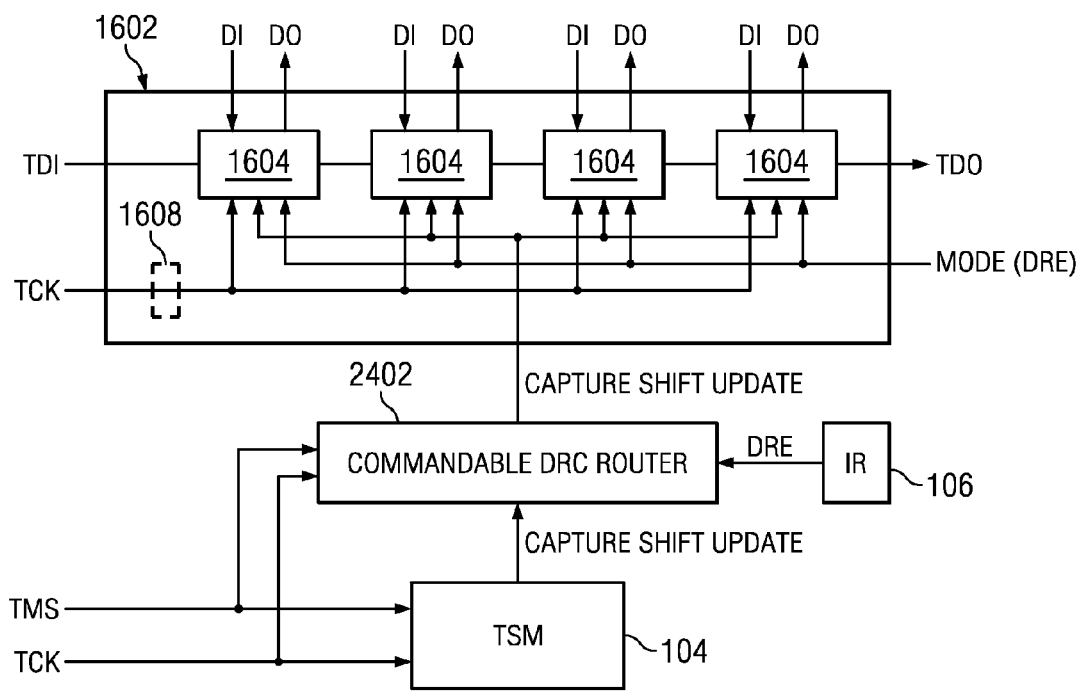
FIG. 32 illustrates a TSM, commandable DRC router and data register arrangement according to the disclosure.

FIG. 32 illustrates the previously described FIG. 16 synchronous CSU data register 1602 coupled to TSM 104 via a commandable DRC router 2402. The commandable DRC router, when enabled, operates in one of two modes. The first mode allows the TSM to control scan access to the data register 1602 as described in regard to FIGS. 16 and 18. The second mode allows the CMD circuit 2404 within the commandable DRC router 2402 to control scan access to the data register 1602. The operation modes are determined by DRE inputs from the instruction register 106. A first instruction loaded into the instruction register enables the data register 1602 to be controlled by the TSM and a second instruction loaded into the instruction register enables the data register to be controlled by the CMD circuit 2404.

Figure 33:
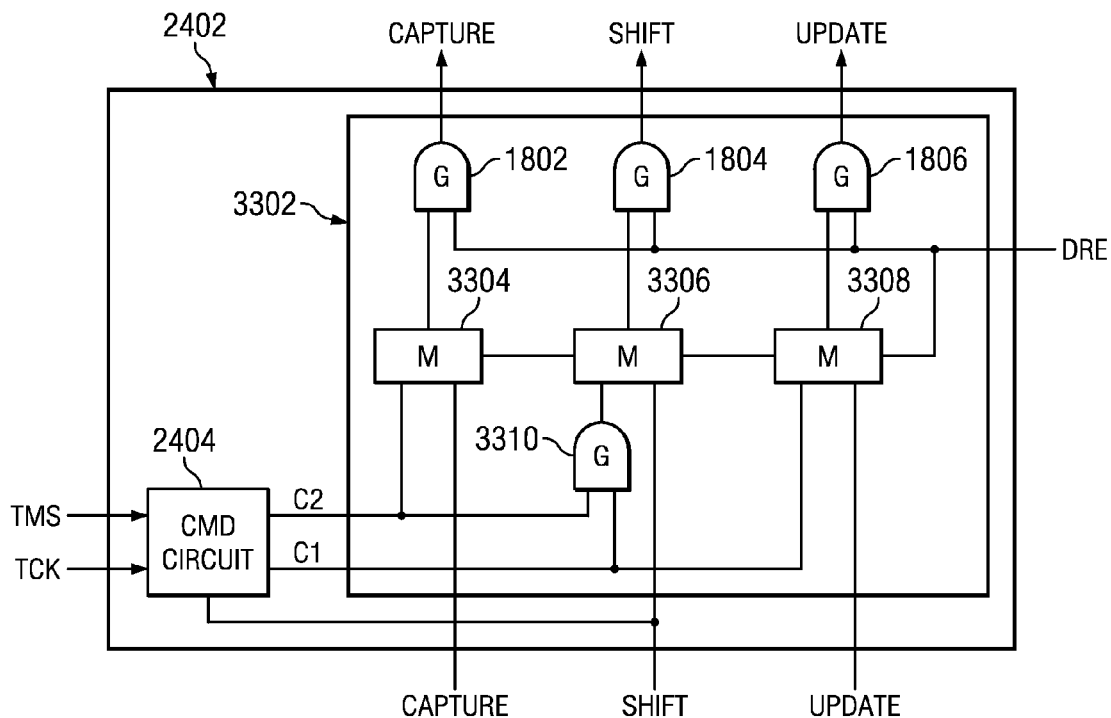
FIG. 33 illustrates the commandable DRC router of FIG. 32.

FIG. 33 illustrates the commandable DRC router 2402 of FIG. 32 which comprises a CMD circuit 2404 and a routing circuit 3302. The CMD circuit 2404 could be, but not limited to, the simple CMD circuit of FIG. 27C, or the state machine controlled CMD circuits of FIGS. 27A and 27B. The routing circuit comprises the gating circuits 1802, 1804, and 1806 of FIG. 18 and multiplexers 3304, 3306 and 3308 and gating circuit 3310, all connected as shown.

In response to the above mentioned first instruction, DRE inputs couple the Capture output from the TSM to the Capture input of the data register via gating circuit 1802 and multiplexer 3304, the Shift output of the TSM to the Shift input of the data register via gating circuit 1804 and multiplexer 3306 and the Update output of the TSM to the Update input of the data register via gating circuit 1806 and multiplexer 3308. As can be seen, the first instruction enables scan access to the data register from the TSM as described in regard to the routing circuit 1606 of FIG. 16.

In response to the above mentioned second instruction, DRE inputs couple the C2 output of CMD circuit 2404 to the Capture input of the data register via gating circuit 1802 and multiplexer 3304, the C2 output of CMD circuit 2404 to the Shift input of the data register via gating circuit 1804, multiplexer 3306 and gating circuit 3310, the C1 output of the CMD circuit to the Update input of the data register via gating circuit 1806 and multiplexer 3308 and the C1 output of the CMD circuit to the Shift input of the data register via gating circuit 3310, multiplexer 3306 and gating circuit 1804.

When the TSM enters the Shift-DR state of FIG. 2 the C1 and C2 control outputs from the CMD circuit are set to cause the data register to shift data from TDI to TDO on the rising edge of the TCK signal. Also during the Shift-DR state the Shift input from TSM is set to enable the CMD circuit 2404 to input a CMD from TMS in response to the TCK signal. In response to a CMD input, CMD circuit 2404 asserts a control signal on C1 on the falling edge of TCK. The C1 control signal passes through gating circuit 3310, multiplexer 3306 and gating circuit 1804 to set the Shift input to the data register to a non-shifting state. The C1 control signal also passes through multiplexer 3308 and gating circuit 1806 to set the Update signal of the data register to the update state. With the Update signal set to the update state, the data register performs an update operation on the next rising edge of the TCK signal.

Next the CMD circuit 2404 de-asserts the C1 control signal and asserts a control signal on C2 on the falling edge of TCK. The C2 control signal passes through multiplexer 3304 and gating circuit 1802 to set the Capture input to the data register to the capture state. The C2 control signal also passes through gating circuit 3310, multiplexer 3306 and gating circuit 1804 to maintain the non-shifting state on the Shift input to the data register. With the Capture signal set to the capture state, the data register performs a capture operation on the next rising edge of the TCK signal.

Next the CMD circuit 2404 de-asserts C1 and C2 on the falling edge of TCK which sets the Shift signal back to the shifting state, the Update signal to a non-update state and the Capture signal to a non-capture state. With the Shift signal set to the shifting state, the data register resumes shifting data from TDI to TDO on the next rising edge of the TCK signal. The update and capture operations repeat, while the TSM is in the Shift-DR state of FIG. 2, each time a CMD is input to CMD circuit 2404. As can be seen, the second instruction enables the data register 1602 to cycle through the uninterrupted update, capture and shift operations of FIG. 25B in response to the C1 and C2 control signals from CMD circuit 2404 and the TCK signal input. As seen in FIG. 32, the optional clock multiplexer 1608 may be included in the TCK signal path.

Figure 19:
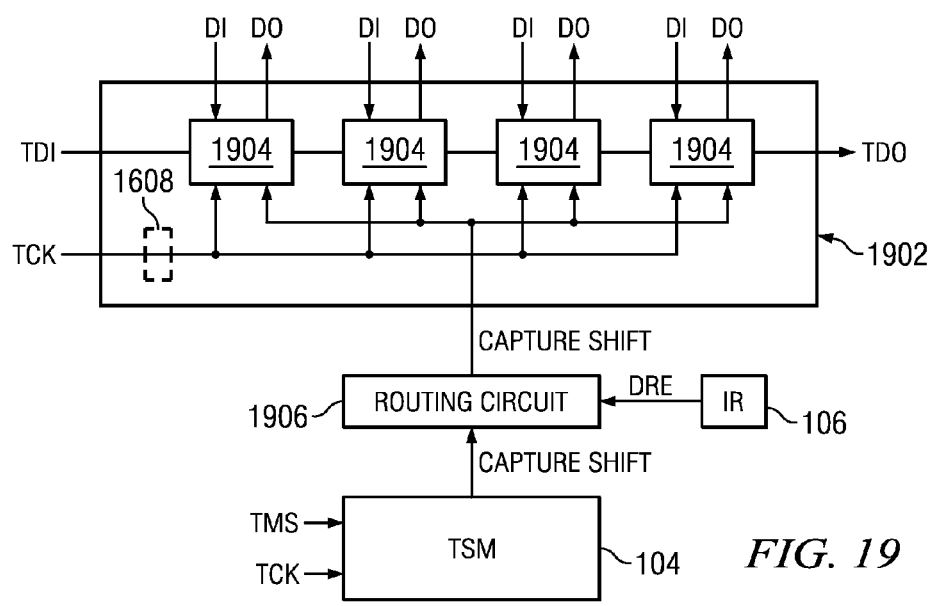
FIG. 19 illustrates a conventional TSM, routing circuit and data register arrangement.
Figure 34:
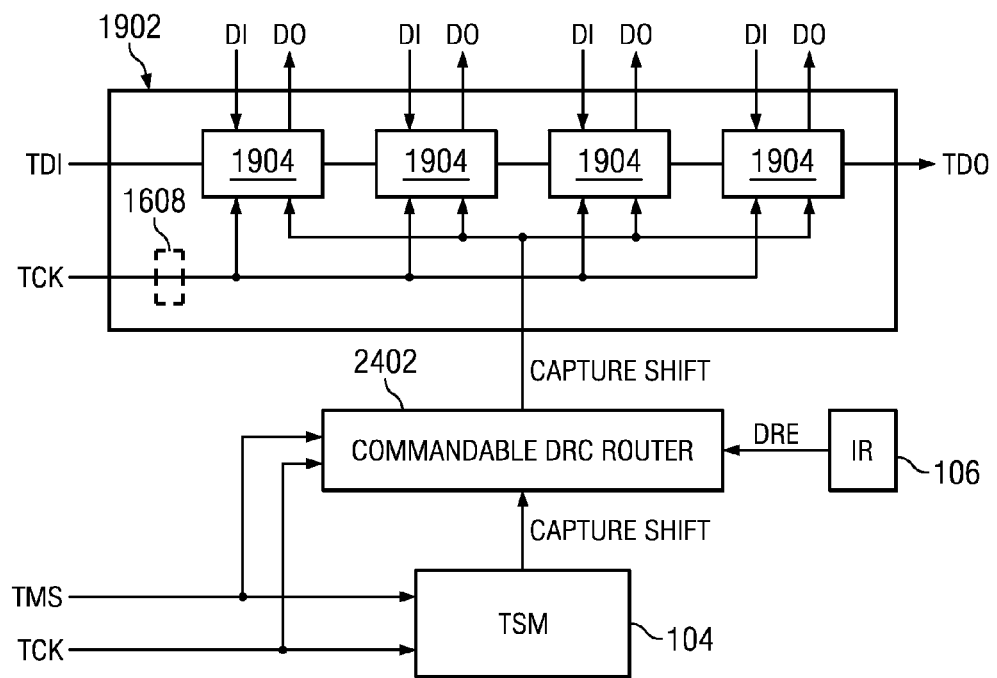
FIG. 34 illustrates a TSM, commandable DRC router and data register arrangement according to the disclosure.

FIG. 34 illustrates the previously described FIG. 19 synchronous CS data register 1902 coupled to TSM 104 via a commandable DRC router 2402. The commandable DRC router, when enabled, operates in one of two modes. The first mode allows the TSM to control scan access to the data register 1902 as described in regard to FIGS. 19 and 21. The second mode allows the CMD circuit 2404 within the commandable DRC router 2402 to control scan access to the data register 1902. The operation modes are determined by DRE inputs from the instruction register 106. A first instruction loaded into the instruction register enables the data register 1902 to be controlled by the TSM and a second instruction loaded into the instruction register enables the data register to be controlled by the CMD circuit 2404.

Figure 35:
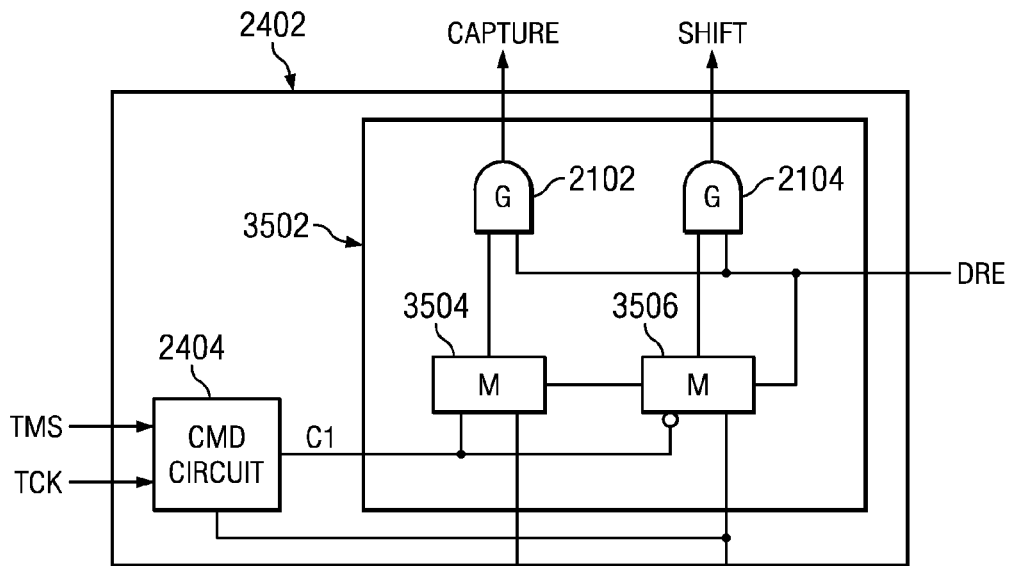
FIG. 35 illustrates the commandable DRC router of FIG. 34.

FIG. 35 illustrates the commandable DRC router 2402 of FIG. 34 which comprises a CMD circuit 2404 and a routing circuit 3502. The CMD circuit 2404 could be, but not limited to, the simple CMD circuit of FIG. 27C, or the state machine controlled CMD circuits of FIGS. 27A and 27B. The routing circuit comprises the gating circuits 2102 and 2104 of FIG. 21 and multiplexers 3504 and 3506, all connected as shown.

In response to the above mentioned first instruction, DRE inputs couple the Capture output from the TSM to the Capture input of the data register via gating circuit 2102 and multiplexer 3504 and the Shift output of the TSM to the Shift input of the data register via gating circuit 2104 and multiplexer 3506. As can be seen, the first instruction enables scan access to the data register from the TSM as described in regard to the routing circuit 1906 of FIG. 19.

In response to the above mentioned second instruction, DRE inputs couple the C1 output of CMD circuit 2404 to the Capture input of the data register via gating circuit 2102 and multiplexer 3504 and to the Shift input of the data register via gating circuit 2104 and multiplexer 3506.

When the TSM enters the Shift-DR state of FIG. 2 the C1 control output from the CMD circuit is set to cause the data register to shift data from TDI to TDO on the rising edge of the TCK signal. Also during the Shift-DR state the Shift input from TSM is set to enable the CMD circuit 2404 to input a CMD from TMS in response to the TCK signal. In response to a CMD input, CMD circuit 2404 asserts a control signal on C1 on the falling edge of TCK. The C1 control signal passes through multiplexer 3506 and gating circuit 2104 to set the Shift input to the data register to a non-shifting state. The C1 control signal also passes through multiplexer 3504 and gating circuit 2102 to set the Capture signal of the data register to the capture state. With the Capture signal set to the capture state, the data register performs a capture operation on the next rising edge of the TCK signal.

Next the CMD circuit 2404 de-asserts the C1 control signal on the falling edge of TCK which sets the Shift signal back to the shifting state and the Capture signal to a non-capture state. With the Shift signal set to the shifting state, the data register resumes shifting data from TDI to TDO on the next rising edge of the TCK signal. This capture operation repeats, while the TSM is in the Shift-DR state of FIG. 2, each time a CMD is input to CMD circuit 2404. As can be seen, the second instruction enables the data register 1902 to cycle through the uninterrupted capture and shift operations of FIG. 25C in response to the C1 control signal from CMD circuit 2404 and the TCK signal input. As seen in FIG. 34, the optional clock multiplexer 1608 may be included in the TCK signal path.

Figure 36:
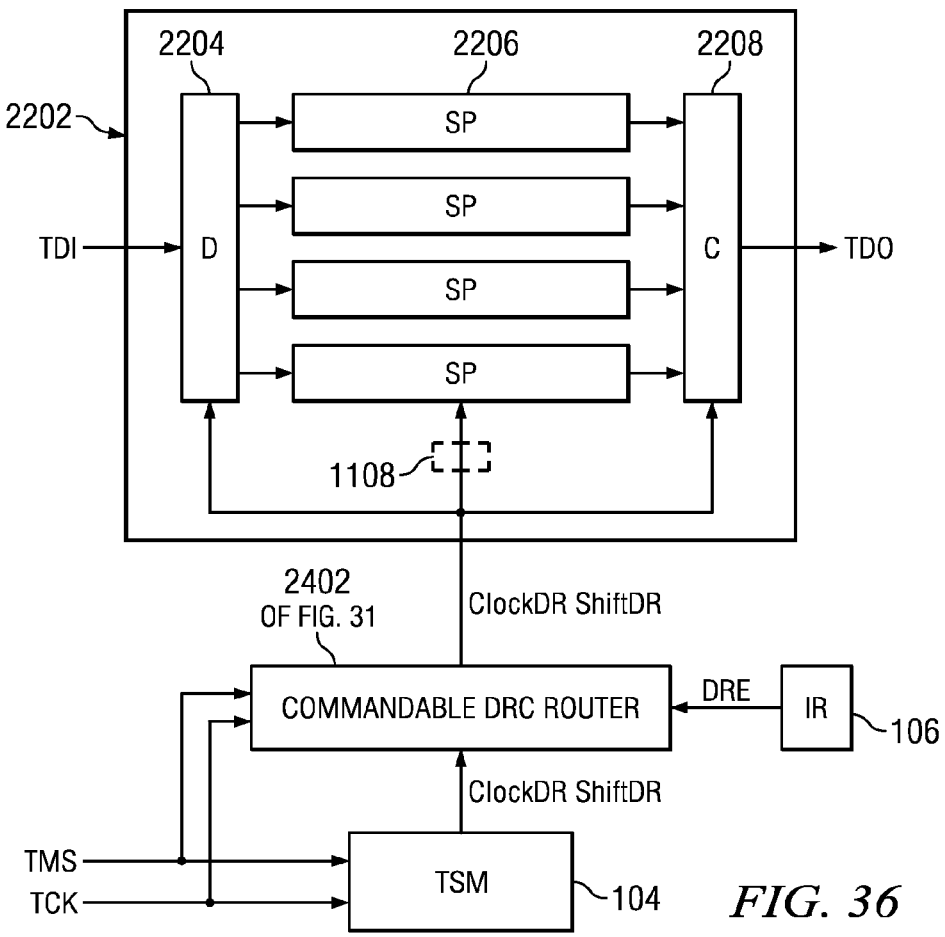
FIG. 36 illustrates a TSM, commandable DRC router and test compression architecture arrangement according to the disclosure.

FIG. 36 illustrates the example test compression architecture (TCA) 2202 of FIG. 22 within a device coupled to a TSM 104 via the commandable DRC router 2402 described in FIGS. 30 and 31.

When commandable DRC router 2402 is enabled by DRE inputs of a first instruction loaded into the instruction register, the commandable DRC router 2402 couples the ClockDR and ShiftDR outputs of TSM 104 to the ClockDR and ShiftDR inputs to the TCA 2202. In response to the first instruction, the TCA operates in response to the TSM ClockDR and ShiftDR signals as described in regard to FIG. 22.

When commandable DRC router 2402 is enabled by DRE inputs of a second instruction loaded into the instruction register, the commandable DRC router 2402 couples the ClockDR output of TSM 104 to the ClockDR input of T2202 and couples the C1 output of CMD circuit 2404 to the ShiftDR input of the TCA.

When the TSM enters the Shift-DR state of FIG. 2, TCKs are output on the ClockDR signal and the C1 control output from the CMD circuit is set to cause the TCA to shift compressed test data into TDI and compressed test data from TDO on the rising edge of the ClockDR signals. Also during the Shift-DR state the Shift input from TSM is asserted to enable the CMD circuit 2404 to input a CMD from TMS in response to the TCK signal. In response to a CMD input, CMD circuit 2404 asserts C1 on the falling edge of TCK to control the ShiftDR signal input to TCA 2202, via multiplexer 3104 and gating circuit 1504, to cause scan paths 2206 to perform a capture operation on the rising edge of ClockDR. Also while C1 is asserted, the ShiftDR signal initializes the decompressor circuit 2204 to receive compressed test data input from TDI. Following the C1 controlled capture and initialization operations, the CMD circuit 2404 de-asserts C1 which sets the ShiftDR signal to cause the decompressor to input compressed test data from TDI and the scan paths 2206 to shift data from TDI to TDO via decompressor circuit 2204 and compactor circuit 2208 on the rising edge of ClockDR. This capture and initialization operation repeats, while the TSM is in the Shift-DR state of FIG. 2, each time a CMD is input to CMD circuit 2404. As can be seen, the second instruction enables the TCA 2202 to cycle through the uninterrupted capture (and initialization) and shift operations of FIG. 25C in response to the C1 control signal from CMD circuit 2404 and the ClockDR signal from the TSM.

Figure 11:
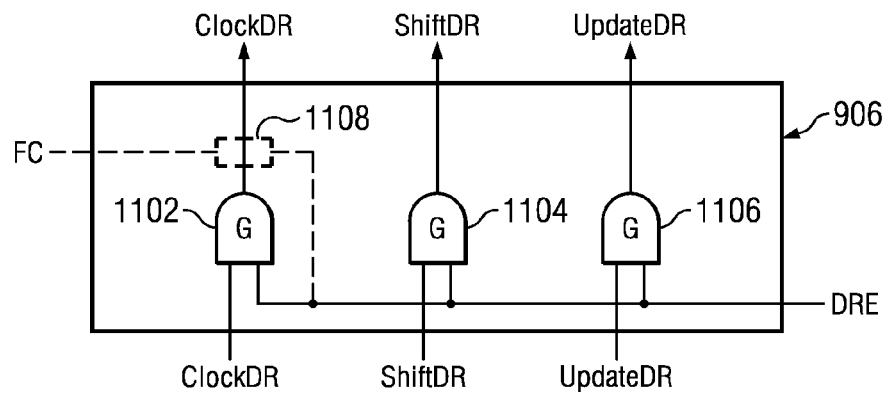
FIG. 11 illustrates the routing circuit of FIG. 9.
Figure 12:
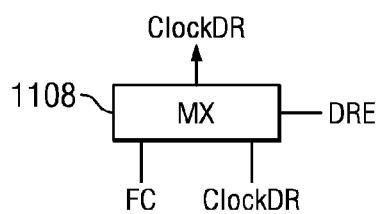
FIG. 12 illustrates a clock multiplexing circuit.

As seen in FIG. 36, clock multiplexer 1108 shown and described in regard to FIGS. 11 and 12 can be included in the ClockDR path to the scan cells of the scan paths 2206 to allow the scan cells to be driven by either the ClockDR signal during test mode or by a FC during non-test mode.

Figure 37:
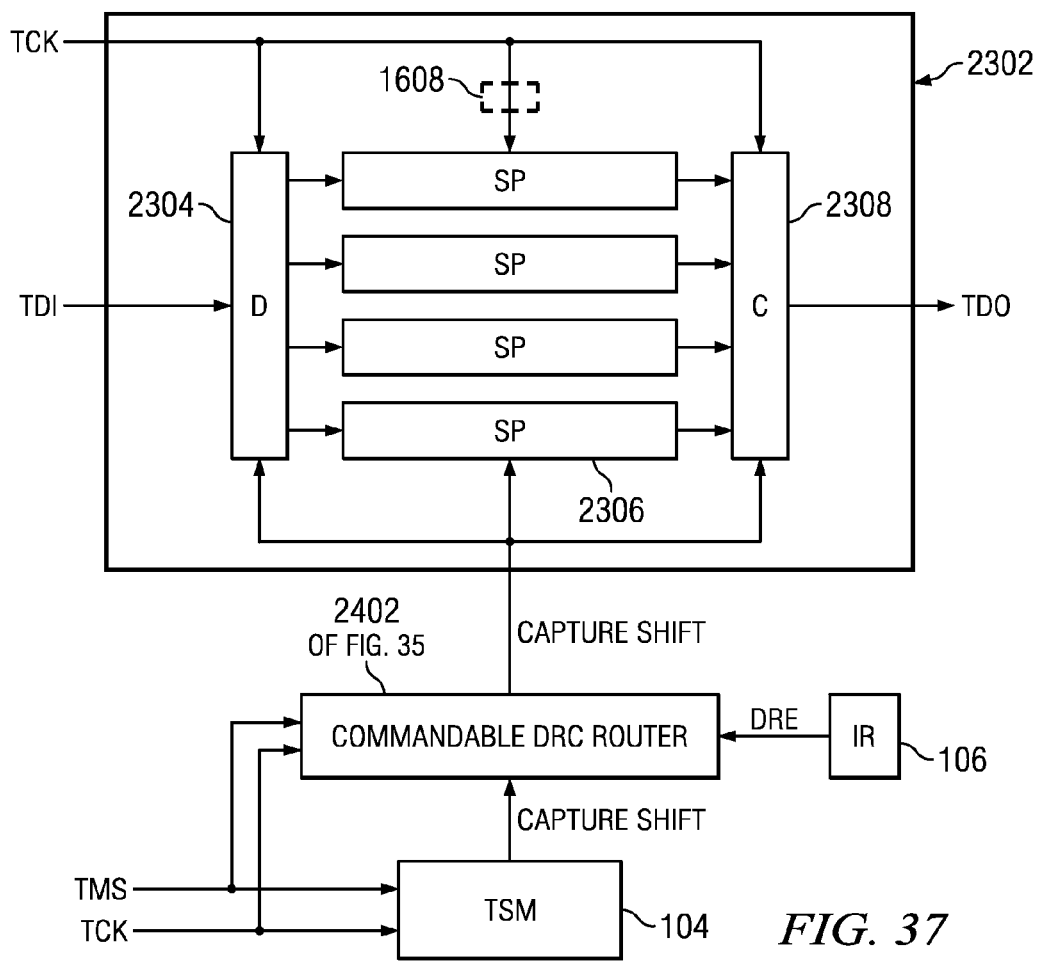
FIG. 37 illustrates an alternate TSM, commandable DRC router and test compression architecture arrangement according to the disclosure.

FIG. 37 illustrates the example test compression architecture (TCA) 2302 of FIG. 23 within a device coupled to a TSM 104 via the commandable DRC router 2402 described in FIGS. 34 and 35.

When commandable DRC router 2402 is enabled by DRE inputs of a first instruction loaded into the instruction register, the commandable DRC router 2402 couples the Capture and Shift outputs of TSM 104 to the Capture and Shift inputs to TCA 2302. In response to the first instruction, the TCA operates in response TCK and the Capture and Shift input signals as described in regard to FIG. 23.

When commandable DRC router 2402 is enabled by DRE inputs of a second instruction loaded into the instruction register, the commandable DRC router 2402 couples the C1 output of CMD circuit 2404 to the Capture input of TCA 2303 via multiplexer 3504 and gating circuit 2102 and to the Shift input of TCA 2302 via multiplexer 3506 and gating circuit 2104.

When the TSM enters the Shift-DR state of FIG. 2, the C1 control output from CMD circuit 2404 is set to cause TCA 2302 to shift in compressed test data from TDI and shift out compressed test data from TDO in response to the rising edge of the free running TCK signal. Also during the Shift-DR state the Shift input from TSM is asserted to enable the CMD circuit 2404 to input a CMD from TMS in response to the TCK signal. In response to a CMD input, CMD circuit 2404 asserts C1 on the falling edge of TCK to control the Capture input to TCA 2302, via multiplexer 3504 and gating circuit 2102, and the Shift input to TCA 2302, via multiplexer 3506 and gating circuit 2104, to cause the scan paths 2306 to perform a capture operation on the rising edge of TCK. Also while C1 is asserted, the Capture signal or the Capture and Shift signals initialize the decompressor circuit 2304 to receive compressed test data input from TDI. Following the C1 controlled capture and initialization operations, the CMD circuit 2404 de-asserts C1 which sets the Capture and Shift signals to cause the decompressor to input compressed test data from TDI and the scan paths 2306 to shift data from TDI to TDO via decompressor circuit 2304 and compactor circuit 2308 on the rising edge of TCK. This capture and initialization operation repeats, while the TSM is in the Shift-DR state of FIG. 2, each time a CMD is input to CMD circuit 2404. As can be seen, the second instruction enables the TCA 2302 to cycle through the uninterrupted capture (and initialization)

and shift operations of FIG. 25C in response to the C1 control signal from CMD circuit 2404 and the TCK signal.

As seen in FIG. 37, clock multiplexer 1608 shown and described in regard to FIGS. 16 and 19 can be included in the TCK path to the scan cells of scan paths 2306 to allow the scan cells to be driven by either the TCK signal during test mode or by a FC during non-test mode.

While the above descriptions of FIGS. 24-37 have described commandable DRC routers 2402 that use a first instruction to enable conventional access to data registers and TCAs using the TSM and a second instruction to enable commanded access to data registers and TCAs using the CMD circuit, commandable DRC routers 2402 are not limited to providing both TSM and CMD circuit access to data registers and TCAs. According to the disclosure and described below, commandable DRC routers 2402 may be realized that only use the second instruction to enable the CMD circuit for commanded access to data registers and TCAs.

Figure 38:
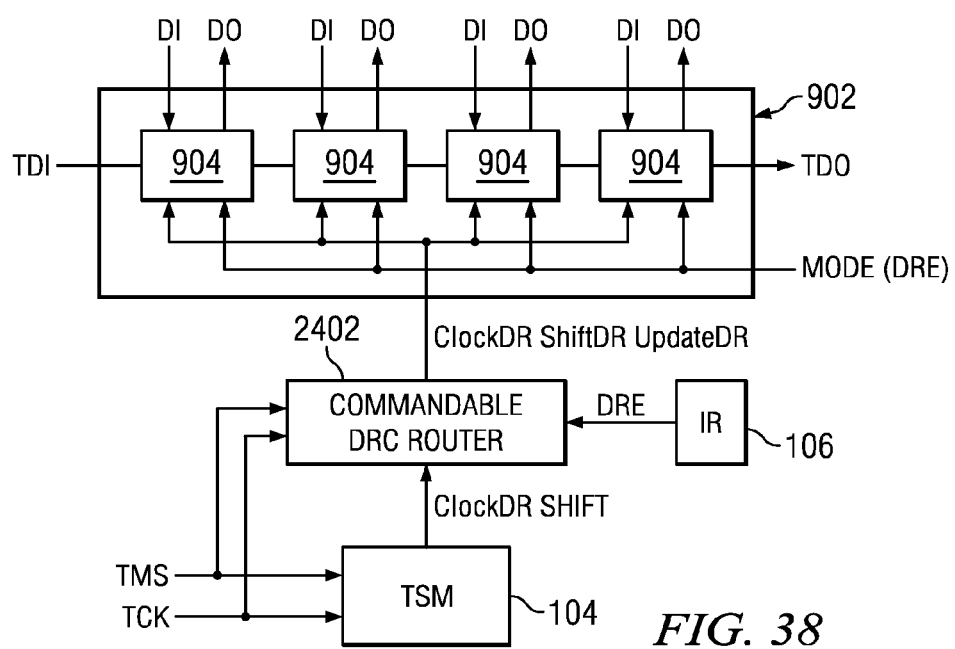
FIG. 38 illustrates an alternate TSM, commandable DRC router and data register arrangement according to the disclosure.

FIG. 38 illustrates the previously described FIG. 9 asynchronous CSU data register 902 coupled to TSM 104 via a commandable DRC router 2402. The commandable DRC router, when enabled by DRE inputs of the second instruction mentioned in regard to FIGS. 28 and 29, allows the CMD circuit 2404 within the commandable DRC router 2402 to control scan access to the data register 902.

Figure 39:
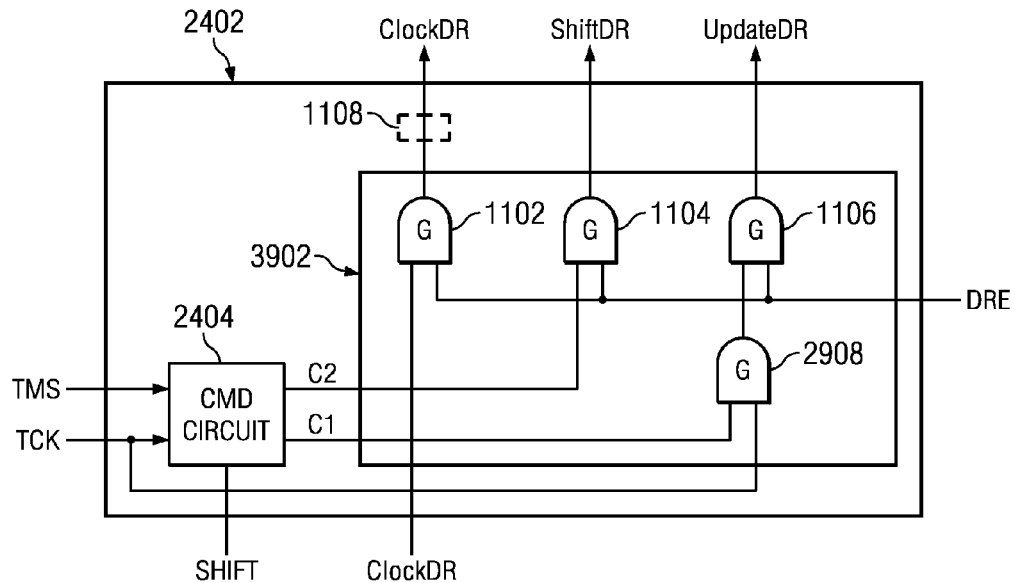
FIG. 39 illustrates the commandable DRC router of FIG. 38.

FIG. 39 illustrates the commandable DRC router 2402 of FIG. 38 which comprises a CMD circuit 2404 and a routing circuit 3902. The CMD circuit 2404 could be, but not limited to, any of the CMD circuits of FIGS. 27A-27C. The routing circuit 3902 of FIG. 39 is similar to the routing circuit 2902 of FIG. 29 with the exception that it does not include multiplexers 2904 and 2906 to provide TSM control of the ShiftDR and UpdateDR signal inputs to data register 902. As seen the routing circuit 3902 comprises gating circuits 1102, 1104, 1106 and 2908 of FIG. 29, all connected as shown.

In response to the above mentioned second instruction, DRE inputs couple the ClockDR output from the TSM to the ClockDR input of the data register via gating circuit 1102 and optional clock multiplexer 1108 (if included), the C2 output of the CMD circuit 2404 to the ShiftDR input of the data register via gating circuit 1104 and the C1 output of the CMD circuit to the UpdateDR input of the data register via gating circuits 1106 and 2908.

When the TSM enters the Shift-DR state of FIG. 2 TCKs are output on the TSM ClockDR signal and the C1 and C2 control outputs from the CMD circuit are set to cause the data register to shift data from TDI to TDO on the rising edge of the ClockDR signals. Also during the Shift-DR state the Shift input from TSM is asserted to enable the CMD circuit 2404 to input a CMD from TMS in response to the TCK signal. In response to a CMD input, CMD circuit 2404 operates the C1 and C2 signals to control the UpdateDR and ShiftDR data register inputs to cause the data register 902 to perform update and capture operations as described by the second instruction of FIGS. 28 and 29. The update and capture operations repeat, while the TSM is in the Shift-DR state of FIG. 2, each time a CMD is input to CMD circuit 2404. As can be seen, the second instruction enables the data register 902 to cycle through the uninterrupted update, capture and shift operations of FIG. 25B in response to the C1 and C2 control signals from CMD circuit 2404 and the ClockDR signal from the TSM.

Figure 40:
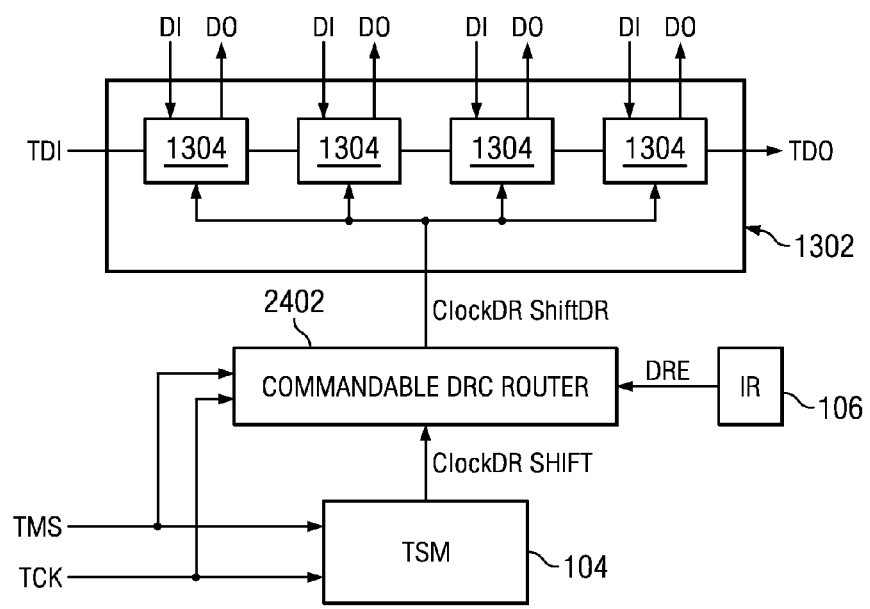
FIG. 40 illustrates a TSM, commandable DRC router and data register arrangement according to the disclosure.

FIG. 40 illustrates the previously described FIG. 13 asynchronous CS data register 1302 coupled to TSM 104 via a commandable DRC router 2402. The commandable DRC router, when enabled by DRE inputs of the second instruction mentioned in regard to FIGS. 30 and 31, allows the CMD circuit 2404 within the commandable DRC router 2402 to control scan access to the data register 1302.

Figure 41:
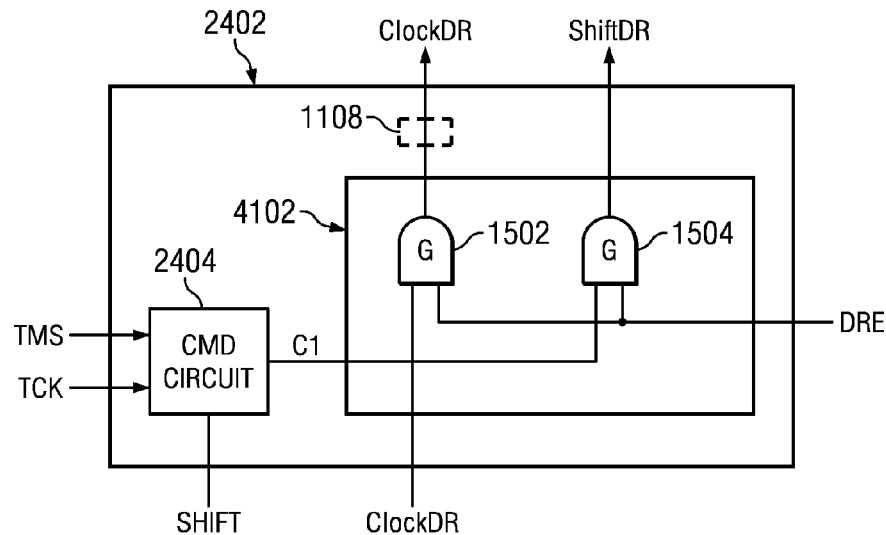
FIG. 41 illustrates the commandable DRC router of FIG. 40.

FIG. 41 illustrates the commandable DRC router 2402 of FIG. 40 which comprises a CMD circuit 2404 and a routing circuit 4102. The CMD circuit 2404 could be, but not limited to, any of the CMD circuits of FIGS. 27A-27C. The routing circuit 4102 of FIG. 41 is similar to the routing circuit 3102 of FIG. 31 with the exception that it does not include multiplexer 3104 to provide TSM control of the ShiftDR signal input to data register 1302. As seen the routing circuit 4102 comprises gating circuits 1502 and 1504 of FIG. 31, all connected as shown.

In response to the above mentioned second instruction, DRE inputs couple the ClockDR output from the TSM to the ClockDR input of the data register via gating circuit 1502 and optional clock multiplexer 1108 (if included) and the C1 output of the CMD circuit 2404 to the ShiftDR input of the data register via gating circuit 1504.

When the TSM enters the Shift-DR state of FIG. 2, TCKs signals are output on the TSM ClockDR signal and the C1 control output from the CMD circuit is set to cause the data register to shift data from TDI to TDO on the rising edge of the ClockDR signals. Also during the Shift-DR state the Shift input from TSM is asserted to enable the CMD circuit 2404 to input a CMD from TMS in response to the TCK signal. In response to a CMD input, CMD circuit 2404 operates the C1 signal to control the ShiftDR data register input to cause the data register 1302 to perform a capture operation as described by the second instruction of FIGS. 30 and 31. The capture operation repeats, while the TSM is in the Shift-DR state of FIG. 2, each time a CMD is input to CMD circuit 2404. As can be seen, the second instruction enables the data register 1302 to cycle through the uninterrupted capture and shift operations of FIG. 25c in response to the C1 control signal from CMD circuit 2404 and the ClockDR signal from the TSM.

Figure 42:
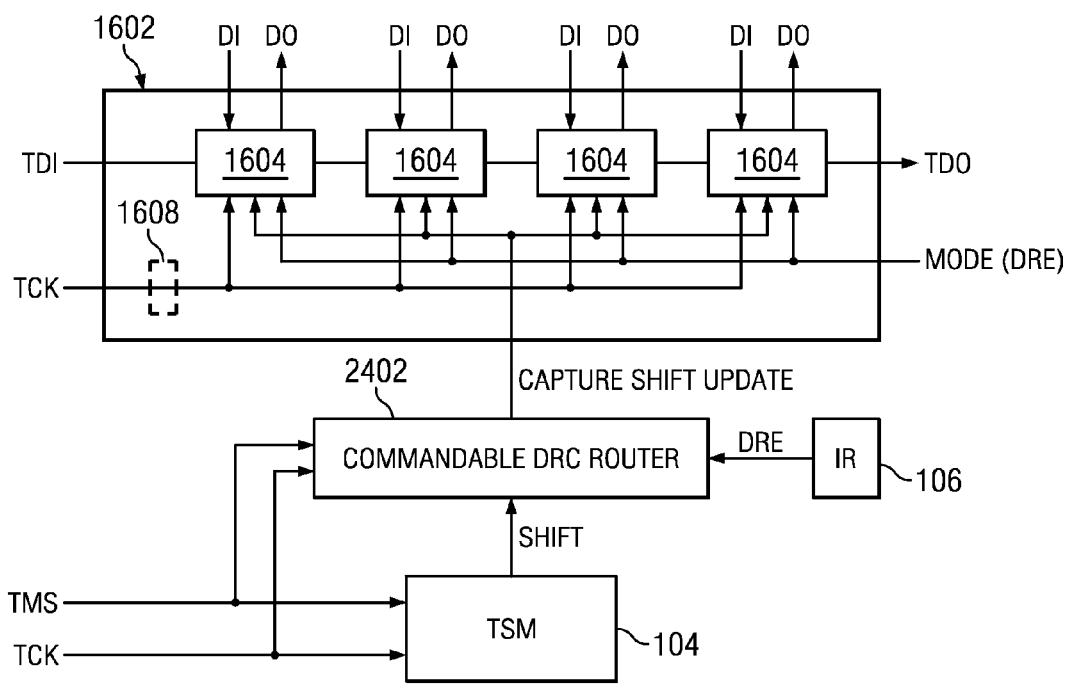
FIG. 42 illustrates a TSM, commandable DRC router and data register arrangement according to the disclosure.

FIG. 42 illustrates the previously described FIG. 16 synchronous CSU data register 1602 coupled to TSM 104 via a commandable DRC router 2402. The commandable DRC router, when enabled by DRE inputs of the second instruction mentioned in regard to FIGS. 32 and 33, allows the CMD circuit 2404 within the commandable DRC router 2402 to control scan access to the data register 1602.

Figure 43:
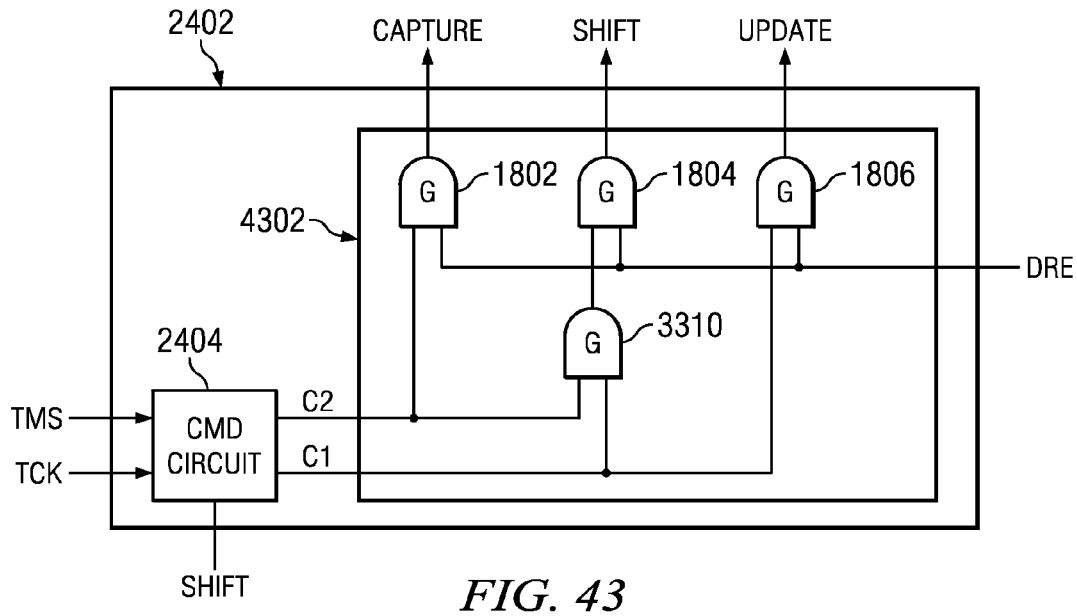
FIG. 43 illustrates the commandable DRC router of FIG. 42.

FIG. 43 illustrates the commandable DRC router 2402 of FIG. 42 which comprises a CMD circuit 2404 and a routing circuit 4302. The CMD circuit 2404 could be, but not limited to, any of the CMD circuits of FIGS. 27A-27C. The routing circuit 4302 of FIG. 43 is similar to the routing circuit 3302 of FIG. 33 with the exception that it does not include multiplexers 3304, 3306 and 3308 to provide TSM control of the Capture, Shift and Update signal inputs to data register 1602. As seen the routing circuit 4302 comprises gating circuits 1802, 1804, 1806 and 3310 of FIG. 33, all connected as shown.

In response to the above mentioned second instruction, DRE inputs couple the C2 output from the CMD circuit to the Capture input of the data register via gating circuit 1802 and to the Shift input of the data register via gating circuits 3310 and 1804. The DRE inputs also couple the C1 output of the CMD circuit to the Shift input of the data register via gating circuits 3310 and 1804 and to the Update input of the data register via gating circuit 1806.

When the TSM enters the Shift-DR state of FIG. 2 the C1 and C2 control outputs from the CMD circuit are set to cause the data register to shift data from TDI to TDO on the rising edge of the TCK signal. Also during the Shift-DR state the Shift input from TSM is asserted to enable the CMD circuit 2404 to input a CMD from TMS in response to the TCK signal. In response to a CMD input, CMD circuit 2404 operates the C1 and C2 signals to control the Capture, Shift and Update data register inputs to cause the data register 1602 to perform update and capture operations as described by the second instruction of FIGS. 32 and 33. The update and capture operations repeat, while the TSM is in the Shift-DR state of FIG. 2, each time a CMD is input to CMD circuit 2404. As can be seen, the second instruction enables the data register 1902 to cycle through the uninterrupted update, capture and shift operations of FIG. 25B in response to the C1 and C2 control signals from CMD circuit 2404 on the rising edge of the TCK signal. As seen in FIG. 42, the optional clock multiplexer 1608 may be included in the TCK signal path.

Figure 44:
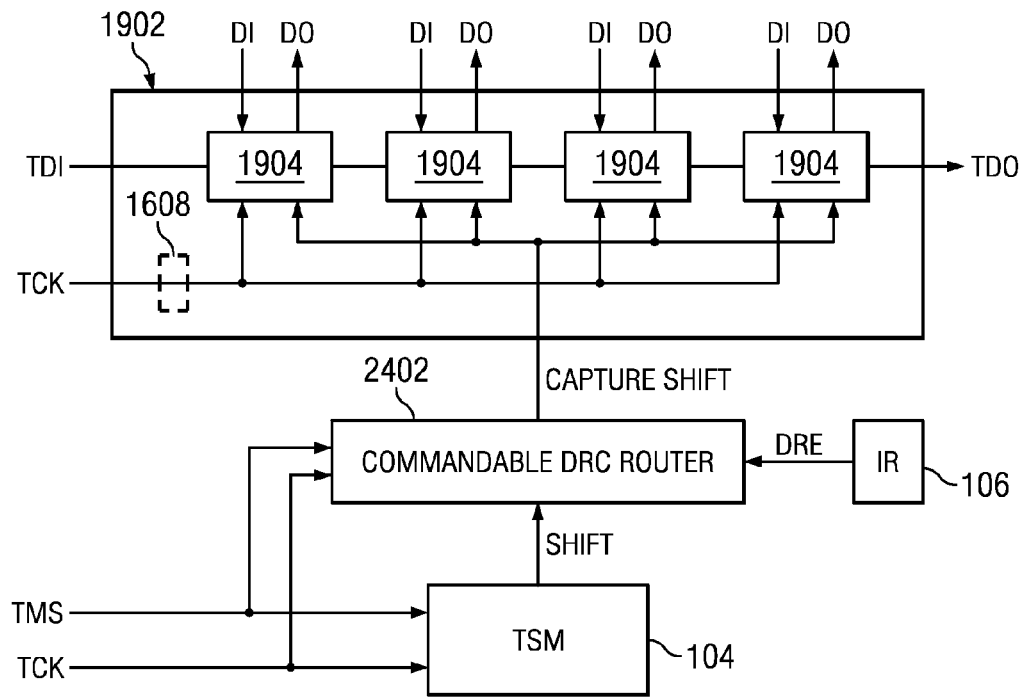
FIG. 44 illustrates a TSM, commandable DRC router and data register arrangement according to the disclosure.

FIG. 44 illustrates the previously described FIG. 19 synchronous CS data register 1902 coupled to TSM 104 via a commandable DRC router 2402. The commandable DRC router, when enabled by DRE inputs of the second instruction mentioned in regard to FIGS. 34 and 35, allows the CMD circuit 2404 within the commandable DRC router 2402 to control scan access to the data register 1902.

Figure 45:
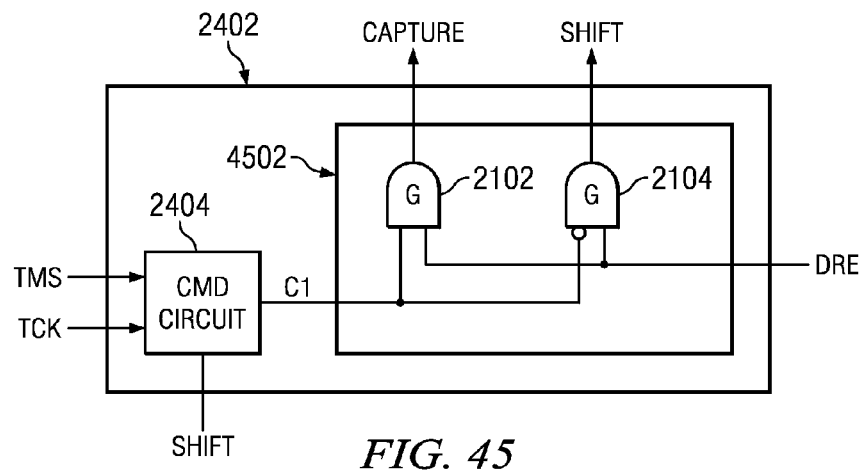
FIG. 45 illustrates the commandable DRC router of FIG. 44.

FIG. 45 illustrates the commandable DRC router 2402 of FIG. 44 which comprises a CMD circuit 2404 and a routing circuit 4502. The CMD circuit 2404 could be, but not limited to, any of the CMD circuits of FIGS. 27A-27C. The routing circuit 4502 of FIG. 45 is similar to the routing circuit 3502 of FIG. 35 with the exception that it does not include multiplexers 3504 and 3506 to provide TSM control of the Capture and Shift signal inputs to data register 1902. As seen the routing circuit 4402 comprises gating circuits 2102 and 2104 of FIG. 35, all connected as shown.

In response to the above mentioned second instruction, DRE inputs couple the C1 output from the CMD circuit to the Capture input of the data register via gating circuit 2102 and to the Shift input of the data register via gating circuit 2104. When the TSM enters the Shift-DR state of FIG. 2 the C1 control output from the CMD circuit is set to cause the data register to shift data from TDI to TDO on the rising edge of the TCK signal. Also during the Shift-DR state the Shift input from TSM is asserted to enable the CMD circuit 2404 to input a CMD from TMS in response to the TCK signal. In response to a CMD input, CMD circuit 2404 operates the C1 control signal to control the Capture and Shift data register inputs to cause the data register 1902 to perform capture and shift operations as described by the second instruction of FIGS. 34 and 35. The capture operation repeats, while the TSM is in the Shift-DR state of FIG. 2, each time a CMD is input to CMD circuit 2404. As can be seen, the second instruction enables the data register 1902 to cycle through the uninterrupted capture and shift operations of FIG. 25C in response to the C1 control signal from CMD circuit 2404 on the rising edge of the TCK signal. As seen in FIG. 44, the optional clock multiplexer 1608 may be included in the TCK signal path.

Figure 46:
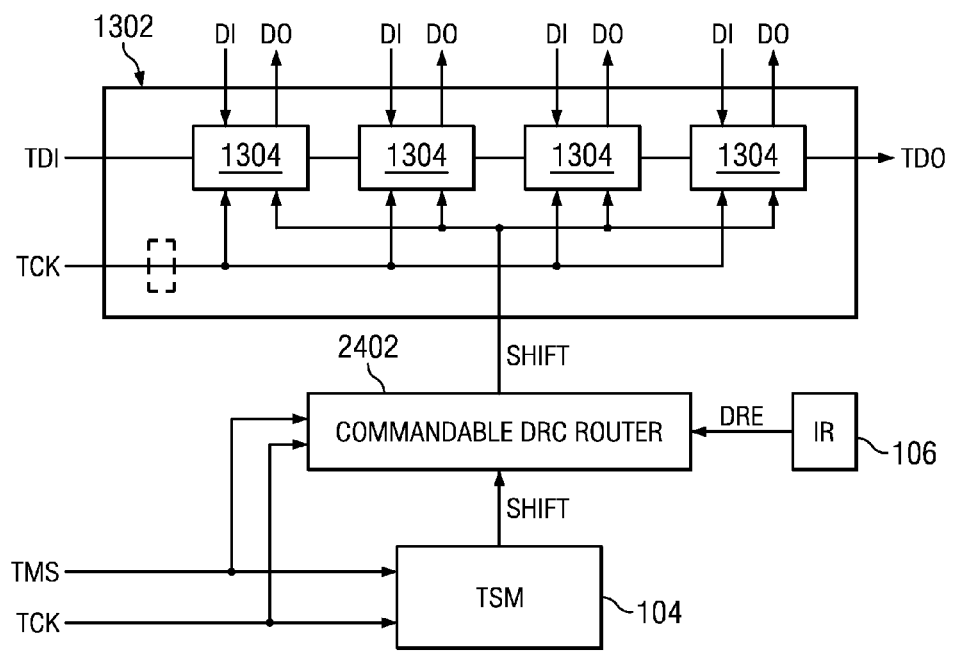
FIG. 46 illustrates a TSM, commandable DRC router and data register arrangement according to the disclosure.

FIG. 46 illustrates the CS data register 1302 of FIG. 13 coupled to TSM 104 via a commandable DRC router 2402. The only difference between the data register 1302 of FIG. 13 and data register 1302 of FIG. 46 is that the scan cells 1304, re-shown in FIG. 47 for convenience, are coupled to the free running TCK signal instead of the gated ClockDR signal of FIG. 13. The commandable DRC router, when enabled by DRE inputs of an instruction allows the CMD circuit 2404 within the commandable DRC router 2402 to control scan access to the data register 1302.

Figure 48:
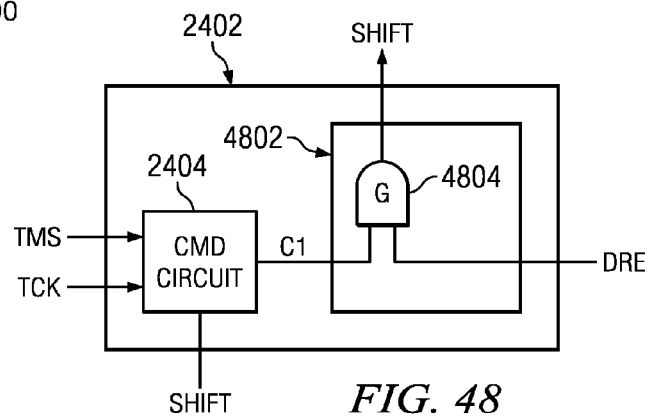
FIG. 48 illustrates the commandable DRC router of FIG. 46.

FIG. 48 illustrates the commandable DRC router 2402 of FIG. 46 which comprises a CMD circuit 2404 and a routing circuit 4802. The CMD circuit 2404 could be, but not limited too, any of the CMD circuits of FIGS. 27A-27C. The routing circuit 4802 of FIG. 48 comprises gating circuit 4804, which simply couples, in response to DRE input, the C1 control output from CMD circuit 2404 to the Shift input of data register 1302.

In response to the above mentioned instruction, DRE inputs couple the C1 output from the CMD circuit to the Shift input of the data register via gating circuit 4804. When the TSM enters the Shift-DR state of FIG. 2 the C1 control output from the CMD circuit is set to cause the data register to shift data from TDI to TDO on the rising edge of the TCK signal. Also during the Shift-DR state the Shift input from TSM is asserted to enable the CMD circuit 2404 to input a CMD from TMS in response to the TCK signal. In response to a CMD input, CMD circuit 2404 operates the C1 control signal to control the Shift input to the data register to cause the data register to perform a capture operation then sets the C1 control signal to cause the data register to resume the shift operation. The capture operation repeats, while the TSM is in the Shift-DR state of FIG. 2, each time a CMD is input to CMD circuit 2404. As can be seen, the instruction enables the data register 1302 to cycle through the uninterrupted capture and shift operations of FIG. 25C in response to the C1 control signal from CMD circuit 2404 on the rising edge of the TCK signal. As seen in FIG. 46, the optional clock multiplexer 1608 may be included in the TCK signal path.

Figure 49:
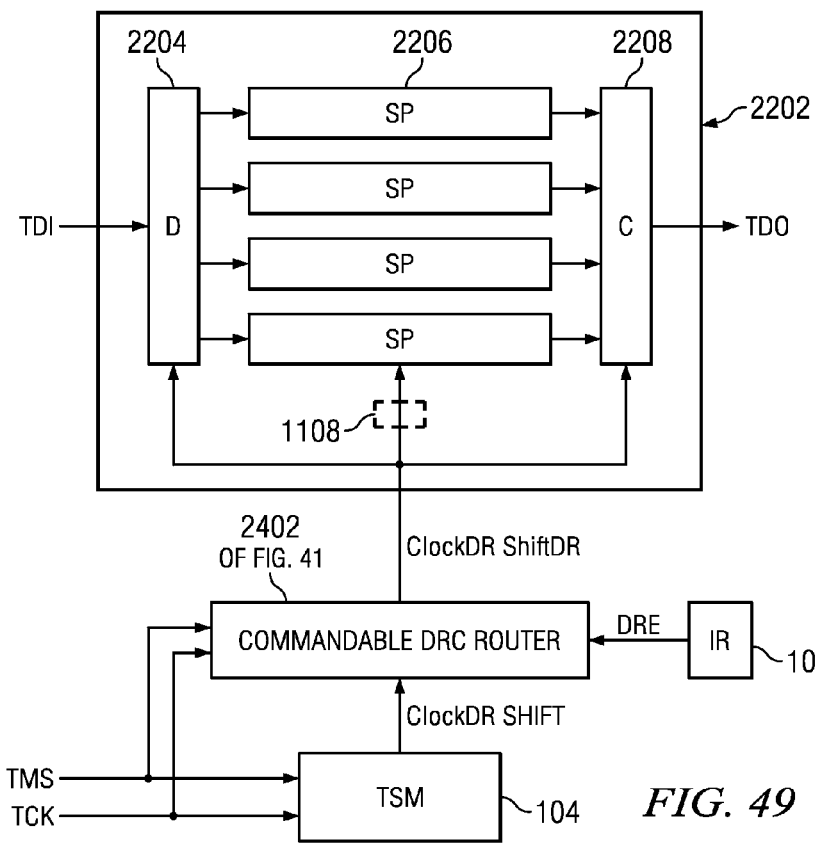
FIG. 49 illustrates a TSM, commandable DRC router and test compression architecture arrangement according to the disclosure.

FIG. 49 illustrates the TCA 2202 of FIG. 36 coupled to TSM 104 via the commandable DRC router 2402 of FIG. 41. The commandable DRC router, when enabled by DRE inputs of the second instruction mentioned in regard to FIG. 36, allows the CMD circuit 2404 within the commandable DRC router 2402 to control scan access to the TCA 2202.

In response to the above mentioned second instruction, DRE inputs couple the ClockDR output from the TSM to the ClockDR input of the TCA via gating circuit 1502 and optional clock multiplexer 1108 (if included) and the C1 output of the CMD circuit 2404 to the ShiftDR input of the TCA via gating circuit 1504.

When the TSM enters the Shift-DR state of FIG. 2, TCKs signals are output on the TSM ClockDR signal and the C1 control output from the CMD circuit is set to cause the TCA to shift data from TDI to TDO on the rising edge of the ClockDR signals. Also during the Shift-DR state the Shift input from TSM is asserted to enable the CMD circuit 2404 to input a CMD from TMS in response to the TCK signal. In response to a CMD input, CMD circuit 2404 operates the C1 signal to control the ShiftDR input to cause the TCA to perform capture and initialization operations as described by the second instruction of FIG. 36. The capture and initialization operations repeat, while the TSM is in the Shift-DR state of FIG. 2, each time a CMD is input to CMD circuit 2404. As can be seen, the second instruction enables the TCA to cycle through the uninterrupted capture/initialize and shift operations of FIG. 25c in response to the C1 control signal from CMD circuit 2404 and the ClockDR signal from the TSM.

FIG. 50 illustrates the TCA 2302 of FIG. 37 coupled to TSM 104 via the commandable DRC router 2402 of FIG. 45. The commandable DRC router, when enabled by DRE inputs of the second instruction mentioned in regard to FIG. 37, allows the CMD circuit 2404 within the commandable DRC router 2402 to control scan access to the TCA 2302.

In response to the above mentioned second instruction, DRE inputs couple the C1 output from the CMD circuit 2404 to the Capture input of the TCA via gating circuit 2102 and to the Shift input of the TCA via gating circuit 2104.

When the TSM enters the Shift-DR state of FIG. 2, the C1 control output from the CMD circuit is set to cause the TCA to shift data from TDI to TDO on the rising edge of the TCK signal. Also during the Shift-DR state the Shift input from TSM is asserted to enable the CMD circuit 2404 to input a CMD from TMS in response to the TCK signal. In response to a CMD input, CMD circuit 2404 operates the C1 signal to control the Capture and Shift inputs to cause the TCA to perform a capture and initialization operation as described by the second instruction of FIG. 37. The capture and initialization operation repeats, while the TSM is in the Shift-DR state of FIG. 2, each time a CMD is input to CMD circuit 2404. As can be seen, the second instruction enables the TCA to cycle through the uninterrupted capture/initialize and shift operations of FIG. 25*c* in response to the C1 control signal from CMD circuit 2404 and the TCK signal.

Figure 47:
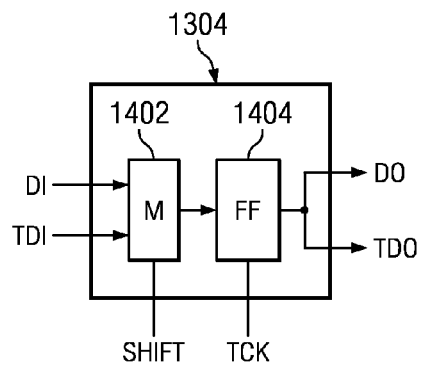
FIG. 47 illustrates the scan cells of the data register of FIG. 46.

FIG. 51 illustrates a TCA 5102 comprising the decompressor circuit 2304 of FIG. 50, the compactor circuit 2308 of FIG. 50 and a parallel group of scan paths 1302 of FIG. 46 all connected as shown. The scan paths 1302 comprise scan cells 1304 as shown in FIG. 47. The TCA 5102 is coupled to TSM 104 via the commandable DRC router 2402 of FIG. 48. The commandable DRC router, when enabled by DRE inputs from an instruction, allows the CMD circuit 2404 within the commandable DRC router 2402 to control scan access to the TCA 5102. In response to the instruction, DRE inputs couple the C1 output from the CMD circuit 2404 to the Shift input of the TCA via gating circuit 4804.

When the TSM enters the Shift-DR state of FIG. 2, the C1 control output from the CMD circuit is set to cause the TCA to shift data from TDI to TDO on the rising edge of the TCK signal. Also during the Shift-DR state the Shift input from TSM is asserted to enable the CMD circuit 2404 to input a CMD from TMS in response to the TCK signal. In response to a CMD input, CMD circuit 2404 operates the C1 signal to control the Shift input causing the TCA to perform a capture and initialization operation as described by the second instruction of FIG. 37. Following the capture and initialization operation, C1 is set to cause the TCA to resume shifting data from TDI to TDO. The capture and initialization operation repeats, while the TSM is in the Shift-DR state of FIG. 2, each time a CMD is input to CMD circuit 2404. As can be seen, the instruction enables the TCA to cycle through the uninterrupted capture/initialize and shift operations of FIG. 25*c* in response to the C1 control signal from CMD circuit 2404 and the TCK signal. As seen, the TCA 5102 may include the clock multiplexer 1608 in the TCK path to the scan paths 1302.

While the TCA 5102 of FIG. 51 is shown being clocked by the TCK signal, it could be clocked by the ClockDR signal from the TSM as well by placing a ClockDR gating circuit 1502 in the routing circuit 4802 of the commandable DRC router 2402 of FIG. 48.

Figure 52:
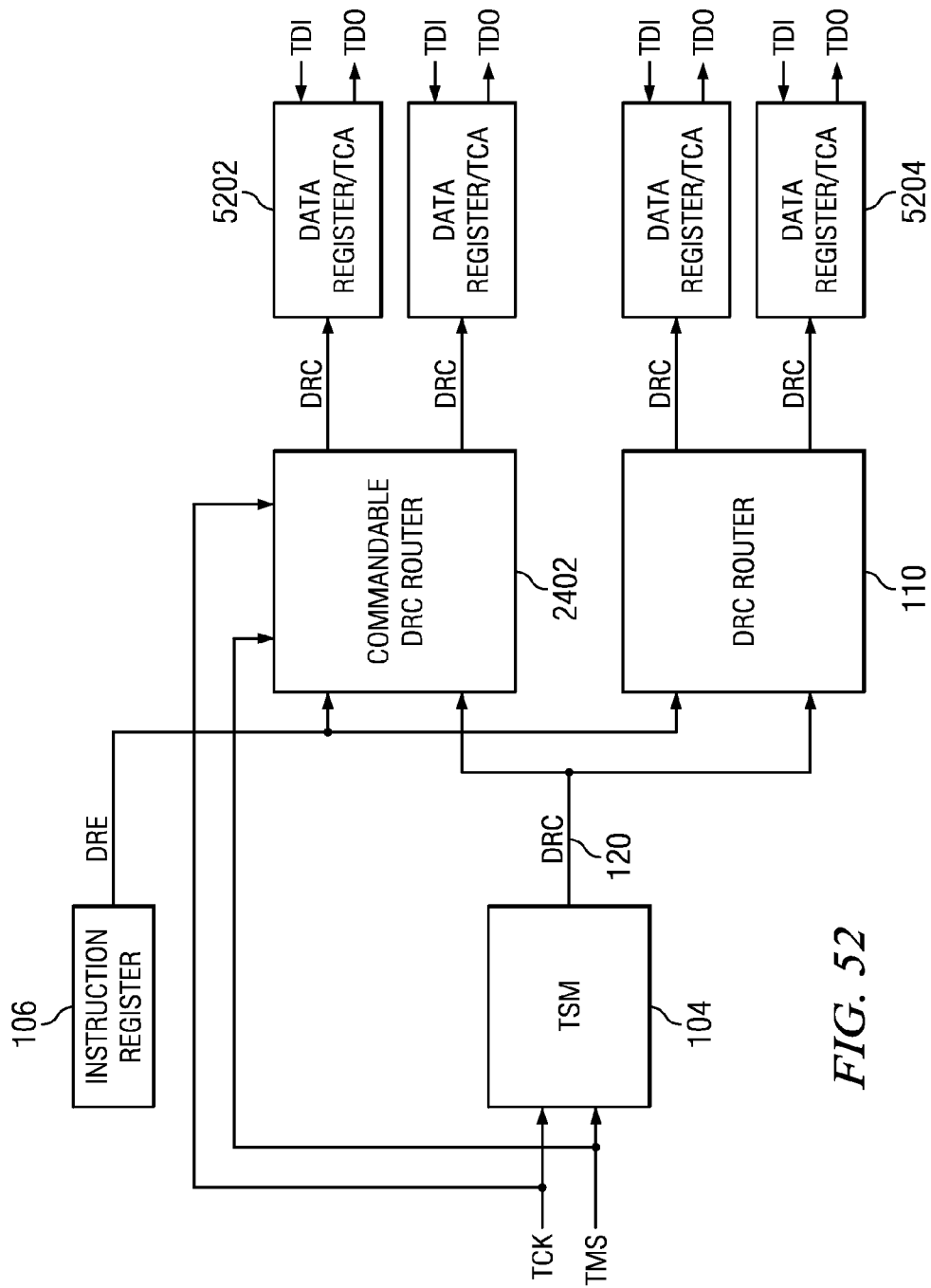
FIG. 52 illustrates a Tap architecture containing both a DRC router and a commandable DRC router according to the disclosure.

FIG. 52 is provided to illustrate that both a commandable DRC router 2402 and a conventional DRC router 110 may be used in a device to control separate groups of data registers or TCAs 5202 and 5204. In response to the DRE outputs of a first instruction the conventional DRC router 110 is enabled to allow the TSM 104 to control a selected data register or TCA of group 5204 as previously described. In response to the DRE outputs of a second instruction the commandable DRC router 2402 is enabled to allow the CMD circuit 2404 to control a selected data register or TCA of group 5202 as previously described.

Figure 53A:
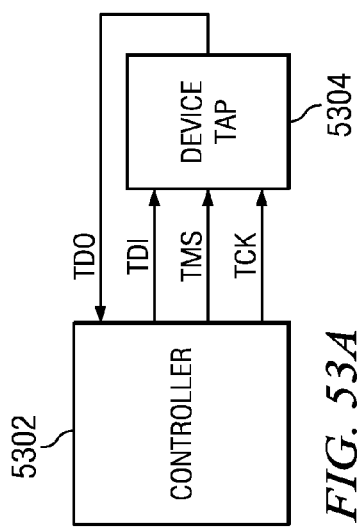
FIG. 53A illustrates a device with a conventional Tap connected to a controller.
Figure 53B:
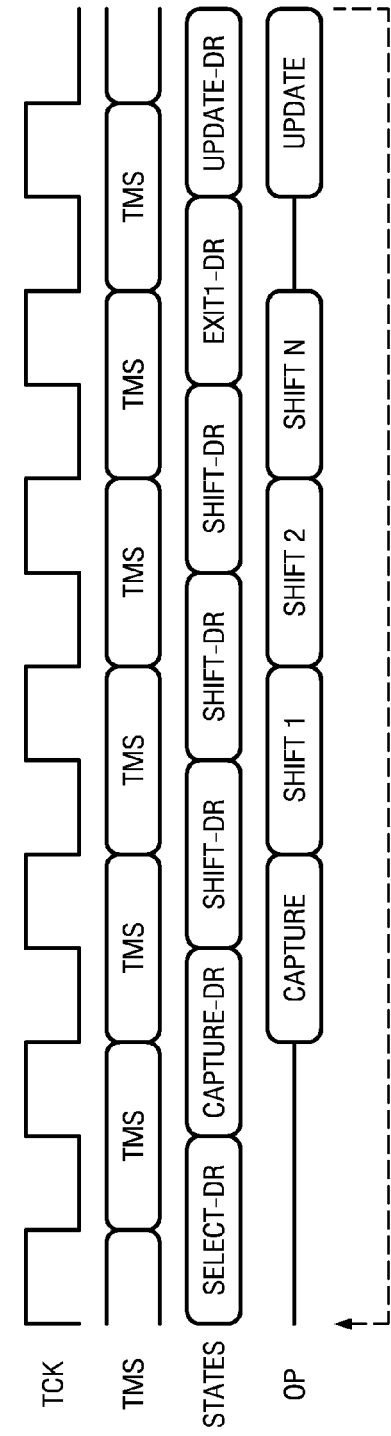
FIG. 53B illustrates the conventional Tap of FIG. 53A performing an update, capture and shift operation.

FIG. 53A illustrates a controller 5302 coupled to a device 5304 for conventionally accessing a CSU type data register of the device (such as the boundary scan register) using the TSM 104. As seen in timing diagram of FIG. 53B, the controller cycles the TSM through the states of FIG. 2 to perform Capture, Shift and Update operations. As seen in FIG. 53B, the TSM controlled Update operation is delayed by one and one half TCKs after the last Shift (Shift N) operation. Also as seen in FIG. 53B, the TSM controlled Capture operation is delayed by two and one half TCKs after the Update operation. As mentioned earlier, delaying the Capture operation by two and one half TCKs prevents being able to test for timing sensitive circuit delay faults in a device. This is a well known problem of using the TSM to control CSU data registers.

Figure 54A:
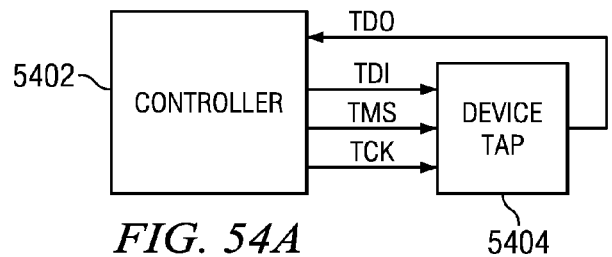
FIG. 54A illustrates a device with a commandable Tap connected to a controller according to the disclosure.
Figure 54B:
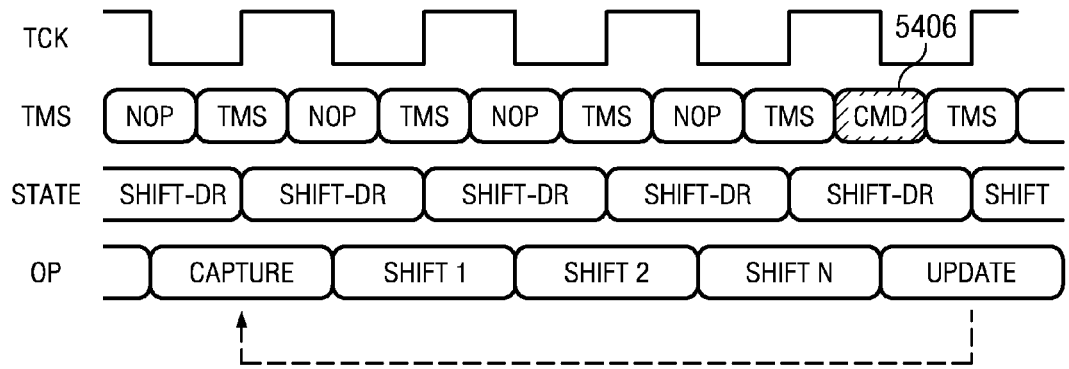
FIG. 54B illustrates the commandable Tap of FIG. 54A performing an update, capture and shift operation according to the disclosure.

FIG. 54A illustrates a controller 5402 coupled to a device 5404 for accessing a CSU type data register of the device (such as the boundary scan register) using the CMD circuit 2404 of the commandable DRC router 2402 of the present disclosure. As seen in timing diagram of FIG. 54B, the controller transitions the TSM into the Shift-DR state of FIG. 2 then inputs a CMD 5406 on TMS at an appropriate time to perform an Update and Capture operation then resumes the Shift operation. This CMD input cycle repeats while the TSM is in the Shift-DR state. As seen in FIG. 54B, the CMD controlled Update operation occurs on the next TCK following the last shift (Shift N) operation. Also as seen in FIG. 54B, the CMD controlled Capture operation occurs on the next TCK following the Update operation. Thus the CMD controlled method of the disclosure overcomes the testing limitation of the TSM control method of FIGS. 53A and 53B and enables CSU data registers to test for timing sensitive circuit delay faults in a device.

Figure 55A:
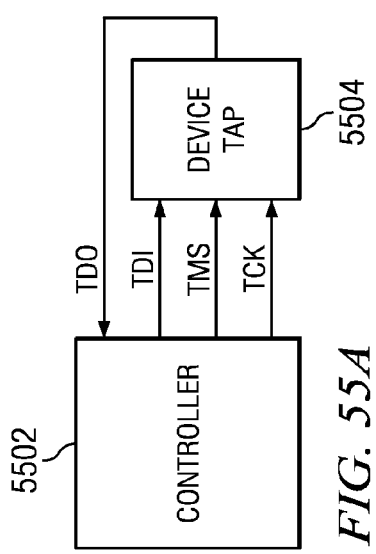
FIG. 55A illustrates a device with a conventional Tap connected to a controller.
Figure 55B:
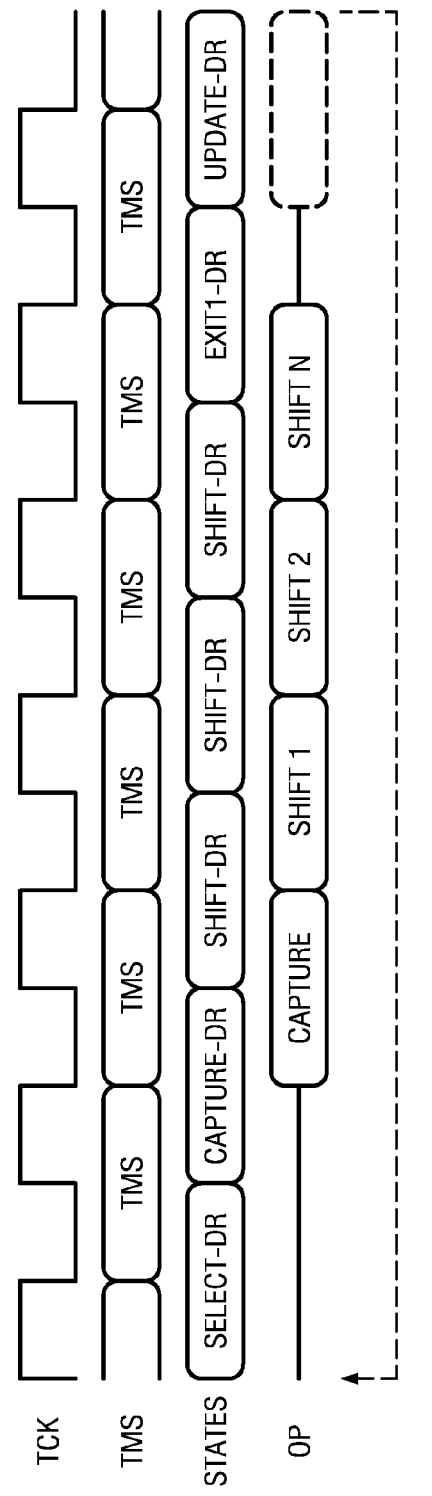
FIG. 55B illustrates the conventional Tap of FIG. 55A performing a capture and shift operation.

FIG. 55A illustrates a controller 5502 coupled to a device 5504 for conventionally accessing a CS type data register of the device (such as a scan path register) using the TSM 104. As seen in timing diagram of FIG. 55B, the controller cycles the TSM through the states of FIG. 2 to perform Capture and Shift operations. As seen in FIG. 55B, the TSM controlled Capture operation is delayed by four TCKs after the last Shift (Shift-N) operation. Delaying the Capture operation by four TCKs prevents being able to test for timing sensitive circuit delay faults in a device. This is a well known problem of using the TSM to control CS data registers.

Figure 56A:
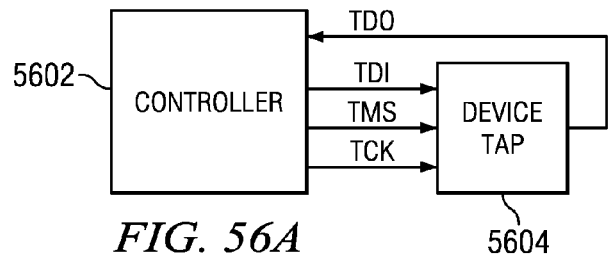
FIG. 56A illustrates a device with a commandable Tap connected to a controller according to the disclosure.
Figure 56B:
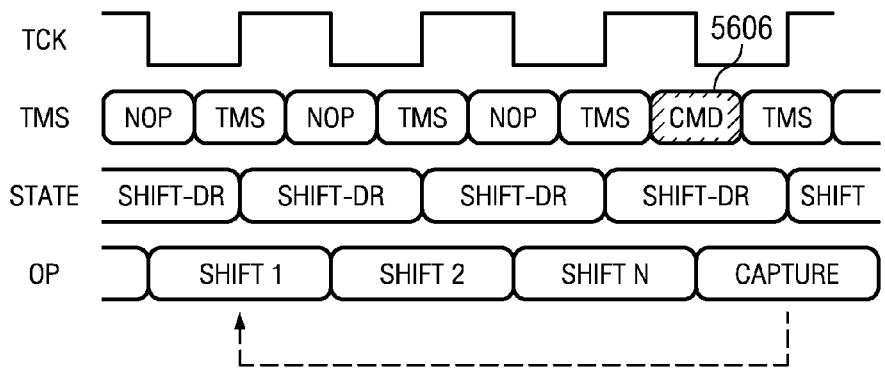
FIG. 56B illustrates the commandable Tap of FIG. 56A performing a capture and shift operation according to the disclosure.

FIG. 56A illustrates a controller 5602 coupled to a device 5604 for accessing a CS type data register of the device (such as a scan path register) using the CMD circuit 2404 of the commandable DRC router 2402 of the present disclosure. As seen in timing diagram of FIG. 56B, the controller transitions the TSM into the Shift-DR state of FIG. 2 then inputs a CMD 5606 on TMS at an appropriate time to perform a Capture operation then resumes the Shift operation. This CMD input cycle repeats while the TSM is in the Shift-DR state. As seen in FIG. 56B, the CMD controlled Capture operation occurs on the next TCK following the last shift (Shift N) operation. Thus the CMD controlled method of the disclosure overcomes the testing limitation of the TSM control method of FIGS. 55A and 55B and enables CS data registers to test for timing sensitive circuit delay faults in a device.

Figure 57A:
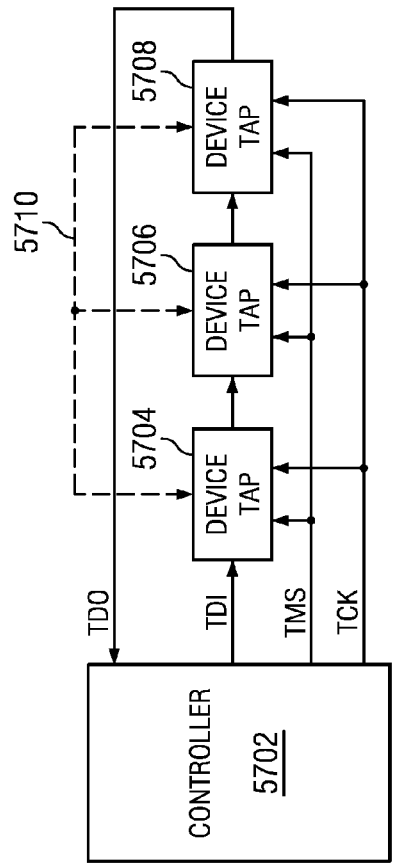
FIG. 57A illustrates a daisy chain of devices with conventional Taps connected to a controller.
Figure 57B:
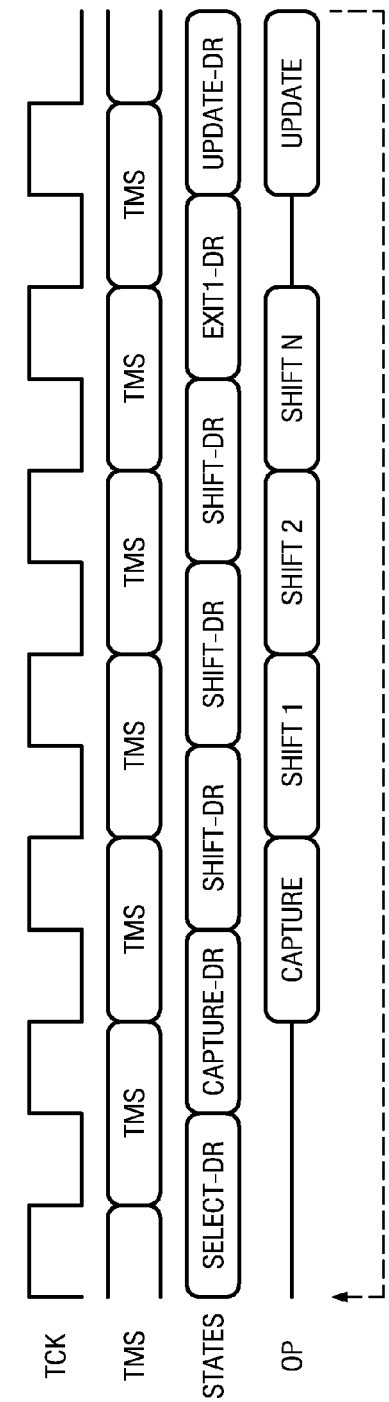
FIG. 57B illustrates the conventional Taps of FIG. 57A performing an update, capture and shift operation.

FIG. 57A illustrates a controller 5702 coupled to a daisy-chain arrangement of devices 5704-5708 for conventionally accessing the boundary scan registers of the devices to test the functional interconnects 5710 between the devices using TSM 104. As seen in timing diagram of FIG. 57B, the controller cycles the TSM through the states of FIG. 2 to perform Capture, Shift and Update operations. As seen in FIG. 57B, the TSM controlled Update operation is delayed by one and one half TCKs after the last Shift (Shift N) operation and the TSM controlled Capture operation is delayed by two and one half TCKs after the Update operation. Delaying the Capture operation by two and one half TCKs after the Update operation prevents being able to test for timing sensitive delay faults in the interconnects 5710 between the devices. This is a well known problem of using the TSM to control device boundary scan registers.

Figure 58A:
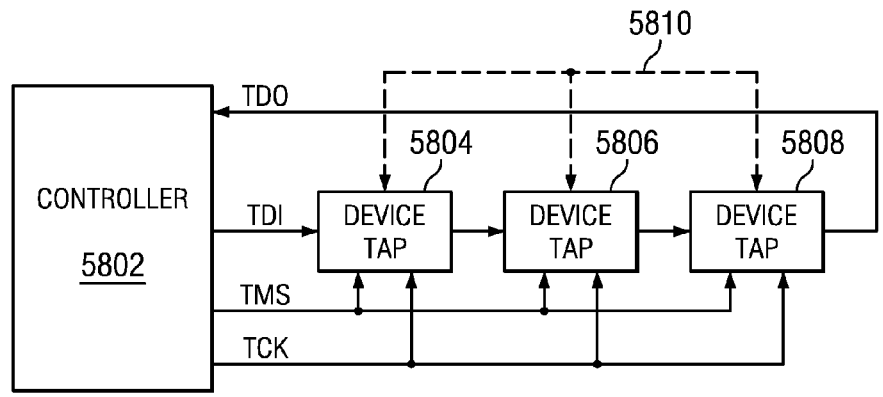
FIG. 58A illustrates a daisy chain of devices with commandable Taps connected to a controller according to the disclosure.
Figure 58B:
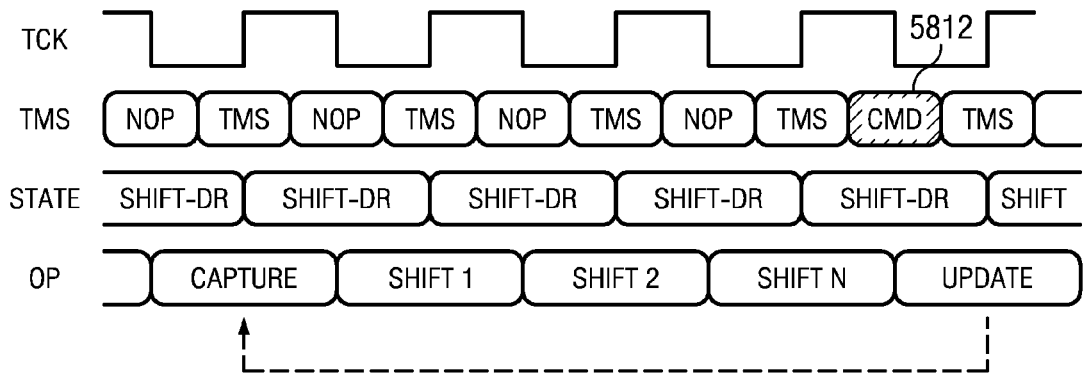
FIG. 58B illustrates the commandable Taps of FIG. 58A performing an update, capture and shift operation according to the disclosure.

FIG. 58A illustrates a controller 5802 coupled to a daisy chain arrangement of devices 5804-5808 for accessing the boundary scan registers of the devices to test the functional interconnects 5810 between the devices using the CMD circuit 2404 of the commandable DRC router 2402 of the present disclosure. As seen in timing diagram of FIG. 58B, the controller transitions the TSM into the Shift-DR state of FIG. 2 then inputs a CMD 5812 on TMS at an appropriate time to perform an Update and Capture operation then resumes the Shift operation. This CMD input cycle repeats while the TSM is in the Shift-DR state. As seen in FIG. 58B, the CMD controlled Update operation occurs on the next TCK following the last shift (Shift N) operation and the CMD controlled Capture operation occurs on the next TCK following the Update operation. Thus the CMD controlled method of the disclosure overcomes the testing limitation of the TSM control method of FIGS. 57A and 57B and enables testing for timing sensitive delay faults in the interconnects 5810 between the devices.

Figure 59A:
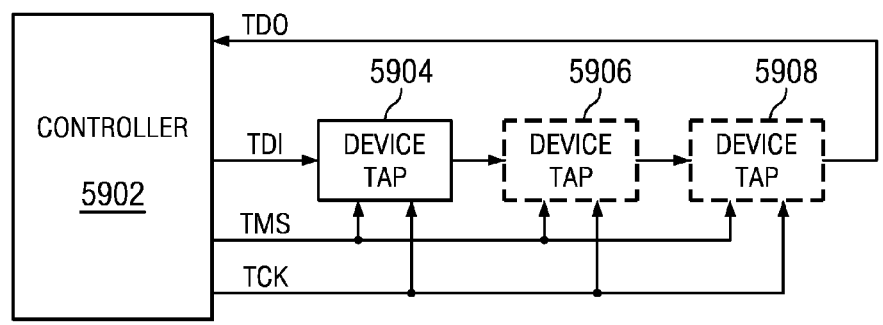
FIG. 59A illustrates a daisy chain of devices connected to a controller.

FIG. 59A illustrates a controller 5902 accessing a first device 5904 in a daisy-chain arrangement for conventionally accessing a data register or TCA in the first device using the TSM while trailing devices 5906-5908 are being bypassed (shown in dotted line) using the device's TAP bypass register. If a CSU type data register is being accessed, the TSM will cycle through the previously described Capture, Shift and Update operations as shown in FIG. 59B. If a CS type data register is being accessed, the TSM will still cycle through the previously described Capture, Shift and Update operations as shown in FIG. 59C even though there is no update register. If a TCA is being accessed, the TSM will still cycle through the previously described Capture, Shift and Update operations shown in FIG. 59C even though the TCA does required the Update operation. As can be seen in both FIGS. 59B and 59C, the TSM control method adds the previously described and undesired TCK delays between the last Shift (Shift-N) operation and the Update operation and between the Update operation and the Capture operation. Further, each Shift operation needs to be extended with an additional number of shifts to allow the data from the leading device 5904 to be output to the controller via the bypass registers of the trailing devices 5906-5908. The data must traverse the bypass registers during each Shift operation since the bypass registers load with logic 0's during each Capture operation. These are well known problems in using the TSM to control access to a first device in a daisy-chain arrangement of devices.

Figure 60A:
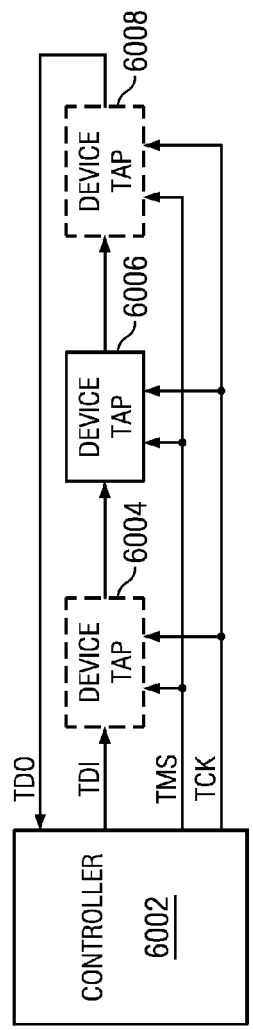
FIG. 60A illustrates a daisy chain of devices connected to a controller.
Figure 60B:
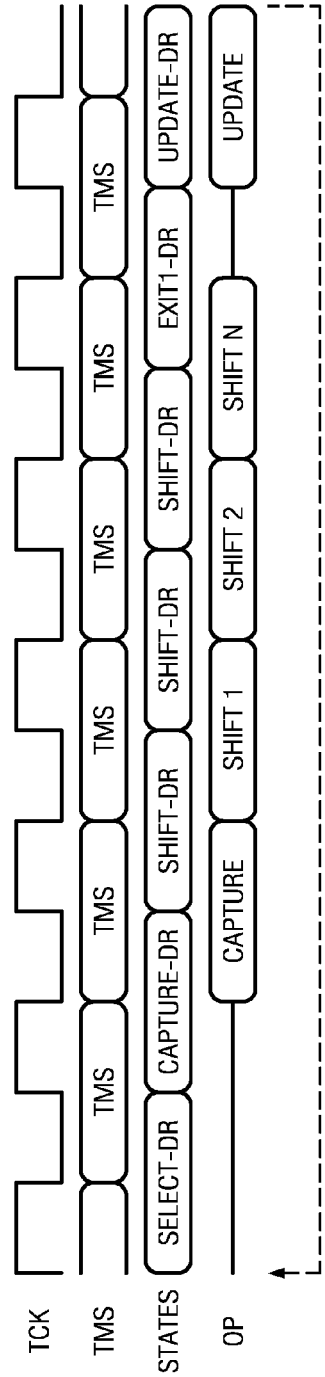
FIG. 60B illustrates the devices of FIG. 60A performing a conventional update, capture and shift operation.
Figure 60C:
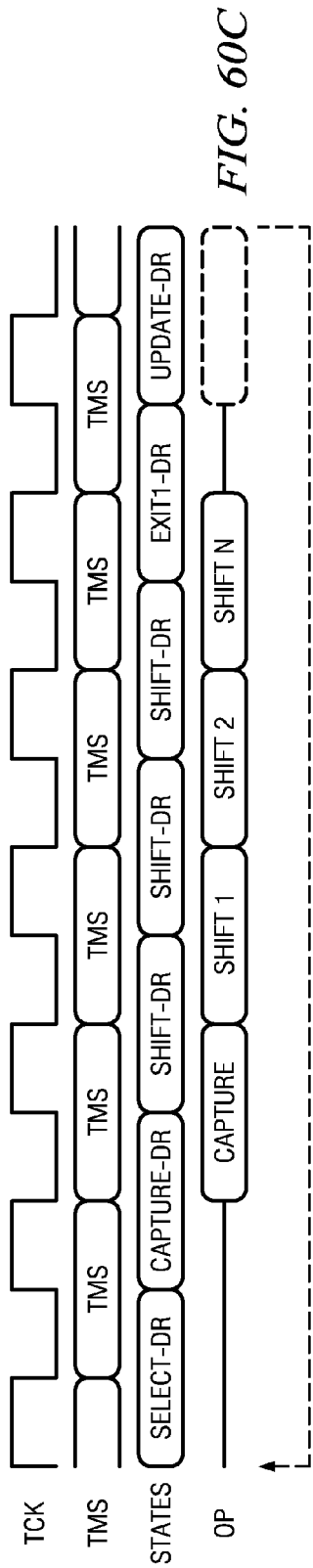
FIG. 60C illustrates the devices of FIG. 60A performing a conventional capture and shift operation.

FIG. 60A illustrates a controller 6002 accessing a middle device 6006 in a daisy-chain arrangement for conventionally accessing a data register or TCA in the middle device using the TSM while leading devices 6004 and trailing devices 6008 are being bypassed (shown in dotted line) using the device's TAP bypass register. If a CSU type data register is being accessed, the TSM will cycle through the previously described Capture, Shift and Update operations as shown in FIG. 60B. If a CS type data register is being accessed, the TSM will still cycle through the previously described Capture, Shift and Update operations as shown in FIG. 60C even though there is no update register. If a TCA is being accessed, the TSM will still cycle through the previously described Capture, Shift and Update operations shown in FIG. 60C even though the TCA does required the Update operation. As can be seen in both FIGS. 60B and 60C, the TSM control method adds the previously described and undesired TCK delays between the last Shift (Shift-N) operation and the Update operation and between the Update operation and the Capture operation. Further, each Shift operation needs to be extended with an additional number of shifts to allow the input data to the middle device 6006 to pass through the bypass registers of leading devices 6004 and the output data from the middle device 6006 to pass through the bypass registers of the trailing devices 6008. The data must traverse the bypass registers during each Shift operation since the bypass registers load with logic 0's during each Capture operation. These are well known problems in using the TSM to control access to a middle device in a daisy-chain arrangement of devices.

Figure 61A:
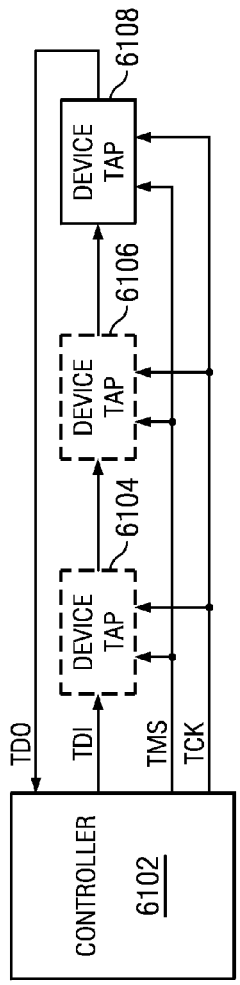
FIG. 61A illustrates a daisy chain of devices connected to a controller.
Figure 61B:
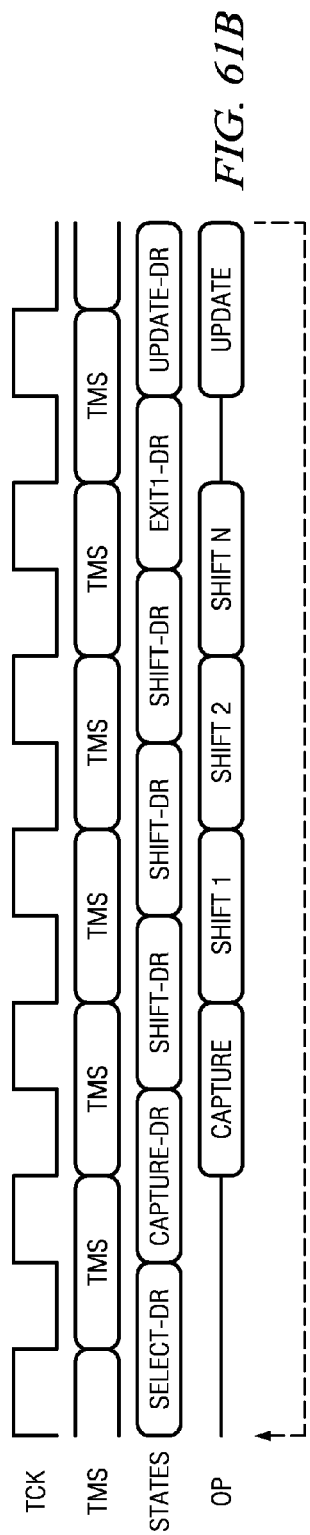
FIG. 61B illustrates the devices of FIG. 61A performing a conventional update, capture and shift operation.
Figure 61C:
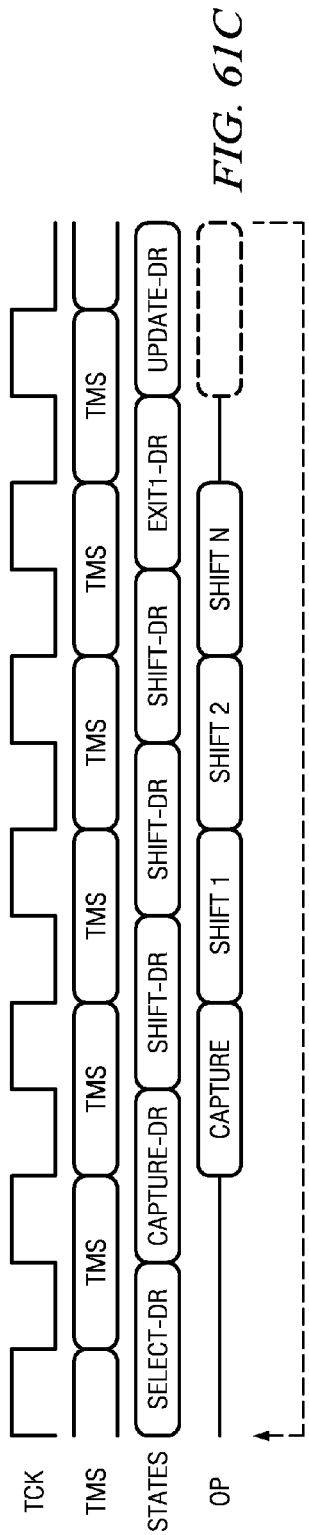
FIG. 61C illustrates the devices of FIG. 61A performing a conventional capture and shift operation.

FIG. 61A illustrates a controller 6102 accessing a last device 6108 in a daisy-chain arrangement for conventionally accessing a data register or TCA in the last device using the TSM while leading devices 6104-6106 are being bypassed (shown in dotted line) using the device's TAP bypass register. If a CSU type data register is being accessed, the TSM will cycle through the previously described Capture, Shift and Update operations as shown in FIG. 61B. If a CS type data register is being accessed, the TSM will still cycle through the previously described Capture, Shift and Update operations as shown in FIG. 61C even though there is no update register. If a TCA is being accessed, the TSM will still cycle through the previously described Capture, Shift and Update operations shown in FIG. 61C even though the TCA does required the Update operation. As can be seen in both FIGS. 61B and 61C, the TSM control method adds the previously described and undesired TCK delays between the last Shift (Shift-N) operation and the Update operation and between the Update operation and the Capture operation. Further, each Shift operation needs to be extended with an additional number of shifts to allow the input data to the last device 6108 to pass through the bypass registers of leading devices 6104-6106. The data must traverse the bypass registers during each Shift operation since the bypass registers load with logic 0's during each Capture operation. These are well known problems in using the TSM to control access to a last device in a daisy-chain arrangement of devices.

Figure 62A:
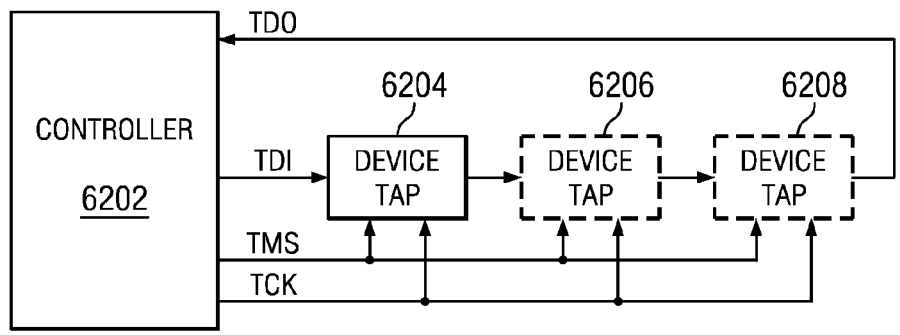
FIG. 62A illustrates a daisy chain of devices connected to a controller.
Figure 62B:
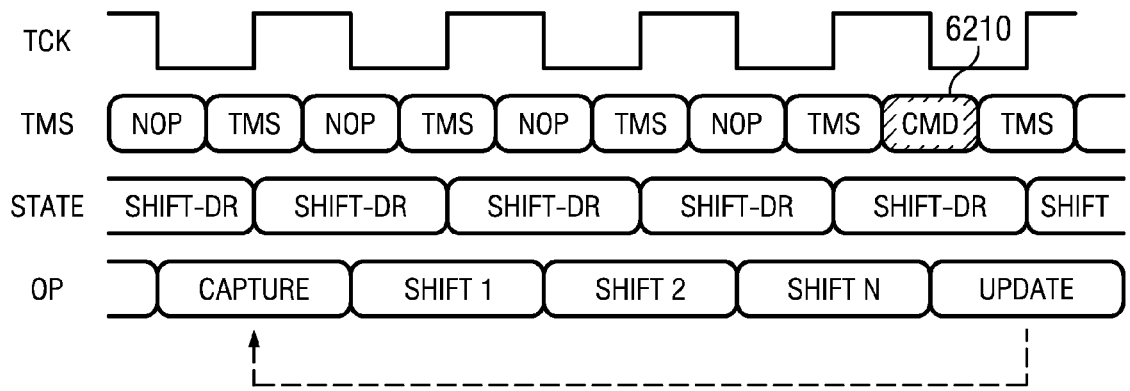
FIG. 62B illustrates the devices of FIG. 62A performing an update, capture and shift operation according to the disclosure.
Figure 62C:
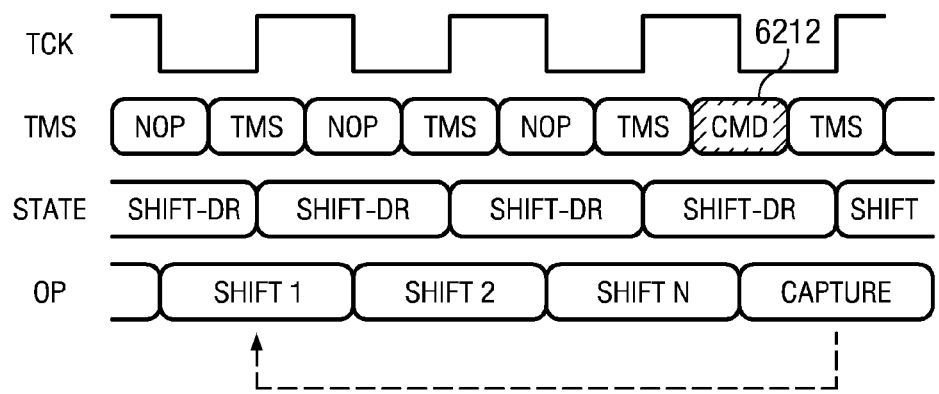
FIG. 62C illustrates the devices of FIG. 62A performing a capture and shift operation according to the disclosure.

FIG. 62A illustrates a controller 6202 accessing a data register or a TCA of a first device 6204 in a daisy-chain arrangement with trailing devices 6206-6208 using the CMD method of the commandable DRC router 2402 of the present disclosure. As seen in dotted line, the trailing devices 6206-6208 in the arrangement are bypassed using their TAP bypass register. If a CSU type data register is being accessed, the commandable DRC router 2404 will respond to a CMD input 6210 on TMS to cycle through the previously described Update, Capture and Shift operations as shown in FIG. 62B. If a CS type data register or a TCA is being accessed, the commandable DRC router 2404 will respond to a CMD input 6212 on TMS to cycle through the previously described Capture and Shift operations as shown in FIG. 62C. As can be seen in both FIGS. 62B and 62C, the CMD control method eliminates the undesired TCK delays mentioned in regard to the TSM control methods of FIGS. 59B and 59C.

Further, since the TSM 104 continuously shifts data in the Shift-DR state during the CMD controlled method of the disclosure and only suspends the continuous shift operation to perform the commanded Capture or Update and Capture operations, the shift operation only needs to be extended by the number of trailing device bypass registers.

For example, if there are 10 trailing device bypass registers the overall Shift operation will only be extended by 10 additional shift operations. In comparison, with 10 trailing device bypass registers in the TSM control method of FIGS. 59a-59C, each Shift cycle would need to be extended by 10 shifts. If 10,000 Shift cycles were required in the FIG. 59A-59C examples, the overall shift operation would be extended by 10,000×10 shifts, or 100,000 additional shift operations.

Figure 63A:
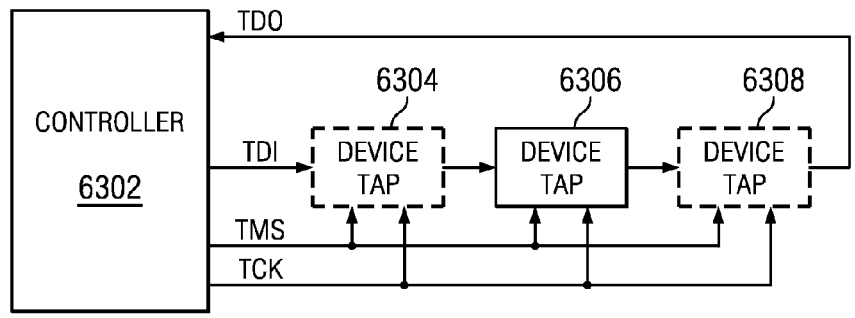
FIG. 63A illustrates a daisy chain of devices connected to a controller.
Figure 63B:
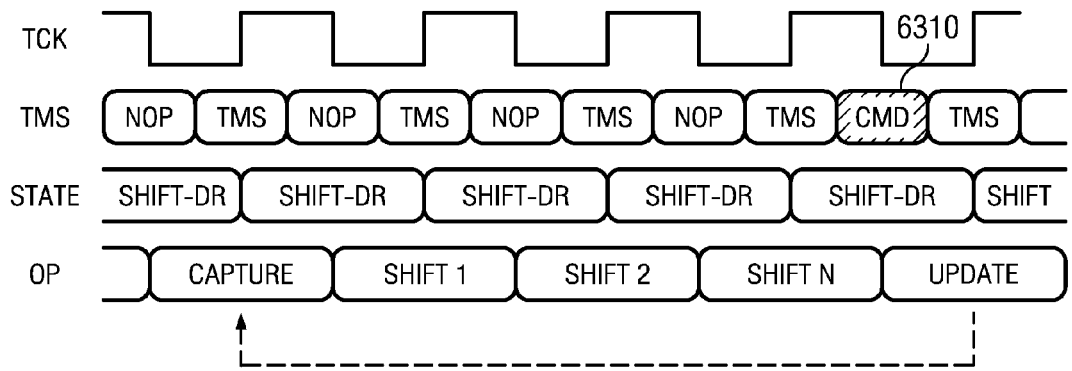
FIG. 63B illustrates the devices of FIG. 63A performing an update, capture and shift operation according to the disclosure.
Figure 63C:
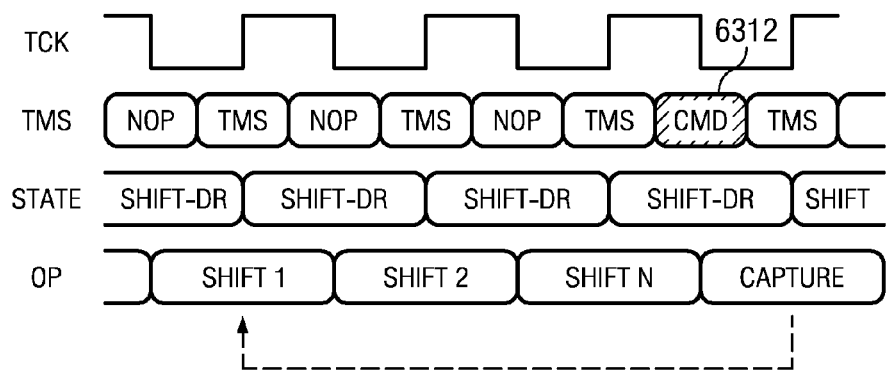
FIG. 63C illustrates the devices of FIG. 63A performing a capture and shift operation according to the disclosure.

FIG. 63A illustrates a controller 6302 accessing a data register or a TCA of a middle device 6306 in a daisy-chain arrangement with leading devices 6304 and trailing devices 6308 using the CMD method of the commandable DRC router 2402 of the present disclosure. As seen in dotted line, the leading and trailing devices in the arrangement are bypassed using their TAP bypass register. If a CSU type data register is being accessed, the commandable DRC router 2404 will respond to a CMD input 6310 on TMS to cycle through the previously described Update, Capture and Shift operations as shown in FIG. 63B. If a CS type data register or a TCA is being accessed, the commandable DRC router 2404 will respond to a CMD input 6312 on TMS to cycle through the previously described Capture and Shift operations as shown in FIG. 63C. As can be seen in both FIGS. 63B and 63C, the CMD control method eliminates the undesired TCK delays mentioned in regard to the TSM control methods of FIGS. 60B and 60C.

Further, since the TSM 104 continuously shifts data in the Shift-DR state during the CMD controlled method of the disclosure and only suspends the continuous shift operation to perform the commanded Capture or Update and Capture operations, the shift operation only needs to be extended by the number of leading and trailing device bypass registers.

For example, if there are 5 leading and 5 trailing device bypass registers the overall Shift operation will only be extended by 10 additional shift operations. In comparison, with 5 leading and 5 trailing device bypass registers in the TSM control method of FIGS. 60a-60C, each Shift cycle would need to be extended by 10 shifts. If 10,000 Shift cycles were required in the FIG. 60A-60C examples, the overall shift operation would be extended by 10,000×10 shifts, or 100,000 additional shifts.

Figure 64A:
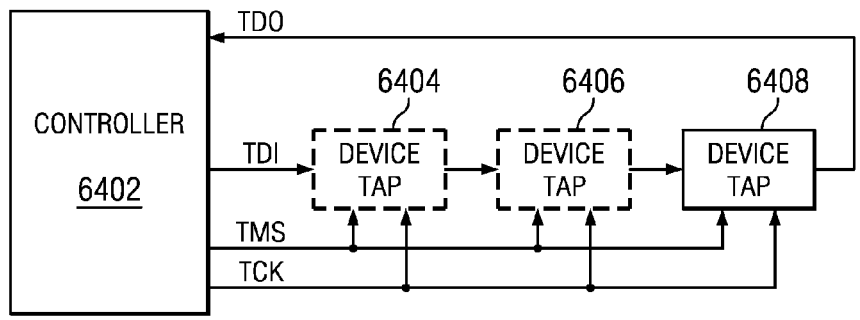
FIG. 64A illustrates a daisy chain of devices connected to a controller.
Figure 64B:
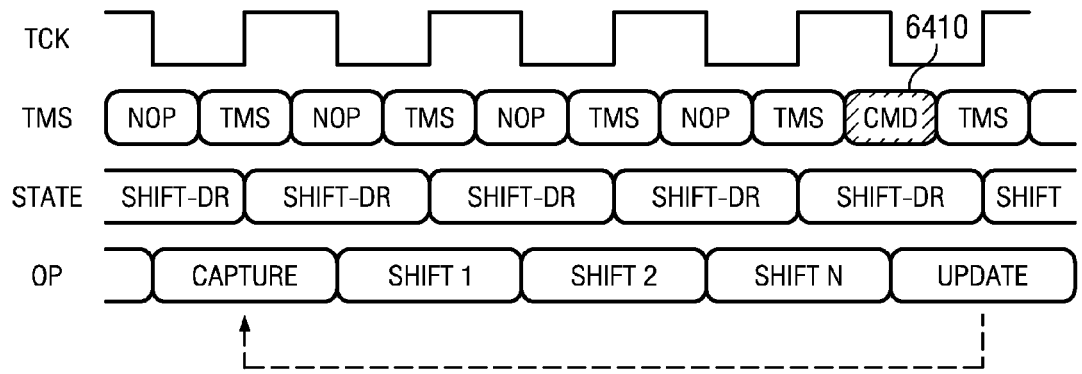
FIG. 64B illustrates the devices of FIG. 64A performing an update, capture and shift operation according to the disclosure.
Figure 64C:
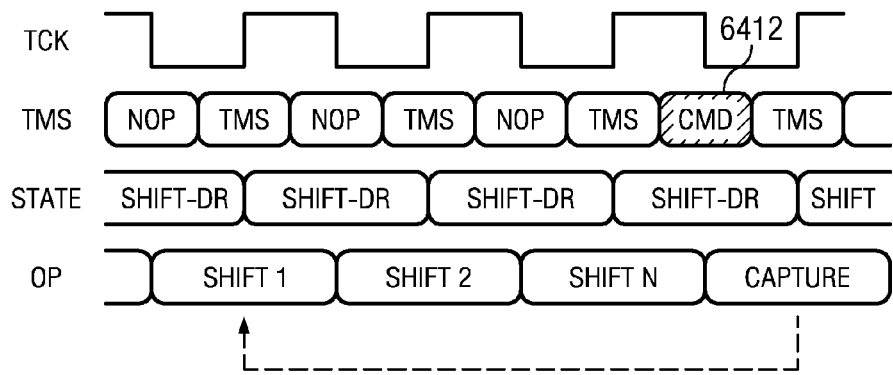
FIG. 64C illustrates the devices of FIG. 64A performing a capture and shift operation according to the disclosure.

FIG. 64A illustrates a controller 6402 accessing a data register or a TCA of a last device 6408 in a daisy-chain arrangement with leading devices 6404-6406 using the CMD method of the commandable DRC router 2402 of the present disclosure. As seen in dotted line, the leading devices 6404-6406 in the arrangement are bypassed using their TAP bypass register. If a CSU type data register is being accessed, the commandable DRC router 2404 will respond to a CMD input 6410 on TMS to cycle through the previously described Update, Capture and Shift operations as shown in FIG. 64B. If a CS type data register or a TCA is being accessed, the commandable DRC router 2404 will respond to a CMD input 6412 on TMS to cycle through the previously described Capture and Shift operations as shown in FIG. 64C. As can be seen in both FIGS. 64B and 64C, the CMD control method eliminates the undesired TCK delays mentioned in regard to the TSM control methods of FIGS. 61B and 61C.

Further, since the TSM 104 continuously shifts data in the Shift-DR state during the CMD controlled method of the disclosure and only suspends the continuous shift operation to perform the commanded Capture or Update and Capture operations, the shift operation only needs to be extended by the number of leading device bypass registers.

For example, if there are 10 leading device bypass registers the overall Shift operation will only be extended by 10 additional shift operations. In comparison, with 10 leading device bypass registers in the TSM control method of FIGS. 61a-61C, each Shift cycle would need to be extended by 10 shifts. If 10,000 Shift cycles were required in the FIG. 61A-61C examples, the overall shift operation would be extended by 10,000×10 shifts, or 100,000 additional shift operations.

It is important to note in the daisy chain arrangements of FIGS. 62A-64A the advantage of inputting the CMD signal to the commandable DRC routers using the TMS signal, which is a common input to all the devices. While it was mentioned earlier in regard to FIGS. 26A-26C that the CMD signal could be input using the TDI input, the TDI CMD input method would not work when devices are placed in the daisy chain arrangements of FIGS. 62A-64A since the TDI input from the controller is only connected to the first device in the daisy chain arrangement.

Figure 65:
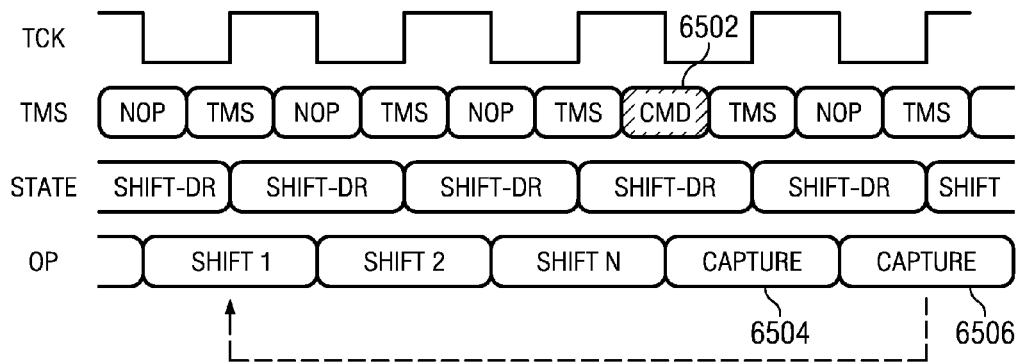
FIG. 65 illustrates the timing of a back to back capture and shift operation according to the disclosure.

FIG. 65 illustrates the timing of a CS data register scan operation controlled from a commandable DRC router 2402 that performs two back to back Capture operations following the last Shift (Shift-N) operation. Performing back to back Capture operations are commonly done using conventional scan interfaces, i.e. using scan clock and scan enable signals, to provide improved circuit delay testing. In this case it is done using the commandable DRC router of the present disclosure. As seen in FIG. 65, a CMD 6502 is input to the commandable DRC router from TMS during the last Shift operation. In response to the CMD input the commandable DRC router outputs control to cause the data register to perform first and second Capture operations, then resumes the Shift operation.

Figure 66:
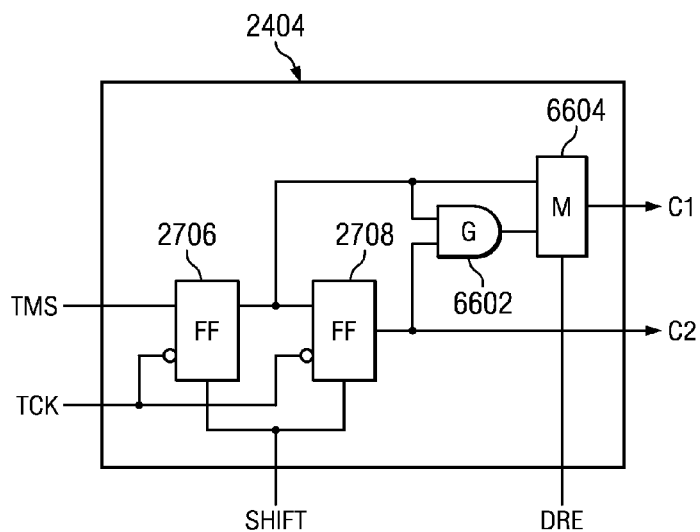
FIG. 66 illustrates a command circuit that can be programmed to control a capture and shift operation or a back to back capture and shift operation according to the disclosure.

FIG. 66 illustrates the CMD circuit 2404 of FIG. 27C that is modified to provide control for back to back Capture operations. As seen the modifications include adding gating circuit 6602 and multiplexer 6604 to the FIG. 27C circuit. When DRE control from a first instruction is input to CMD circuit 2404 of FIG. 66, multiplexer 6604 is controlled to select the output of FF 2706 to be output on C1 and the CMD circuit operates as the CMD circuit of FIG. 27C, i.e. it produces a single C1 output in response to the CMD input. When DRE control from a second instruction is input to CMD circuit 2404 of FIG. 66, multiplexer 6604 is controlled to select the output of gating circuit 6602, which, in this example, ORs the outputs of FFs 2706 and 2708. In response to a CMD input while the second instruction is in effect, the CMD circuit of FIG. 66 produces a first C1 output as the CMD input is shifted into FF 2706 then a second C1 output as the CMD input is shifted into FF 2708. The first C1 output performs the first Capture operation 6504 and the second C1 output performs the second Capture operation 6506 of FIG. 65. Thus the CMD circuit of FIG. 66 can be programmed by the DRE input of the first instruction to perform a single Capture and Shift operation as seen in FIG. 25C and can be programmed by the DRE input of the second instruction to perform a back to back Capture and Shift operation as seen in FIG. 65. For example, substituting the CMD circuit of FIG. 66 for the CMD circuit of FIG. 41 would enable the commandable DR router 2402 of FIG. 40 to operate the data register 1302 in a single capture and shift operation mode or in a back to back capture and shift operation mode.

Figure 67A:
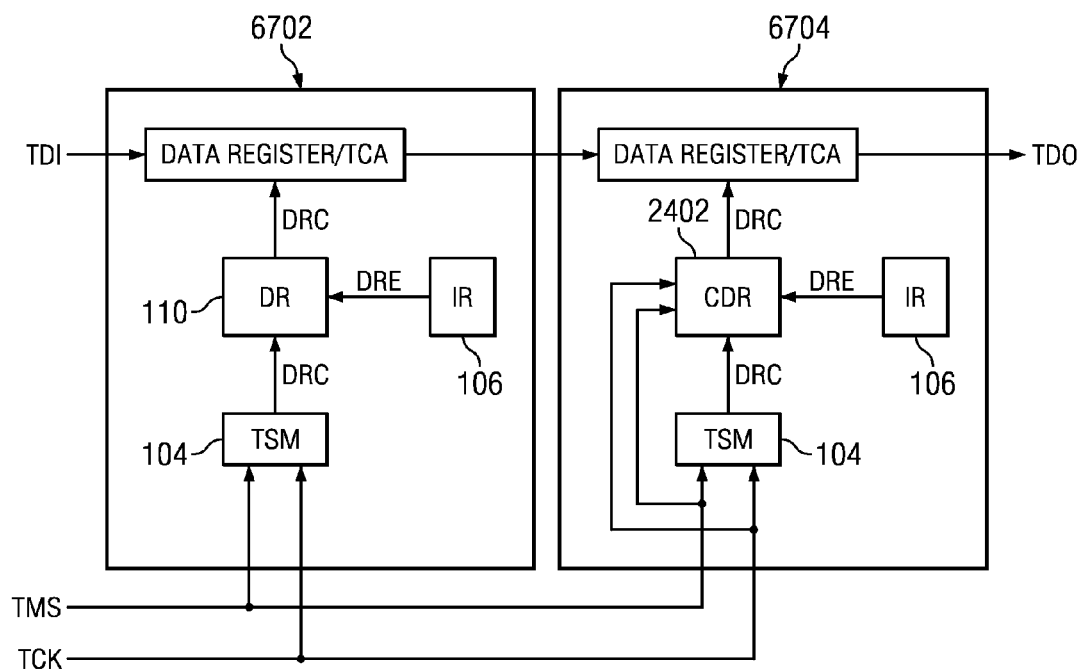
FIG. 67A illustrates a device with a conventional Tap in series with a device with a commandable Tap according to the disclosure.
Figure 67B:
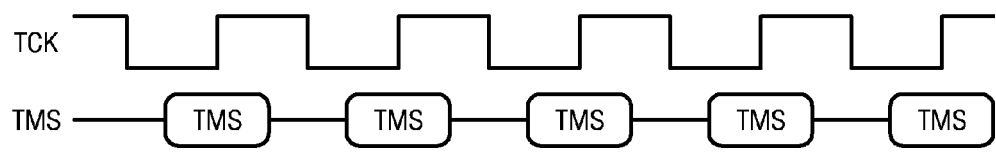
FIG. 67B illustrate the TCK and TMS timing to operate the devices of FIG. 67A conventionally.

FIG. 67A illustrates a device 6702 containing a conventional TAP architecture connected in series with a device 6704 containing the commanded TAP architecture of the present disclosure. When both devices are loaded with instructions to enable the DRC Router (DR) 110 of device 6702 and the Commandable DRC Router (CDR) 2402 of device 6704, to control a data register or a TCA using DRC control from TSM 104, the TCK and TMS timing operates as shown in FIG. 67B. As seen in FIG. 67B, the TMS signal input is stable during the rising edge of TCK to input control to operate the TSM through the states of FIG. 2. In this example, the CDR 2402 operates the same as DR 110 to perform the previously described conventional TSM controlled capture and shift or capture, shift and update operations.

Figure 68A:
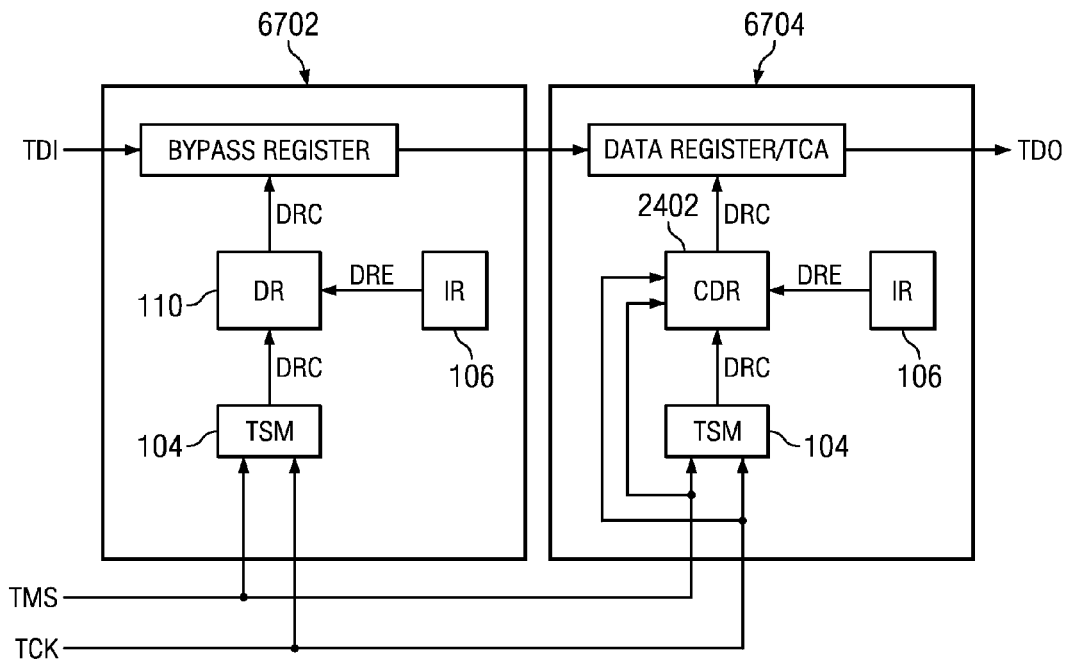
FIG. 68A illustrates a device with a conventional Tap in series with a device with a commandable Tap according to the disclosure.

FIG. 68A illustrates the FIG. 67A devices 6702 and 6704 connected in series. In this example, device 6702 has been loaded with an instruction (Bypass Instruction) that selects the TAP's Bypass Register as the data register between TDI and TDO and device 6704 has been loaded with an instruction the selects a data register of TCA between TDI and TDO. The instruction loaded into device 6704 also enables the CDR 2402 to operate in response to CMD inputs from TMS as previously described.

Figure 68B:
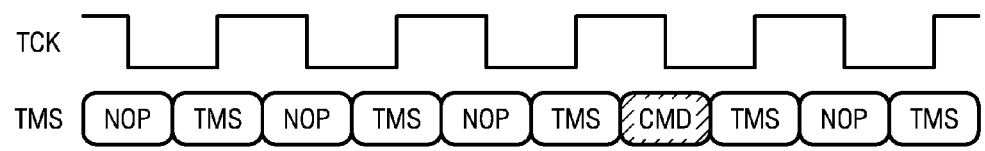
FIG. 68B illustrate the TCK and TMS timing to operate the devices of FIG. 68A in the commandable mode of the disclosure.

When the TSMs of both devices are transitioned to the Shift-DR state of FIG. 2, data is shifted through both devices from TDI of device 6702 to TDO of device 6704. As seen in FIG. 68B, the TMS signal input is stable during the rising edge of the TCK to input control to operate the TSM through its states and the TMS signal is stable during the falling edge of TCK to input a NOP or a CMD signal to the CDR 2402. In response to the CMD signal, the CDR 2402 operates to perform capture and shift or capture, shift and updates operations as previously described.

The purpose of FIGS. 67A, 67B, 68A and 68B is simply to show that conventional devices 6702 that sample TMS on the rising edge of TCK to control their TSM 104 can operate compatibly with devices 6704 of this disclosure that sample TMS on the rising edge of TCK to control their TSM and sample TMS on the falling edge of TCK to control their CDR 2402. Thus, and advantageously, devices containing the commanded TAP architecture of the disclosure can be used with devices containing conventional TAP architectures since the state of TMS on the falling edge of TCK is ignored in conventional TAP architectures.

Figure 69:
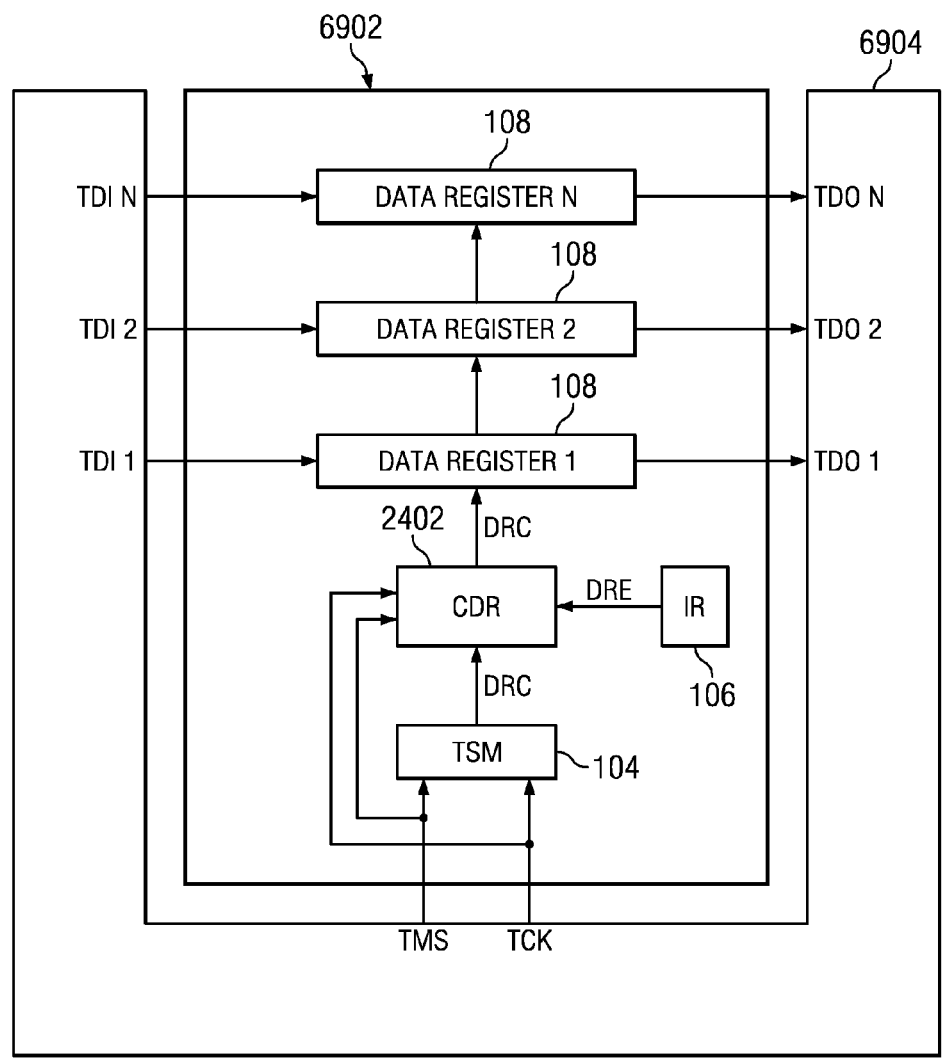
FIG. 69 illustrates a device with parallel scan paths and a commandable Tap connected to a tester according to the disclosure.

FIG. 69 illustrates a device 6902 comprising a TSM 104, a commandable DRC router (CDR) 2402, and parallel data registers 1-N 108 all connected as shown. The parallel data registers 108 could be any of the data registers 108 previously described in regard to FIGS. 9, 13, 16 and 19. In this example the parallel data registers are assumed to be scan paths data registers for testing combinational logic in the device 6902. The data registers are all controlled by the DRC output from the CDR 2402 as the single data registers of FIGS. 28-34 and FIGS. 38-46 were previously described being controlled to perform capture and shift or update, capture and shift operations.

As seen, a device tester 6904 is connected to the device 6902 to provide a separate TDI input to each data register and receive a separate TDO output from each data register. The tester also provides the TCK and TMS inputs to the device's TSM 104 and CDR 2402. If the CDR 2402 of FIG. 69 is like the CDRs 2402 described in regard to FIGS. 28-34, the data registers can be selectively controlled by the TSM 104 or by the CMD circuit 2404. If the CDR 2402 of FIG. 69 is like the CDRs 2402 described in regard to FIGS. 38-46, the data registers can be controlled by the CMD circuit 2404. The reduced test time advantage of using shorter length parallel data registers for testing combinational logic rather than using a single longer length data register is well known in the industry.

Figure 70:
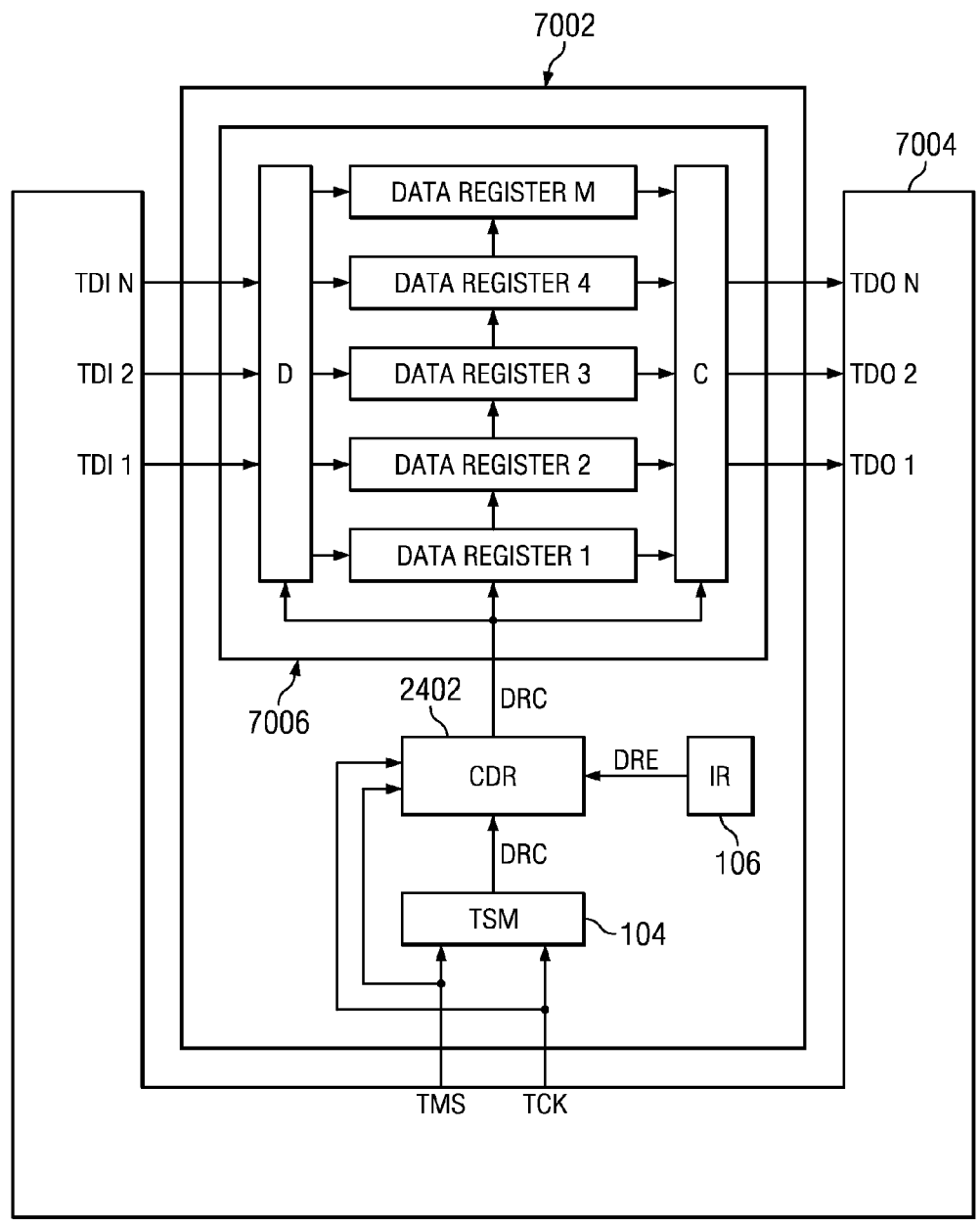
FIG. 70 illustrates a device with a parallel input parallel output test compression architecture and a commandable Tap connected to a tester according to the disclosure.

FIG. 70 illustrates a device 7002 comprising a TSM 104, a commandable DRC router (CDR) 2402, and a TCA 7006. The TCA 7006 is the same as the previously described TCAs with the exception that TCA 7006 has N TDI inputs for inputting compressed test data from a tester 7004 and N TDO outputs for outputting compressed test data to the tester 7004. The decompressor circuit (D) decompresses the test data from the TDI inputs and inputs the decompressed test data to a large number of shorter length scan path data registers (1-M). The compactor circuit (C) compacts the test data from the scan path data registers (1-M) into compressed test data outputs that are output on the TDO outputs. The M scan path data registers are used to test combinational logic in device 7002. The TCA 7006 of FIG. 70 is controlled by the DRC output from the CDR 2402 as the TCAs of FIGS. 36-37 and FIGS. 49-51 were previously described being controlled.

As seen, a device tester 7004 is connected to the device 7002 to provide the separate TDI 1-N inputs to the TCA 7006 and receive the separate TDO 1-N outputs from the TCA 7006. The tester also provides the TCK and TMS inputs to the device's TSM 104 and CDR 2402. If the CDR 2402 of FIG. 70 is like the CDRs 2402 described in regard to FIGS. 36-37, the TCA 7006 can be selectively controlled by the TSM 104 or by the CMD circuit 2404. If the CDR 2402 of FIG. 70 is like the CDRs 2402 described in regard to FIG. 49-51, the TCA 7006 can be controlled by the CMD circuit 2404. The reduced test time advantage of using TCAs 7006 with more that one compressed test input (i.e. TDI 1-N) and more that one compressed test data output (i.e. TDO 1-N) rather than using a TCA with a single compressed test data input (i.e. TDI) and single compressed test data output (i.e. TDO) is well known in the industry.

Figure 71A:
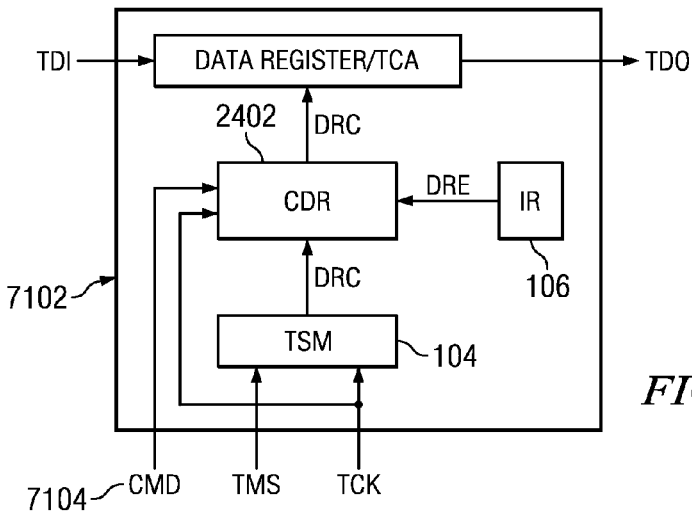
FIG. 71A illustrates a device with a commandable Tap that uses a separate command signal to input commands according to the disclosure.

FIG. 71A illustrates a device 7102 comprising a TSM 104, a commandable DRC router (CDR) 2402, and a data register or TCA all connected as shown. The data register or TCA of FIG. 71A could be any of the previously described data registers or TCAs. The CDR 2402 of FIG. 71A could be any of the previously described CDRs 2402. The only difference between device 7102 and other previously described devices that contain a TSM 104, a CDR 2402 and a data register/TCA is that the CDR 2402 of device 7102 receives the CMD input from a CMD input signal 7104 to the device that is separate from the TMS input signal to the device. When an instruction is input to the instruction register 106, the DRE inputs from the instruction register enable the CDR 2402 to respond to CMD inputs from the CMD input signal 7104.

Figure 71B:
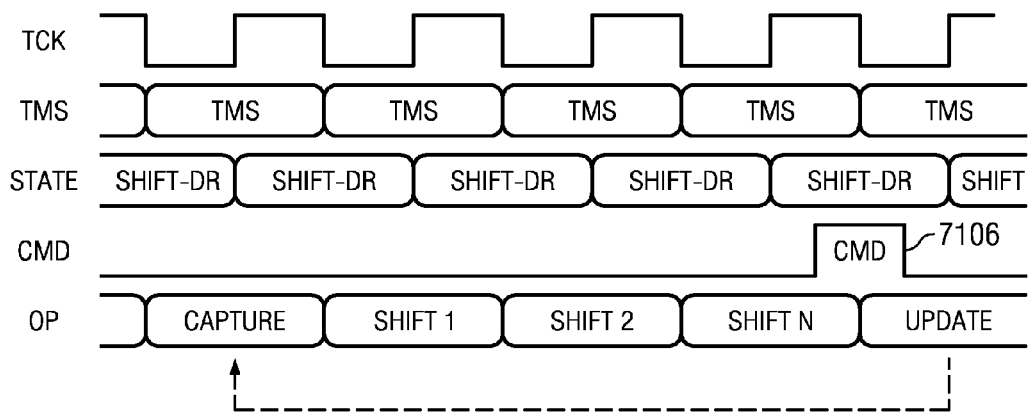
FIG. 71B illustrates the device of FIG. 71A performing an update, capture and shift operation in response to command input on the separate command signal according to the disclosure.

FIG. 71B illustrates the timing of inputting a CMD to CDR 2402 using the CMD input signal 7104 to perform an uninterrupted update, capture and shift operation. As seen, the TSM 104 is in the Shift-DR state shifting data to and from a data register or TCA. At an appropriate time, and before the falling edge of TCK, a CMD 7106 is input on the CMD input signal 7104 to CDR 2402. In response the CMD input, the CDR 2402 controls the data register or TCA as previously described to perform an update, capture and shift operation cycle. Additional CMD inputs cause additional uninterrupted update, capture and shift operation cycles to occur.

Figure 71C:
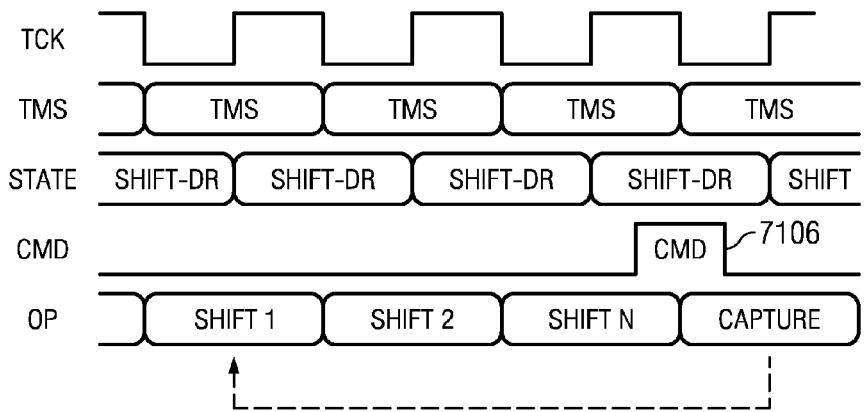
FIG. 71C illustrates the device of FIG. 71A performing a capture and shift operation in response to command input on the separate command signal according to the disclosure.

FIG. 71C illustrates the timing of inputting a CMD to CDR 2402 using the CMD input signal 7104 to perform an uninterrupted capture and shift operation. As seen, the TSM 104 is in the Shift-DR state shifting data to and from a data register or TCA. At an appropriate time, and before the falling edge of TCK, a CMD 7106 is input on the CMD input signal 7104 to CDR 2402. In response the CMD input, the CDR 2402 controls the data register or TCA as previously described to perform a capture and shift operation cycle. Additional CMD inputs cause additional uninterrupted capture and shift operation cycles to occur.

Figure 72A:
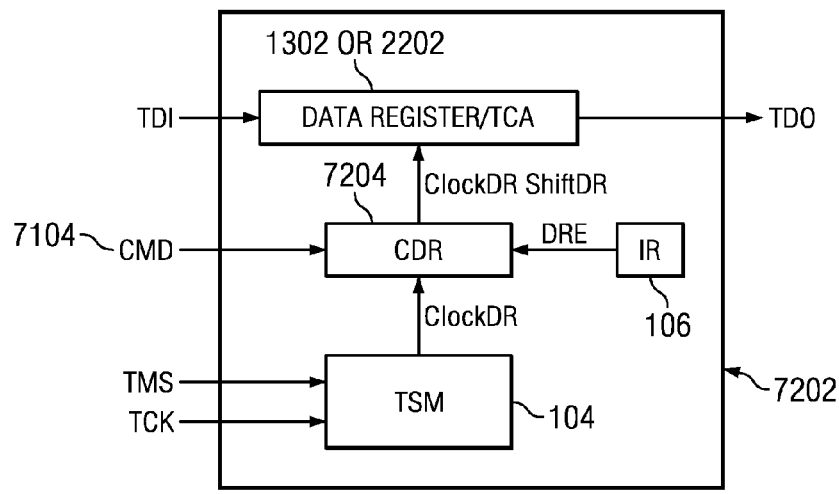
FIG. 72A illustrates a device with a commandable Tap that uses a separate command signal to input commands according to the disclosure.

FIG. 72A illustrates a device 7202 comprising a TSM 104, a commandable DRC router (CDR) 7204, and a data register or TCA all connected as shown. The data register or TCA of FIG. 71A could be any of the previously described data registers, such as 1302, or TCAs, such as 2202, that operate in response to ClockDR and ShiftDR inputs. CDR 7204 inputs a ClockDR signal from TSM 104, a CMD signal from the CMD input signal 7104 and DRE input from instruction register 106. CDR 7204 outputs a ClockDR and ShiftDR signal to the data register/TCA. When an instruction is input to the instruction register 106, the DRE inputs from the instruction register enable the CDR 7204 to respond to CMD inputs from the CMD input signal 7104 to perform data register/TCA capture and shift operation cycles as shown in FIG. 73.

Figure 72B:
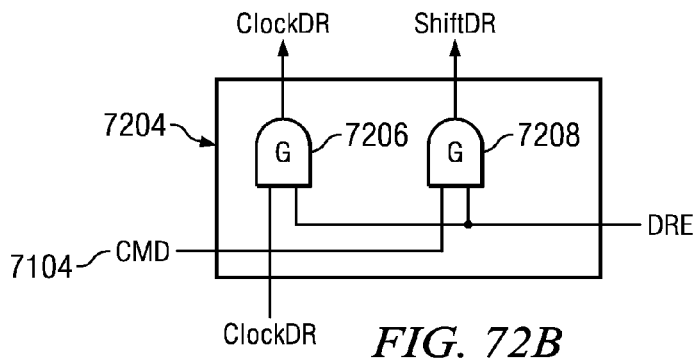
FIG. 72B illustrates the commandable DRC router (CDR) of FIG. 72A.

FIG. 72B illustrates an example CDR 7204 which comprises gating circuits 7206 and 7208. Gating circuit 7206 inputs the ClockDR signal from TSM 104 and a DRE input from instruction register 106. Gating circuit 7206 outputs a ClockDR signal to the data register/TCA. Gating circuit 7208 inputs the CMD signal from CMD input and a DRE input from instruction register 106. Gating circuit 7206 outputs a ShiftDR signal to the data register/TCA. As can be seen, CDR 7204 does not include the CMD circuit 2404 of CDRs 2402. The reason a CMD circuit 2402 is not required is because the CMD is input directly from the CMD input signal 7104 from an external controller or tester. Thus the CMD signal can be asserted by the external controller or tester to a desired stable state prior to the rising edge of the ClockDR (gated TCK) signal from the TSM 104. The CMD circuit 2404 was required in CDRs 2402 since the CMD was input on TMS and registered on the falling edge of TCK such that it was asserted to a desired stable state prior to the rising edge of TCK.

Figure 73:
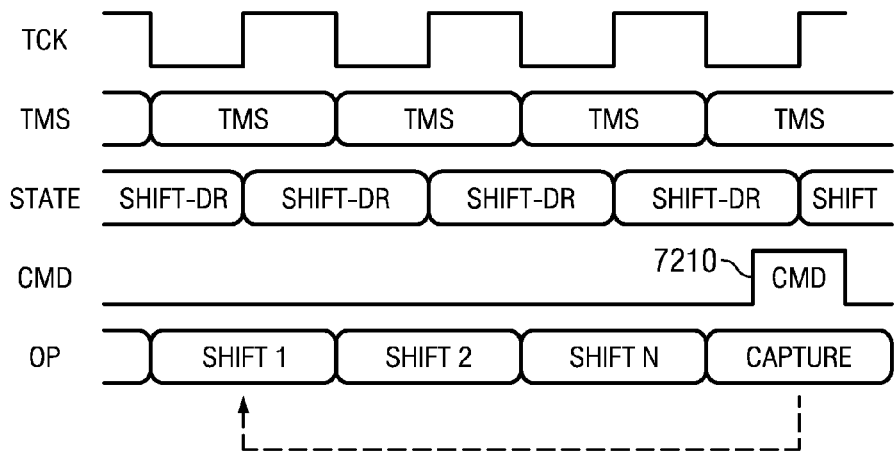
FIG. 73 illustrates the devices of FIGS. 72A and 74A performing a capture and shift operation in response to command input on the separate command signal according to the disclosure.

FIG. 73 illustrates the timing of inputting a CMD to CDR 7204 using the CMD input signal 7104 to perform uninterrupted capture and shift operation cycles. As seen, the TSM 104 is in the Shift-DR state shifting data to and from a data register or TCA. At an appropriate time, and prior to the rising edge of TCK, a controller or tester inputs a CMD signal 7210 on the CMD input 7104 to CDR 7204. In response to the CMD input, CDR 7204 sets the ShiftDR input to the data register or TCA to a state that causes the data register or TCA to perform a capture operation in response to the rising edge of the TCK (ClockDR) input. Following the CMD input the data register or TCA resumes the shifting of data. Additional CMD 7210 inputs cause additional uninterrupted capture and shift operation cycles to occur.

Figure 74A:
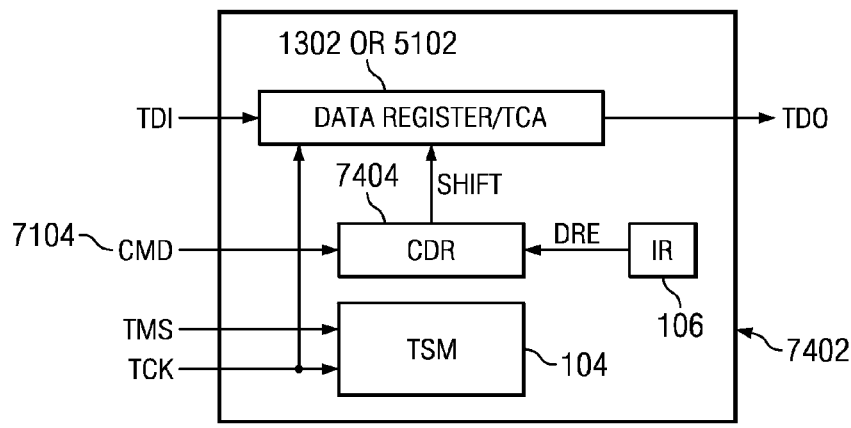
FIG. 74A illustrates a device with a commandable Tap that uses a separate command signal to input commands according to the disclosure.

FIG. 74A illustrates a device 7402 comprising a TSM 104, a commandable DRC router (CDR) 7404, and a data register or TCA all connected as shown. The data register or TCA of FIG. 74A could be any of the previously described data registers, such as 1302, or TCAs, such as 5102, that operate in response to the free running TCK and Shift inputs. CDR 7404 inputs a CMD signal from the CMD input signal 7104 and DRE inputs from the instruction register 106. CDR 7404 outputs a Shift signal to the data register/TCA. When an instruction is input to the instruction register 106, the DRE inputs from the instruction register enable the CDR 7404 to respond to CMD inputs from the CMD input signal 7104 to perform data register/TCA capture and shift operation cycles as shown in FIG. 73.

Figure 74B:
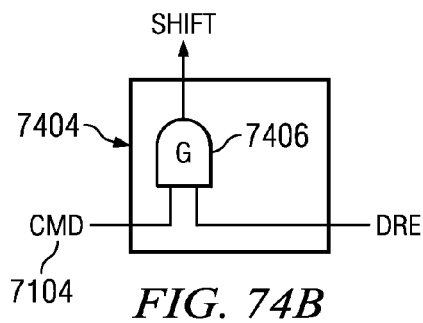
FIG. 74B illustrates the commandable DRC router (CDR) of FIG. 74A.

FIG. 74B illustrates an example CDR 7404 which comprises a gating circuit 7406. Gating circuit 7406 inputs the CMD signal 7104 and a DRE input from instruction register 106. Gating circuit 7406 outputs a Shift signal to the data register/TCA. As can be seen, CDR 7404 does not include the CMD circuit 2404 of CDRs 2402 for the same reasons mentioned in regard to CDR 7204 of FIG. 72B. A controller or tester asserts the CMD signal to a desired stable state prior to the rising edge of the TCK signal which causes gating circuit 7406 to set the Shift input to data register or TCA to a state that causes the data register or TCA to capture data on the rising edge of TCK.

FIG. 73 illustrates the timing of inputting a CMD to CDR 7404 using the CMD input signal 7104 to perform uninterrupted capture and shift operation cycles. As seen, the TSM 104 is in the Shift-DR state shifting data to and from a data register or TCA. At an appropriate time, and prior to the rising edge of TCK, a controller or tester inputs a CMD signal 7210 on the CMD input 7104 to CDR 7404. In response to the CMD input, CDR 7404 sets the Shift input to the data register or TCA to a state that causes the data register or TCA to perform a capture operation in response to the rising edge of the TCK input. Following the CMD input the data register or TCA resumes the shifting of data. Additional CMD 7210 inputs cause additional uninterrupted capture and shift operation cycles to occur.

Figure 75B:
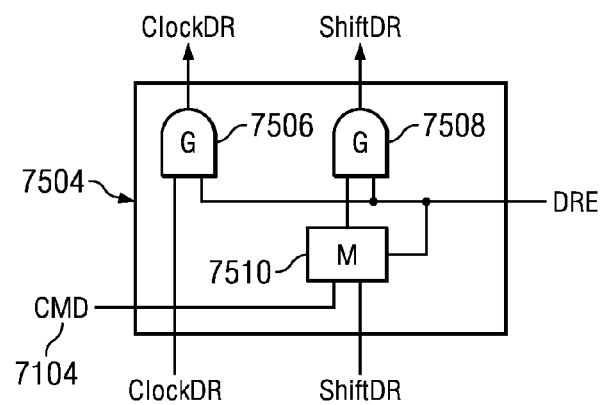
FIG. 75B illustrates the commandable DRC router (CDR) of FIG. 75A.
Figure 75A:
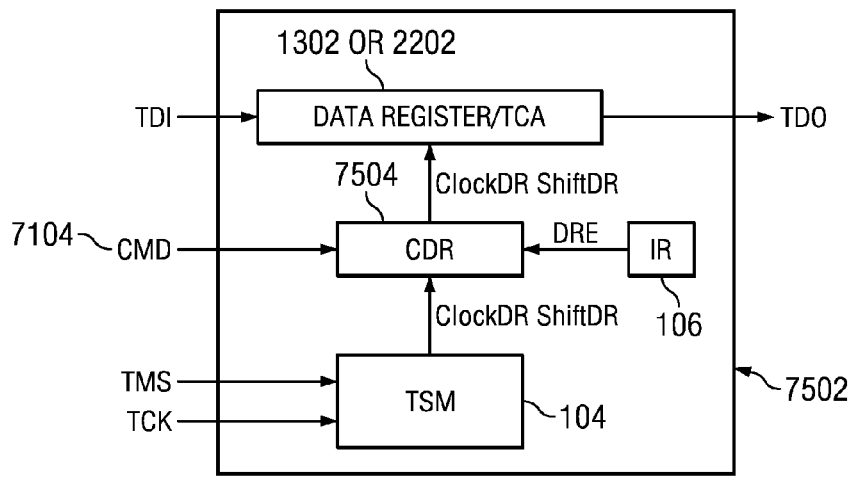
FIG. 75A illustrates a device with a commandable Tap that uses a separate command signal to input commands according to the disclosure.

FIG. 75A illustrates a device 7502 comprising a TSM 104, a commandable DRC router (CDR) 7504, and a data register or TCA all connected as shown. The data register or TCA of FIG. 75A could be any of the previously described data registers, such as 1302, or TCAs, such as 2202, that operate in response to ClockDR and ShiftDR inputs. CDR 7504 inputs ClockDR and ShiftDR signals from TSM 104, a CMD signal from the CMD input signal 7104 and DRE input from instruction register 106. CDR 7504 outputs a ClockDR and ShiftDR signal to the data register/TCA.

FIG. 75B illustrates an example CDR 7504 comprising gating circuits 7506 and 7508 and multiplexer 7510 all connected as shown. When a first instruction is input to the instruction register 106, the DRE inputs from the instruction register enable the CDR 7504 to respond to the ClockDR and ShiftDR inputs from TSM 104 to perform data register/TCA capture and shift operation cycles as described in FIG. 31. When a second instruction is input to the instruction register 106, the DRE inputs from the instruction register enable the CDR 7504 to respond to CMD inputs from the CMD input signal 7104 to perform data register/TCA capture and shift operation cycles as described in FIG. 31. The only difference between the CDR 7504 of FIG. 75B and CDR 2402 of FIG. 31 is that the CMD circuit 2404 of FIG. 35 is not included in FIG. 76B.

Figure 76A:
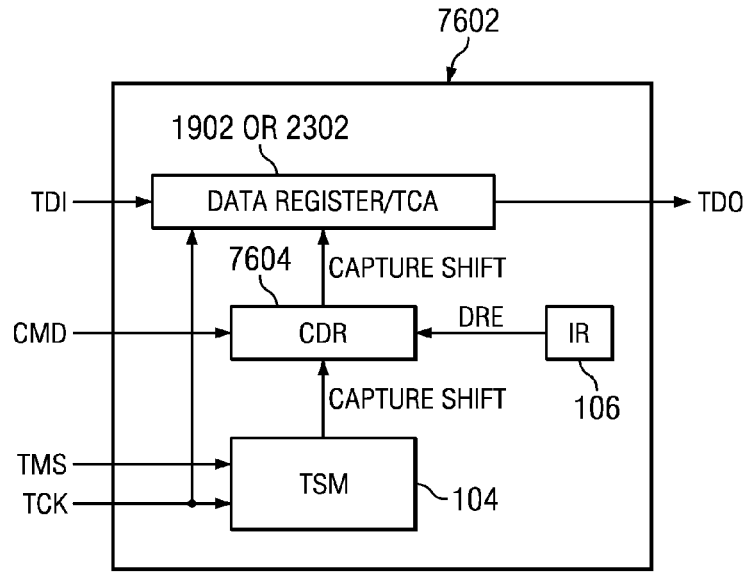
FIG. 76A illustrates a device with a commandable Tap that uses a separate command signal to input commands according to the disclosure.

FIG. 76A illustrates a device 7602 comprising a TSM 104, a commandable DRC router (CDR) 7604, and a data register or TCA all connected as shown. The data register or TCA of FIG. 75A could be any of the previously described data registers, such as 1902, or TCAs, such as 2302, that operate in response to Capture and Shift inputs. CDR 7604 inputs Capture and Shift signals from TSM 104, a CMD signal from the CMD input signal 7104 and DRE input from instruction register 106. CDR 7604 outputs a Capture and Shift signal to the data register/TCA.

Figure 76B:
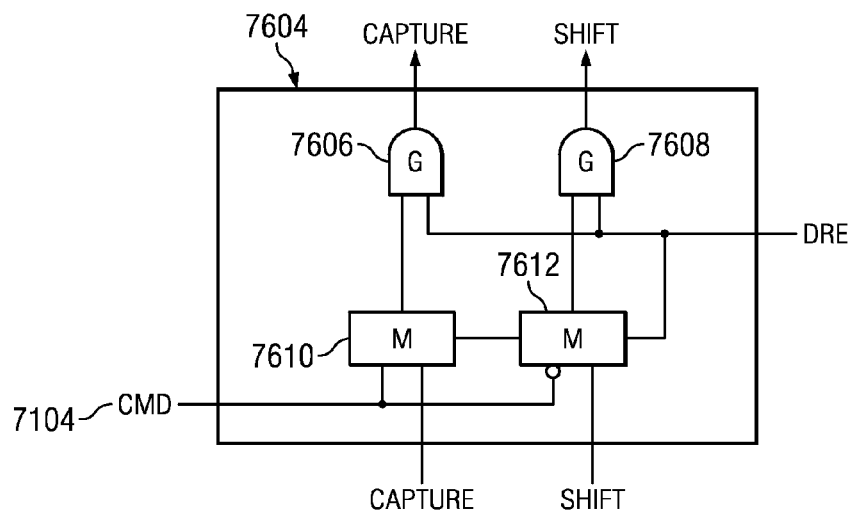
FIG. 76B illustrates the commandable DRC router (CDR) of FIG. 76A.

FIG. 76B illustrates an example CDR 7604 comprising gating circuits 7606 and 7608 and multiplexers 7610 and 7612 all connected as shown. When a first instruction is input to the instruction register 106, the DRE inputs from the instruction register enable the CDR 7604 to respond to the Capture and Shift inputs from TSM 104 to perform data register/TCA capture and shift operation cycles as described in FIG. 35. When a second instruction is input to the instruction register 106, the DRE inputs from the instruction register enable the CDR 7604 to respond to CMD inputs from the CMD input signal 7104 to perform data register/TCA capture and shift operation cycles as described in FIG. 35. The only difference between the CDR 7604 of FIG. 76B and CDR 2402 of FIG. 35 is that the CMD circuit 2404 of FIG. 35 is not included in FIG. 76B.

The commandable TAP architecture of devices 7102, 7202, 7402, 7502 and 7602 can be substituted for any of the previously described commandable TAP architectures of the disclosure simply by providing the additional CMD input signal 7104 and coupling it to the CMD circuit 2404 of CDR 2402 in substitution of the TMS input, or coupling it to the CMD inputs of CDR 7204, CDR 7404, CDR 7504 or CDR 7604. A controller/tester coupled to the commandable TAP architecture of devices 7102, 7202, 7402, 7502 and 7602 would provide the additional CMD input signal 7104 to CDR 2402.

While a single data register with a TDI input and TDO output is shown in the devices of FIGS. 71A, 72A, 74A, 75A and 76A, parallel data registers with multiple TDI inputs and TDO outputs, as shown in FIG. 69, could be used in the devices as well.

Also while a single input (TDI) and single output (TDO) TCA is shown in the devices of FIGS. 71A, 72A, 74A, 75A and 76A, multiple input and output TCAs, as shown in FIG. 70, could be used in the devices as well.

Furthermore, while the CMD input is shown being a logic high input on the CMD input signal 7104 of FIGS. 71B, 71C and 73, it could be a logic low input as well. Also, since the CMD input to the CDRs of FIGS. 71A, 72A, 74A, 75A and 76A comes from the CMD input signal 7104, the TMS input signal only inputs TMS data to the TSM 104.

Figure 77:
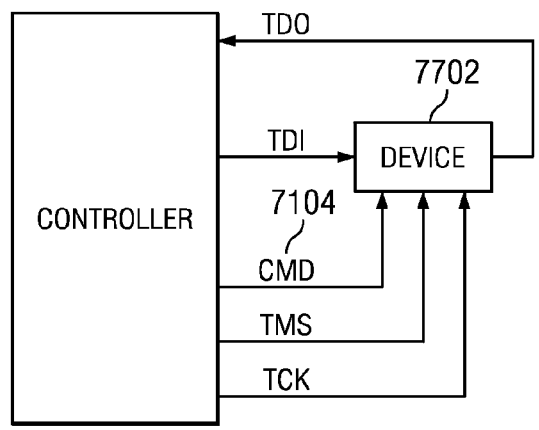

FIG. 77 illustrates a controller coupled to a single device 7702, which could be device 7102, 7202, 7402, 7502 or 7602, via the device TAP's TDI signal, TDO signal, TMS signal, TCK signal and CMD signal 7104. The TAP of device 7702 may operate conventionally in response to the controller's TCK and TMS signal inputs or in the commandable mode of the disclosure in response to the controller's CMD signal input as described in regard to FIGS. 71B, 71C and 73.

Figure 78:
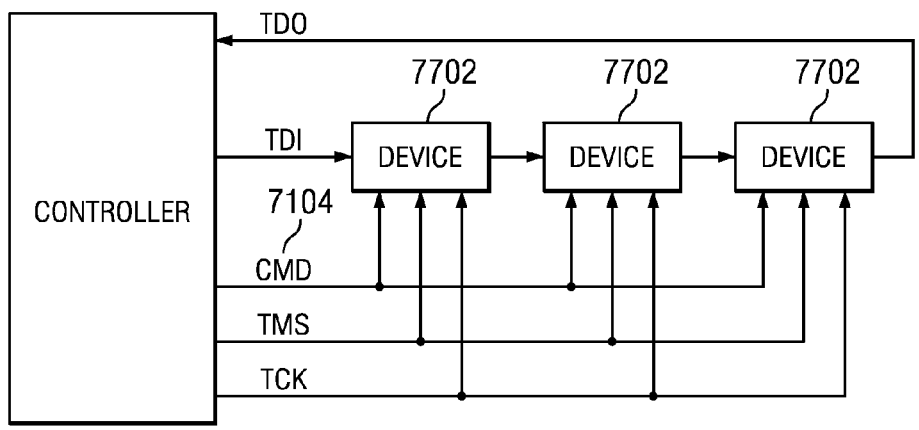
Figure 79:
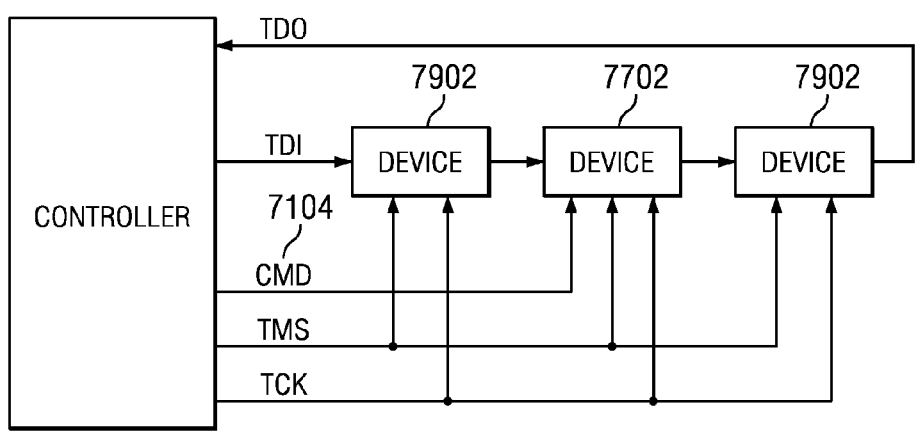

FIG. 78 illustrates a controller coupled to a daisy-chain of devices 7702 via a TDI signal to the first device, a TDO signal from the last device, a TCK signal to all devices, a TMS signal to all devices, and a CMD signal to all devices. The TAPs of devices 7702 may operate conventionally in response to the controller's TCK and TMS signal inputs or in the commandable mode of the disclosure in response to the controller's CMD signal input as described in regard to FIGS. 71B, 71C and 73.

FIG. 78 illustrates a controller coupled to a daisy-chain of devices consisting of conventional TAP devices 7902 comprising TDI, TDO, TMS and TCK signals and commandable TAP devices 7702 of the disclosure comprising TDI, TDO, TMS, TCK and CMD signals. The controller inputs a TDI signal to the first device, receives a TDO signal from the last device, inputs TMS and TCK signals to all devices 7902 and 7702 and inputs a CMD signal to devices 7702. The TAP's of devices 7902 and 7702 may operate conventionally in response to the controller's TCK and TMS signal inputs. The TAP's of devices 7702 may operate in response to the Controller's CMD signal input from the controller as described in regard to FIGS. 71B, 71C and 73.

Although the disclosure has been described in detail, it should be understood that various changes, substitutions and alterations may be made without departing from the spirit and scope of the disclosure as defined by the appended claims.

SOME ASPECTS OF THE DISCLOSURE

ASPECT 1. A process of operating a test access port within a device in a commandable mode to perform uninterrupted update, capture and shift operations to a target circuit within the device comprising the steps of:

loading an instruction into the instruction register of the test access port to select the target circuit and to enable the commandable mode of operating the target circuit, transitioning the Tap state machine of the test access port to the Shift-DR state to shift data to and from the target circuit, inputting a command to the test access port via the test access port's TMS input signal and while the Tap state machine is in the Shift-DR state to cause the target circuit to cease shifting data, perform an update operation followed by a capture operation, then resume shifting data, and;

repeating the inputting of a command to the test access port to perform additional uninterrupted update, capture and shift operations to the target circuit.

ASPECT 2. A process of operating a test access port within a device in a commandable mode to perform uninterrupted capture and shift operations to a target circuit within the device comprising the steps of:

loading an instruction into the instruction register of the test access port to select the target circuit and to enable the commandable mode of operating the target circuit, transitioning the Tap state machine of the test access port to the Shift-DR state to shift data to and from the target circuit, inputting a command to the test access port via the test access port's TMS input signal and while the Tap state machine is in the Shift-DR state to cause the target circuit to cease shifting data, perform a capture operation then resume shifting data, and;

repeating the inputting of a command to the test access port to perform additional uninterrupted capture and shift operations to the target circuit.

ASPECT 3. A process of operating test access ports within daisy chained devices in a commandable mode to perform uninterrupted update, capture and shift operations to boundary scan registers within the devices comprising the steps of:

loading instructions into the instruction register of the device's test access port to select the device's boundary scan register and to enable the commandable mode of operating the boundary scan registers, transitioning the Tap state machine of the device's test access port to the Shift-DR state to shift data through the daisy chained boundary scan registers, inputting a command to the device's test access port via the test access port's TMS input signal and while the Tap state machine is in the Shift-DR state to cause the boundary scan registers to cease shifting data, perform an update operation followed by a capture operation, then resume shifting data, and;

repeating the inputting of a command to the device's test access port to perform additional uninterrupted update, capture and shift operation to the boundary scan registers.

ASPECT 4. A process of operating a test access port of a target device in a daisy chained arrangement of other devices also including test access ports in a commandable mode to perform uninterrupted update, capture and shift operations to a selected circuit within the target device comprising the steps of:

loading an instruction into the instruction register of the target device's test access port to select the circuit and to enable the commandable mode of operating the circuit, loading instructions into the instruction registers of the other device's test access ports to select a data register through which data may be shifted, transitioning the Tap state machines of the daisy chained device's test access ports to the Shift-DR state to shift data through the selected circuit of the target device and through the selected data registers of the other devices in the daisy chain arrangement, inputting a command to the daisy chained device's test access ports via the test access port's TMS input signal and while the device Tap state machines are in the Shift-DR state to cause the selected circuit of the target device to cease shifting data, perform an update operation followed by a capture operation, then resume shifting data, and;

repeating the inputting of a command to the daisy chained device's to perform additional uninterrupted update, capture and shift operation to the selected circuit of the target device.

ASPECT 5. A process of operating a test access port of a target device in a daisy chained arrangement of other devices also including test access ports in a commandable mode to perform uninterrupted capture and shift operations to a selected circuit within the target device comprising the steps of:

loading an instruction into the instruction register of the target device's test access port to select the circuit and to enable the commandable mode of operating the circuit, loading instructions into the instruction registers of the other device's test access ports to select a data register through which data may be shifted, transitioning the Tap state machines of the daisy chained device's test access ports to the Shift-DR state to shift data through the selected circuit of the target device and through the selected data registers of the other devices in the daisy chain arrangement, inputting a command to the daisy chained device's test access ports via the test access port's TMS input signal and while the device Tap state machines are in the Shift-DR state to cause the selected circuit of the target device to cease shifting data, perform a capture operation, then resume shifting data, and;

repeating the inputting of a command to the daisy chained device's to perform additional uninterrupted capture and shift operation to the selected circuit of the target device.

ASPECT 6. A process of operating a test access port within a device in a commandable mode to perform uninterrupted back to back capture and shift operations to a target circuit within the device comprising the steps of:

loading an instruction into the instruction register of the test access port to select the target circuit and to enable the commandable mode of operating the target circuit, transitioning the Tap state machine of the test access port to the Shift-DR state to shift data to and from the target circuit, inputting a command to the test access port via the test access port's TMS input signal and while the Tap state machine is in the Shift-DR state to cause the target circuit to cease shifting data, perform a first capture operation, perform a second capture operation, the resume shifting data, and;

repeating the inputting of a command to the test access port to perform additional uninterrupted back to back capture and shift operations to the target circuit.

ASPECT 7. A process of operating a test access port within a device in a commandable mode to perform uninterrupted update, capture and shift operations to a target circuit within the device comprising the steps of:

loading an instruction into the instruction register of the test access port to select the target circuit and to enable the commandable mode of operating the target circuit, transitioning the Tap state machine of the test access port to the Shift-DR state to shift data to and from the target circuit, inputting a command to the test access port via a CMD input signal to the device and while the Tap state machine is in the Shift-DR state to cause the target circuit to cease shifting data, perform an update operation followed by a capture operation, then resume shifting data, and;

repeating the inputting of a command to the test access port via the CMD input signal to perform additional uninterrupted update, capture and shift operations to the target circuit.

ASPECT 8. A process of operating a test access port within a device in a commandable mode to perform uninterrupted capture and shift operations to a target circuit within the device comprising the steps of:

loading an instruction into the instruction register of the test access port to select the target circuit and to enable the commandable mode of operating the target circuit, transitioning the Tap state machine of the test access port to the Shift-DR state to shift data to and from the target circuit, inputting a command to the test access port via a command input signal to the device and while the Tap state machine is in the Shift-DR state to cause the target circuit to cease shifting data, perform a capture operation then resume shifting data, and;

repeating the inputting of a command to the test access port via the CMD input signal to perform additional uninterrupted capture and shift operations to the target circuit.

What is claimed is:

1. An integrated circuit comprising:
a TDI signal lead, a TDO signal lead, a TCK signal lead and a TMS signal lead;
a Tap state machine having an input coupled to the TCK signal lead, an input coupled to the TMS signal lead, instruction register control outputs and data register control outputs;
an instruction register having an input coupled to the TDI signal lead, an output coupled to the TDO signal lead, control inputs coupled to the instruction control outputs of the Tap state machine and enable outputs;
a commandable data register control router including:
(1) a command circuit having an input coupled to the TCK signal lead, an input coupled to the TMS signal lead, and control outputs; and
(2) a routing circuit having first control inputs coupled to the data register control outputs of the Tap state machine, second control inputs coupled to the control outputs of the command circuit, data register control outputs and enable inputs coupled to the enable outputs of the instruction register; and
a data register having an input coupled to the TDI signal lead, an output coupled to the TDO signal lead, and control inputs coupled to the data register control outputs of the routing circuit.

2. The integrated circuit of claim 1 including functional circuitry and the data register is coupled to the functional circuitry.

3. The integrated circuit of claim 1 including functional circuitry and the data register is a debug register coupled to the functional circuitry.

4. The integrated circuit of claim 1 including functional circuitry and the data register is a programming data register coupled to the functional circuitry.

5. The integrated circuit of claim 1 including instrumentation circuitry and the data register is an instrumentation data register coupled to the instrumentation circuitry.

6. The integrated circuit of claim 1 including functional circuitry having interconnects and the data register is a boundary register coupled to the interconnects and the functional circuitry.

7. The integrated circuit of claim 1 including functional circuitry and the data register is a boundary register coupled to the functional circuitry.

8. The integrated circuit of claim 1 including core circuitry having core interconnects and the data register is a core wrapper boundary register coupled to the core interconnects circuitry.

9. The integrated circuit of claim 1 including core system logic and the data register is a core wrapper boundary register coupled to the core system logic.

10. The integrated circuit of claim 1 including functional circuitry having interconnects and another integrated circuit having interconnects and the data register is a boundary register coupled to the interconnects of the functional circuitry and the other integrated circuit.

11. The integrated circuit of claim 1 including first core circuitry and second core circuitry separate from the integrated circuit and the data register is a core wrapper boundary register coupled between the two cores.

12. The integrated circuit of claim 1 including first core circuitry and second core circuitry separate from the integrated circuit, the first core circuitry and the second core circuitry being coupled together and the data register is a boundary register coupled between the first core circuitry and the second core circuitry.

\* \* \* \* \*